(12) United States Patent
Ikeda et al.

(10) Patent No.: US 10,764,973 B2
(45) Date of Patent: Sep. 1, 2020

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Hisao Ikeda, Kanagawa (JP); Nozomu Sugisawa, Kanagawa (JP); Yuichi Yanagisawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/121,702

(22) Filed: Sep. 5, 2018

(65) Prior Publication Data

US 2019/0008014 A1    Jan. 3, 2019

Related U.S. Application Data

(63) Continuation of application No. 14/806,950, filed on Jul. 23, 2015, now Pat. No. 10,159,135.

(30) Foreign Application Priority Data

Jul. 31, 2014  (JP) ................................ 2014-156168
Oct. 28, 2014  (JP) ................................ 2014-219131
(Continued)

(51) Int. Cl.
*H05B 33/12* (2006.01)
*G02F 1/1333* (2006.01)
(Continued)

(52) U.S. Cl.
CPC ......... *H05B 33/12* (2013.01); *H01L 27/3293* (2013.01); *G02F 1/13336* (2013.01);
(Continued)

(58) Field of Classification Search
CPC .......... G02F 1/13336; G02F 1/133305; H05B 33/12; H01L 27/3293; H01L 27/3244; H01L 2251/5338; H01L 51/5237
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |

(Continued)

FOREIGN PATENT DOCUMENTS

| | | |
|---|---|---|
| CN | 001713035 A | 12/2005 |
| CN | 101308264 A | 11/2008 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Arman B Fallahkhair
(74) *Attorney, Agent, or Firm* — Fish & Richardson P.C.

(57) ABSTRACT

A display device that can display an image along a curved surface is provided. In the display device, a first display panel and a second display panel overlap each other with a light-transmitting layer provided therebetween. The light-transmitting layer is positioned on a display surface side of the first display panel, and on a side opposite to the display surface of the second display panel. The light-transmitting layer has an average transmittance of 80% or more with respect to light in the wavelength range of 450 nm to 700 nm and a refractive index higher than that of air. A display region of the first display panel overlaps a region transmitting visible light of the second display panel with the light-transmitting layer provided therebetween. It is preferred that the display region of the first display panel not (Continued)

overlap with a region blocking visible light of the second display panel.

19 Claims, 32 Drawing Sheets

(30) Foreign Application Priority Data

Dec. 1, 2014 (JP) .................. 2014-243195
May 29, 2015 (JP) .................. 2015-109642

(51) Int. Cl.
*H01L 27/32* (2006.01)
*H01L 51/52* (2006.01)

(52) U.S. Cl.
CPC .... *G02F 1/133305* (2013.01); *H01L 27/3244* (2013.01); *H01L 51/5237* (2013.01); *H01L 2251/5338* (2013.01)

(56) References Cited

U.S. PATENT DOCUMENTS

| | | | |
|---|---|---|---|
| 5,801,797 A | 9/1998 | Iida et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,268,841 B2 | 9/2007 | Kasajima et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,489,286 B2 | 2/2009 | Kawase et al. | |
| 7,501,293 B2 | 3/2009 | Ito et al. | |
| 7,674,650 B2 | 3/2010 | Akimoto et al. | |
| 7,692,378 B2 | 4/2010 | Yamazaki | |
| 7,719,745 B2 | 5/2010 | Yamada | |
| 7,732,819 B2 | 6/2010 | Akimoto et al. | |
| 7,907,112 B2 | 3/2011 | Chang et al. | |
| 8,209,894 B2 | 7/2012 | Shim et al. | |
| 8,368,729 B2 | 2/2013 | Watanabe | |
| 8,576,209 B2* | 11/2013 | Miyaguchi ........ | G02F 1/133305 345/204 |
| 8,902,597 B2 | 12/2014 | Sato | |
| 9,024,936 B2 | 5/2015 | Ogata et al. | |
| 9,406,698 B2 | 8/2016 | Yamazaki et al. | |
| 9,469,080 B2 | 10/2016 | Hajjar et al. | |
| 9,768,201 B2* | 9/2017 | Nakamura ............ | H01L 27/124 |
| 9,854,629 B2* | 12/2017 | Ikeda .................... | H05B 33/12 |
| 9,940,086 B2* | 4/2018 | Yoshizumi ........... | G06F 3/1446 |
| 10,128,459 B2* | 11/2018 | Cheon .................. | H01L 51/524 |
| 10,332,859 B2* | 6/2019 | Nakamura .......... | H01L 25/0652 |
| 10,424,632 B2* | 9/2019 | Nakamura .......... | H01L 51/0097 |
| 2001/0046027 A1 | 11/2001 | Tai et al. | |
| 2002/0056838 A1 | 5/2002 | Ogawa | |
| 2002/0113546 A1 | 8/2002 | Seo et al. | |
| 2002/0132454 A1 | 9/2002 | Ohtsu et al. | |
| 2003/0032210 A1 | 2/2003 | Takayama et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0285811 A1* | 12/2005 | Kawase ............... | G02F 1/13336 345/1.1 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0091794 A1 | 5/2006 | Agostinelli et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0001927 A1* | 1/2007 | Ricks .................. | G02F 1/13336 345/1.1 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197769 A1 | 8/2008 | Seo et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0284934 A1 | 11/2008 | Umezaki et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0239320 A1 | 9/2009 | Takayama et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117928 A1 | 5/2010 | Shim et al. | |
| 2011/0057861 A1 | 3/2011 | Cok et al. | |
| 2011/0227846 A1* | 9/2011 | Imazeki ............... | G06F 3/044 345/173 |
| 2012/0268445 A1 | 10/2012 | Ogata et al. | |
| 2013/0214324 A1 | 8/2013 | Takayama et al. | |

(56) References Cited

U.S. PATENT DOCUMENTS

| | | | |
|---|---|---|---|
| 2013/0299804 A1 | 11/2013 | Ogata et al. | |
| 2016/0014882 A1* | 1/2016 | Jongman | G02F 1/13452 361/749 |
| 2016/0019019 A1* | 1/2016 | Ikeda | G06F 3/0412 345/173 |
| 2016/0103649 A1* | 4/2016 | Yoshitani | G09G 3/20 345/694 |
| 2016/0291640 A1* | 10/2016 | Seo | G09G 3/00 |
| 2016/0336538 A1 | 11/2016 | Yamazaki et al. | |

FOREIGN PATENT DOCUMENTS

| | | |
|---|---|---|
| CN | 102484123 A | 5/2012 |
| CN | 103299714 A | 9/2013 |
| EP | 1612658 A | 1/2006 |
| EP | 1737044 A | 12/2006 |
| EP | 2184662 A | 5/2010 |
| EP | 2184676 A | 5/2010 |
| EP | 2226847 A | 9/2010 |
| JP | 59-071083 A | 4/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-311344 A | 12/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-324673 A | 11/2002 |
| JP | 2003-086000 A | 3/2003 |
| JP | 2003-086808 A | 3/2003 |
| JP | 2003-174153 A | 6/2003 |
| JP | 2004-038145 A | 2/2004 |
| JP | 2004-103957 A | 4/2004 |
| JP | 2004-251981 A | 9/2004 |
| JP | 2004-273614 A | 9/2004 |
| JP | 2004-273732 A | 9/2004 |
| JP | 2006-010811 A | 1/2006 |
| JP | 2006-220786 A | 8/2006 |
| JP | 2008-545164 | 12/2008 |
| JP | 2009-020141 A | 1/2009 |
| JP | 2009-139463 A | 6/2009 |
| JP | 2010-113359 A | 5/2010 |
| JP | 2010-117717 A | 5/2010 |
| JP | 2012-028226 A | 2/2012 |
| JP | 2012-118341 A | 6/2012 |
| JP | 2012-238001 A | 12/2012 |
| JP | 2013-504092 | 2/2013 |
| JP | 2013-156452 A | 8/2013 |
| JP | 2014-026290 A | 2/2014 |
| JP | 2014-063723 A | 4/2014 |
| KR | 2006-0048387 A | 5/2006 |
| KR | 2010-0051357 A | 5/2010 |
| KR | 2012-0059575 A | 6/2012 |
| TW | 200609859 | 3/2006 |
| TW | I2757596 | 7/2006 |
| TW | 201117376 | 5/2011 |
| WO | WO-2004/114391 | 12/2004 |
| WO | WO-2007/005245 | 1/2007 |
| WO | WO-2011/031605 | 3/2011 |
| WO | WO-2011/068158 | 6/2011 |
| WO | WO-2012/091018 | 7/2012 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 340, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O—In2O3—ZnO) TFT", SID Digest '08 : SID International Symposium Digest of Technical Papers, May 20, 2008, vol. 39, pp. 633-636.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
International Search Report (Application No. PCT/IB2015/055505) dated Dec. 1, 2015.
Written Opinion (Application No. PCT/IB2015/055505) dated Dec. 1, 2015.
Chinese Office Action (Application No. 201580041378.9) dated Oct. 25, 2018.

\* cited by examiner

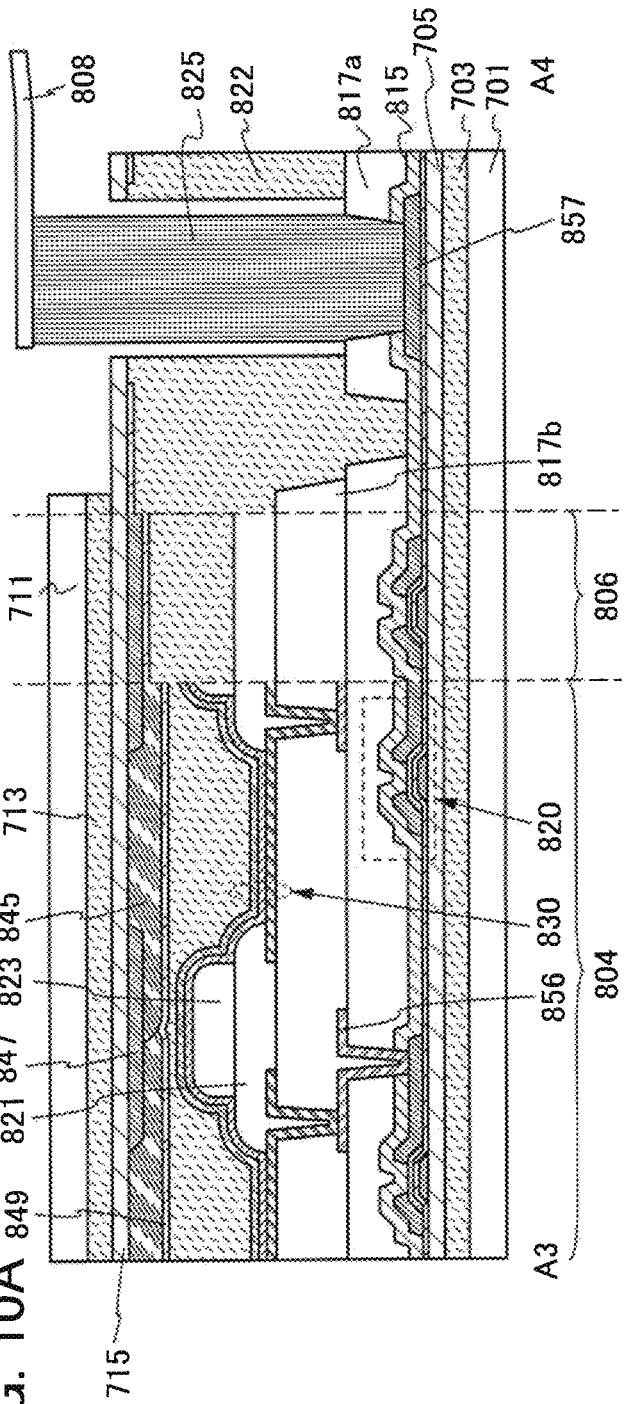
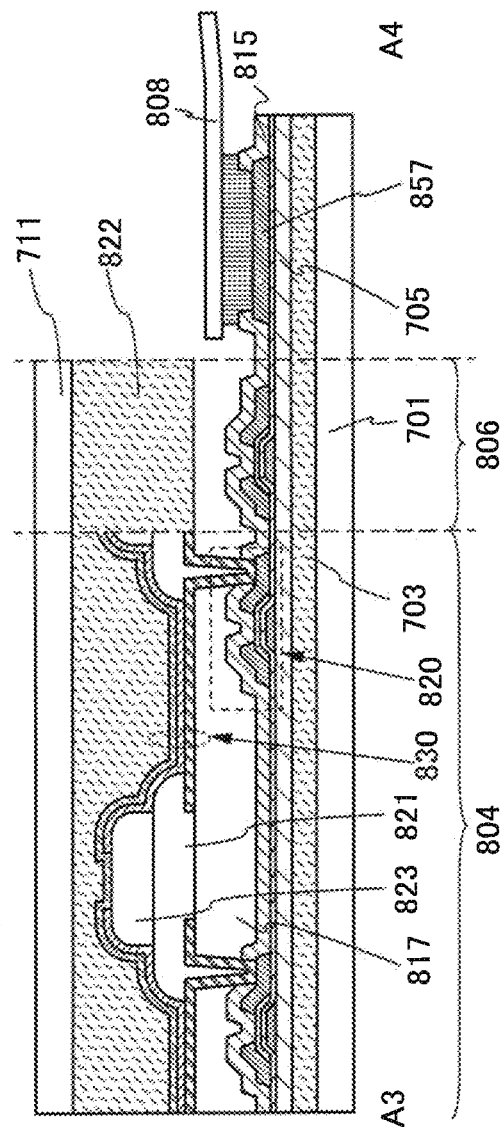
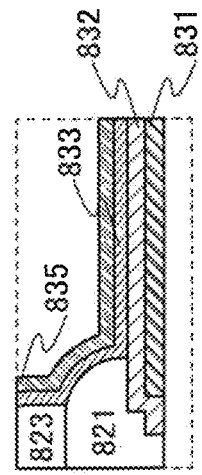

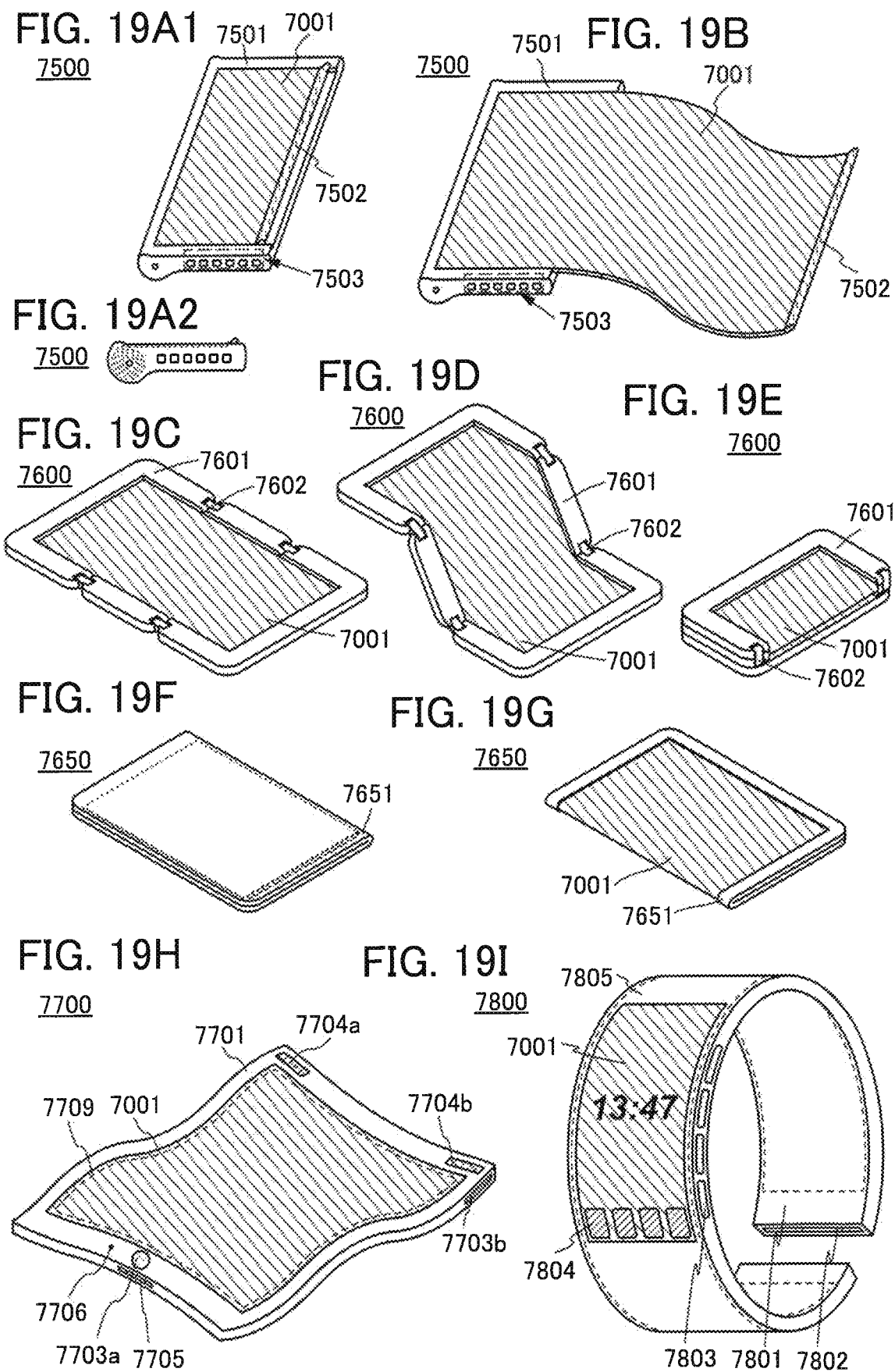

FIG. 25

| CFY | CFB | CFG | CFR |
|---|---|---|---|
| 211 ||||
| 209 ||||
| 207 ||||
| 205 ||||
| 203 ||||
| 201 ||||

DISPLAY DEVICE AND ELECTRONIC DEVICE

CROSS-REFERENCE TO RELATED APPLICATIONS

This application is a continuation of U.S. application Ser. No. 14/806,950, filed Jul. 23, 2015, now allowed, which claims the benefit of foreign priority applications filed in Japan as Serial No. 2014-156168 on Jul. 31, 2014, Serial No. 2014-219131 on Oct. 28, 2014, Serial No. 2014-243195 on Dec. 1, 2014, and Serial No. 2015-109642 on May 29, 2015, all of which are incorporated by reference.

TECHNICAL FIELD

One embodiment of the present invention relates to a display device, an electronic device, or a manufacturing method thereof. The present invention particularly relates to a display device or an electronic device utilizing electroluminescence (hereinafter also referred to as EL) or a manufacturing method thereof.

Note that one embodiment of the present invention is not limited to the above technical field. Specifically, examples of the technical field of one embodiment of the present invention disclosed in this specification include a semiconductor device, a display device, a light-emitting device, a power storage device, a storage device, an electronic device, a lighting device, an input device (e.g., a touch sensor), an input-output device (e.g., a touch panel), a driving method thereof, and a manufacturing method thereof.

BACKGROUND ART

In recent years, larger display devices have been required. Examples of uses for a large display device include a television device for home use (also referred to as a TV or a television receiver), digital signage, and a public information display (PID). A larger display region of a display device can provide the increased amount of information at a time. In addition, a larger display region attracts more attention, so that the effectiveness of the advertisement is expected to be increased, for example.

In addition, for application to mobile devices, larger display devices have been required. In recent years, browsability has been considered to be improved by increasing the amount of information to be displayed at one time with an increase of a display region of the display device.

Light-emitting elements utilizing EL (also referred to as EL elements) have features such as ease of thinning and lightening, high-speed response to input signal, and driving with a direct-current low voltage source; therefore, application of the light-emitting elements to display devices has been proposed. For example, Patent Document 1 discloses an example of a display device including an organic EL element.

Furthermore, Patent Document 2 discloses a flexible active matrix light-emitting device in which an organic EL element and a transistor serving as a switching element are provided over a film substrate.

Patent Document

[Patent Document 1] Japanese Published Patent Application No. 2002-324673
[Patent Document 2] Japanese Published Patent Application No. 2003-174153

DISCLOSURE OF INVENTION

An object of one embodiment of the present invention is to increase the size of a display device. Another object of one embodiment of the present invention is to suppress display unevenness or luminance unevenness of a display device. Another object of one embodiment of the present invention is to reduce the thickness or weight of a display device. Another object of one embodiment of the present invention is to provide a display device that can display an image along a curved surface. Another object of one embodiment of the present invention is to provide a highly browsable display device.

Another object of one embodiment of the present invention is to provide a novel display device, a novel electronic device, or the like.

Note that the descriptions of these objects do not disturb the existence of other objects. In one embodiment of the present invention, there is no need to achieve all the objects. Other objects can be derived from the description of the specification, the drawings, and the claims.

One embodiment of the present invention is a display device at least part of which is flexible. The display device includes a first display panel, a second display panel, and a light-transmitting layer. The first display panel includes a first region. The first region has a function of performing display. The second display panel includes a second region and a third region. The second region has a function of performing display. The third region is adjacent to the second region and has a function of transmitting visible light. In the light-transmitting layer, a transmittance with respect to light in a wavelength range of 450 nm to 700 nm is 80% or more on the average. A refractive index of the light-transmitting layer is higher than that of air. The light-transmitting layer is between the first display panel and the second display panel. The light-transmitting layer is positioned on both a display surface side of the first display panel and a side opposite to a display surface side of the second display panel. The third region includes a region that overlaps the first region with the light-transmitting layer provided therebetween.

Note that in one embodiment of the present invention, in at least part of the light-transmitting layer, a transmittance with respect to light in a wavelength range of 450 nm to 700 nm may be 80% or more, preferably 90% or more. Similarly, a refractive index of at least part of the light-transmitting layer may be higher than that of air and preferably higher than or equal to 1.3 and lower than or equal to 1.8.

In each of the above structures, the first region and the second region may each include a light-emitting element.

In each of the above structures, the third region may include a bonding layer. Here, the bonding layer may be positioned along part of an outer edge of the second region.

In each of the above structures, the second display panel may include a fourth region. The fourth region is adjacent to the second region and has a function of blocking visible light. It is preferred that the fourth region do not include a region overlapping with the first region. The fourth region may include a wiring. Here, the wiring may be electrically connected to a light-emitting element included in the second region. The wiring may be positioned along another part of the outer edge of the second region.

In each of the above structures, it is preferred that the light-transmitting layer be detachably in contact with at least one of the first display panel and the second display panel.

In each of the above structures, the light-transmitting layer preferably includes an inert material.

In each of the above structures, the light-transmitting layer preferably includes a nonvolatile material.

In each of the above structures, the light-transmitting layer may include a material with a viscosity of greater than or equal to 1 mPa·s and less than or equal to 1000 Pa·s. The viscosity of the material is preferably 1 Pa·s or more, more preferably 10 Pa·s or more, still more preferably 100 Pa·s or more.

In each of the above structures, a flexible printed circuit (FPC) may be included. Here, the FPC may be electrically connected with the first display panel. The FPC preferably includes a region overlapping with the second region.

One embodiment of the present invention also includes an electronic device or a lighting device including a display device with any of the above structures. For example, one embodiment of the present invention is an electronic device including the display device with any of the above structures, and an antenna, a battery, a housing, a speaker, a microphone, an operation switch, or an operation button.

According to one embodiment of the present invention, the display device can be increased in size. According to one embodiment of the present invention, display unevenness or luminance unevenness of the display device can be suppressed. According to one embodiment of the present invention, the display device can be thin or lightweight. According to one embodiment of the present invention, a display device that can display an image along a curved surface can be provided. According to one embodiment of the present invention, a highly browsable display device can be provided.

According to one embodiment of the present invention, a novel display device, a novel electronic device, or the like can be provided.

Note that the description of these effects does not disturb the existence of other effects. One embodiment of the present invention does not necessarily achieve all the effects listed above. Other effects can be derived from the description of the specification, the drawings, and the claims.

BRIEF DESCRIPTION OF DRAWINGS

FIGS. 10A to 10C illustrate examples of a light-emitting panel.
FIGS. 19A1, 19A2, 19B, 19C, 19D, 19E, 19F, 19G, 19H, and 19I illustrate examples of an electronic device.
FIG. 25 shows a light-emitting element in Example 2.

BEST MODE FOR CARRYING OUT THE INVENTION

Figure 1A:
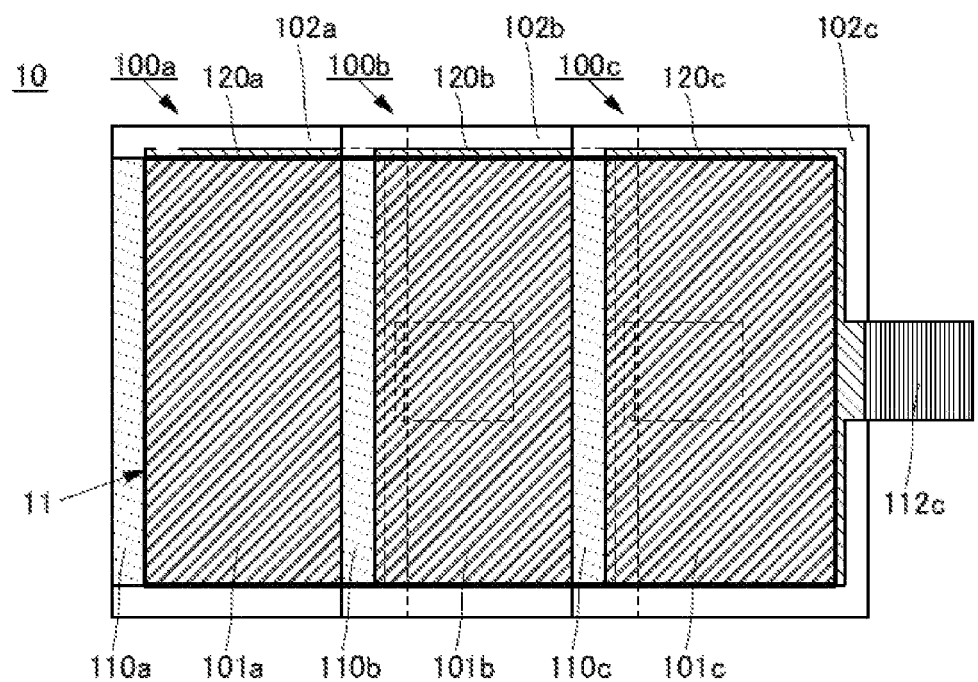
FIGS. 1A to 1C illustrate examples of a display device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings is not accurately represented in some cases for easy understanding. Therefore, the disclosed invention is not necessarily limited to the position, the size, the range, or the like disclosed in the drawings.

Note that the terms "film" and "layer" can be interchanged with each other depending on the case or circumstances. For example, the term "conductive layer" can be changed into the term "conductive film". Also, the term "insulating film" can be changed into the term "insulating layer".

Note that in this specification, examples of the case where X and Y are electrically connected include the case where A and B are directly connected without another element interposed therebetween and the case where one or more elements that enable electrical connection between X and Y (e.g., a switch, a transistor, a capacitor, an inductor, a resistor, a diode, a display element, a light-emitting element, or a load) are connected between X and Y. A switch is controlled to be on or off. That is, a switch is conducting or not conducting (is turned on or off) to determine whether current flows therethrough or not. Alternatively, the switch has a function of selecting and changing a current path.

Embodiment 1

In this embodiment, a display device of one embodiment of the present invention will be described with reference to FIGS. 1A to 1C, FIGS. 2A to 2D, FIGS. 3A to 3C, FIGS. 4A to 4F, FIGS. 5A to 5F, FIGS. 6A to 6C, FIGS. 7A to 7C, and FIGS. 8A to 8C.

A plurality of display panels are arranged in one or more directions (e.g., in one column or in matrix), whereby a display device with a large display region can be manufactured.

In the case where a large display device is manufactured using a plurality of display panels, each of the display panels is not required to be large. Therefore, an apparatus for manufacturing the display panel does not need to be increased in size, so that space-saving can be achieved. In addition, since an apparatus for manufacturing small and middle-size display panel can be used, a novel manufacturing apparatus does not need to be used for increasing the size of a display device, so that manufacturing cost can be reduced. Furthermore, a decrease in yield caused by increasing the size of a display panel can be suppressed.

A display device having a plurality of display panels have a larger display region than a display device having one display panel when the display panels have the same size, so that the display device having the plurality of display panels have an effect of displaying more information on one screen, or the like.

However, each of the display panels has a non-display region that surrounds a display region. Thus, for example, in the case where output images of a plurality of display panels are used to display one image, the image appears divided to a user of the display device.

Although narrowing the non-display regions of display panels (using display panels with narrower frames) can prevent the images of the display panels from appearing divided, it is difficult to totally remove the non-display region.

In addition, a smaller non-display region leads to a decrease in the distance between the edge of the display panel and an element in the display panel, so that the element easily deteriorates by impurities entering from the outside of the display panel in some cases.

Thus, in the display device of one embodiment of the present invention, a plurality of display panels are arranged to partly overlap one another. In two display panels overlapping with each other, at least a display panel positioned on the display surface side (upper side) includes a region transmitting visible light that is adjacent to a display region. In the display device of one embodiment of the present invention, the display region of the display panel positioned on a lower side and the region transmitting visible light of the display panel positioned on the upper side overlap with each other. Therefore, a non-display region between the display regions of the two display panels overlapping with each other can be reduced or even removed. Accordingly, a large display device in which a seam between display panels is hardly recognized by a user can be obtained.

In one embodiment of the present invention, at least part of the non-display region of the display panel positioned on the upper side is a region transmitting visible light, and can overlap the display region of the display panel positioned on the lower side. In one embodiment of the present invention, at least part of the non-display region of the display panel positioned on the lower side can overlap with a display region of the display panel positioned on the upper side or a region blocking visible light thereof. It is not necessary to reduce the areas of these regions because a reduction in the area of the frame of the display device (a reduction in area except a display region) is not affected by these regions.

In addition, a larger non-display region leads to an increase in the distance between the edge of the display panel and an element in the display panel, so that the deterioration of the element due to impurities entering from the outside of the display panel can be suppressed. For example, in the case where an organic EL element is used as a display element, as the distance between the edge of the display panel and the organic EL element in the display panel increases, impurities such as moisture or oxygen are less likely to enter (or less likely to reach) the organic EL element from the outside of the display panel. Since a sufficient area of the non-display region can be secured in the display device of one embodiment of the present invention, a highly reliable large display device can be realized even when a display panel including an organic EL element or the like is used.

When air exists between the region transmitting visible light of the display panel positioned on the upper side and the display region of the display panel positioned on the lower side, part of light extracted from the display region is reflected at the interface between the display region and air and the interface between air and the region transmitting visible light, which may result in a decrease in luminance of the display. Therefore, the light extraction efficiency of the region in which a plurality of display panels overlap with each other is decreased. In addition, luminance difference occurs between part of the display region of the display panel positioned on the lower side that overlaps with the region transmitting visible light of the display panel positioned on the upper side and part thereof that does not overlap with the region transmitting visible light of the display panel positioned on the upper side, so that a seam between the display panels is easily recognized by a user in some cases.

In the display device of one embodiment of the present invention, a light-transmitting layer having a refractive index higher than that of air and transmitting visible light is provided between the display region and the region transmitting visible light. Thus, air can be prevented from entering between the display region and the region transmitting visible light, so that the reflection at the interface due to a difference in refractive index can be suppressed. In addition, display unevenness or luminance unevenness of the display device can be suppressed.

Specifically, one embodiment of the present invention is a display device including a first display panel, a second display panel, and a light-transmitting layer. The first display panel includes a first region. The first region has a function of displaying an image. The second display panel has a second region and a third region. The second region has a function of displaying an image. The third region is adjacent to the second region and has a function of transmitting visible light. In the light-transmitting layer, the transmittance of light in a wavelength range of 450 nm to 700 nm is 80% or more on the average. The light-transmitting layer has a refractive index higher than that of air. The light-transmitting layer is provided between the first display panel and the second display panel. The light-transmitting layer is positioned on both a display surface side of the first display panel and a side opposite to the display surface side of the second display panel. The third region includes a region that overlaps the first region with the light-transmitting layer provided therebetween.

At least part of the display device may have flexibility. At least part of the display panel may have flexibility. The display device of one embodiment of the present invention preferably includes a flexible display panel. In that case, a large curved display device or a flexible display device can be provided, and the application is expanded. Here, an organic EL element is suitably used as a display element.

Note that the transmittance with respect to visible light in the light-transmitting layer is preferably higher because the light extraction efficiency of the display device can be increased. For example, a transmittance with respect to light in the wavelength range of 450 nm to 700 nm of the light-transmitting layer may be 80% or more, and preferably 90% or more.

The difference in refractive index between the light-transmitting layer and a layer in contact with the light-transmitting layer is preferably smaller because the reflection of light can be suppressed. For example, the refractive index of the light-transmitting layer is higher than that of air, preferably higher than or equal to 1.3 and lower than or equal to 1.8. The difference in the refractive index between the light-transmitting layer and the layer in contact with the light-transmitting layer (e.g., a substrate included in the display panel) is preferably lower than or equal to 0.30, more preferably lower than or equal to 0.20, still more preferably lower than or equal to 0.15.

It is preferred that the light-transmitting layer be detachably in contact with at least one of the first display panel and the second display panel. In the case where each of the display panels included in the display device is detachable, when malfunction is occurred in one of display panels, for example, only the defective display panel can be easily replaced with a new display panel. By using the other display panels continuously, the display device can be used longer and at lower cost.

When there is no need to attach and detach the display panels, the display panels are fixed to each other with the light-transmitting layer including a material having an adhesive property (adhesive or the like).

Any of an inorganic material and an organic material can be used for the light-transmitting layer. A liquid substance, a gelatinous substance, or a solid substance can be used for the light-transmitting layer.

For the light-transmitting layer, a liquid substance such as water, a solution, a fluorine-based inactive liquid, a refractive liquid, silicone oil, or the like can be used, for example.

In the case where the display device is inclined to the horizontal plane (a plane perpendicular to a direction in which gravity acts) or in the case where the display device is placed so as to be perpendicular to the horizontal plane, the viscosity of a liquid substance is preferably 1 mPa·s or more, more preferably 1 Pa·s or more, still more preferably 10 Pa·s or more, and yet still preferably 100 Pa·s or more. In the case where the display device is placed so as to be parallel to the horizontal plane or the like, the viscosity of the liquid substance is not limited thereto.

The light-transmitting layer is preferably inactive because another layer included in the display device can be prevented from being damaged, or the like.

A material included in the light-transmitting layer is preferably nonvolatile. Accordingly, entry of air to the interface due to vitalization of a material used for the light-transmitting layer can be prevented.

For the light-transmitting layer, a high molecular material can be used. Examples of such a high molecular material include a resin such as an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. Alternatively, a two-component-mixture-type resin may be used. A variety of curable adhesives such as a reactive curable adhesive, a thermosetting adhesive, an anaerobic adhesive, and a photo curable adhesive such as an ultraviolet curable adhesive containing at least one of these resins may be used. The adhesives are not necessarily cured in the case where the display panels are not fixed to each other, or the like.

The light-transmitting layer preferably has high self-attachability to an object. In addition, the light-transmitting layer preferably has high separability against an object. After the light-transmitting layer attached to the display panel is separated from the display panel, it is preferred that the light-transmitting layer be able to be attached to the display panel again.

In addition, it is preferred that the light-transmitting layer have no adhesiveness or low adhesiveness. Thus, attachment of the light-transmitting layer to an object and separation of the light-transmitting layer from the object can be repeated without damaging or contaminating the surface of the object.

As the light-transmitting layer, a film having attachability or a film having adhesiveness can be used, for example. In the case where an attachment film having a stacked-layer structure of an attachment layer or an adhesive layer and a base material is used, the attachment layer or the adhesive layer may function as the light-transmitting layer of the display device of one embodiment of the present invention, and the base material may function as a substrate included in the display panel. The attachment film may include an anchor layer between the attachment layer or the adhesive layer and the base material. The anchor layer has a function of enhancing the adhesiveness between the attachment layer or the adhesive layer and the base material. In addition, the anchor layer has a function of smoothing the coated surface of the attachment layer or that of the adhesive layer of the base material. In this manner, bubbles can be made hardly generated between the object and the light-transmitting layer.

For example, a film in which a silicone resin layer and a polyester film are stacked can be preferably used in the display device of one embodiment of the present invention. Here, the silicone resin layer has attachability and functions as the light-transmitting layer. The polyester film serves as a substrate included in the display panel. Note that a substrate included in the display panel may be further provided in addition to the polyester film.

In the case where a film in which an attachment layer, a base material, and an adhesive layer or a bonding layer are stacked is used, the attachment layer serves as the light-transmitting layer of the display device of one embodiment of the present invention; the base material functions as a substrate included in the display panel; and the adhesive layer or the bonding layer serves as a layer for attaching an element layer and the substrate of the display panel.

The thickness of the light-transmitting layer is not particularly limited. For example, the thickness may be greater than or equal to 1 µm and less than or equal to 50 µm. The thickness of the light-transmitting layer may be larger than 50 µm; however, the thickness of the display device is preferably set such that the flexibility of the display device is not reduced in the case where the flexible display device is manufactured. For example, the thickness of the light-transmitting layer is preferably greater than or equal to 10 µm and less than or equal to 30 µm. In addition, the thickness of the light-transmitting layer may be less than 1 µm.

Hereinafter, specific examples of the display device of one embodiment of the present invention are described with reference to drawings.

Hereinafter, to distinguish the display panels from each other, the same components included in the display panels from each other, or the same components relating to the display panels from each other, letters are added to reference numerals. Unless otherwise specified, "a" is added to reference numerals for a display panel and components placed on the lowest side (the side opposite to the display surface side), and to one or more display panels and components placed thereover, "b", "c", and the like are added in alphabetical order from the lower side. Furthermore, unless otherwise specified, in describing a structure in which a plurality of display panels is included, letters are not added when a common part of the display panels or the components is described.

The display device of one embodiment of the present invention includes a plurality of display panels in one or more directions.

FIG. 1A is a top view of a display device 10. The display device 10 illustrated in FIG. 1A includes three display panels 100 illustrated in FIG. 2B arranged in one direction (a lateral direction).

Figure 1B:
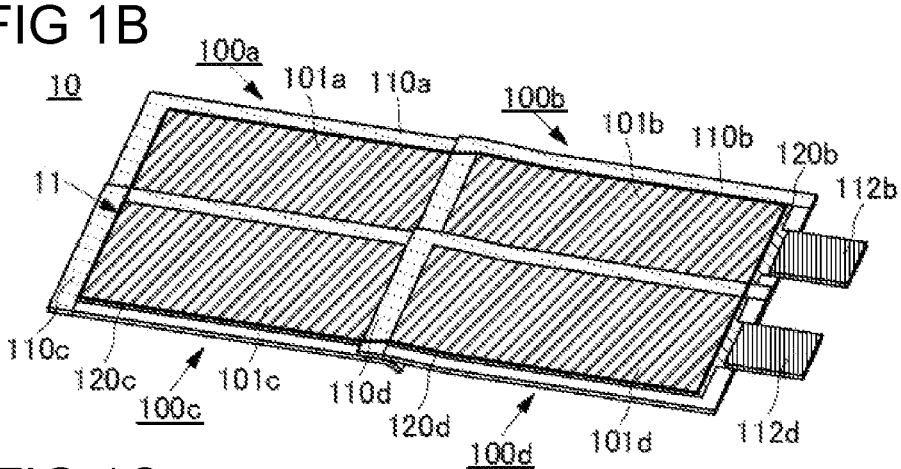
Figure 1C:
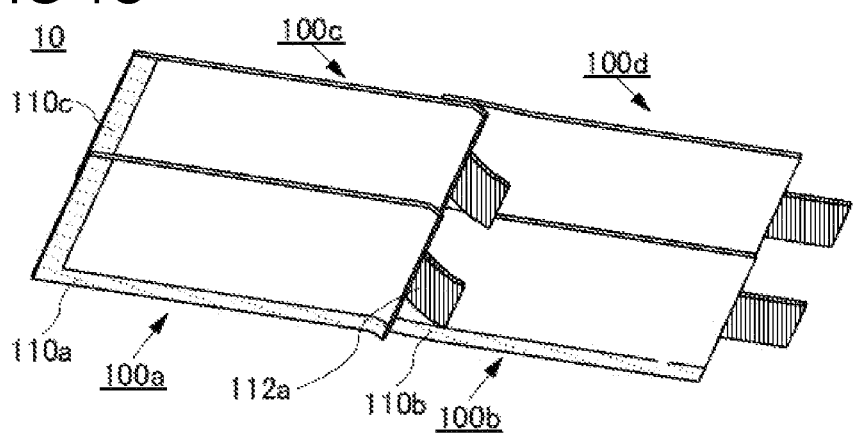

FIGS. 1B and 1C are perspective views of the display device 10 different from that in FIG. 1A. The display device 10 in FIGS. 1B and 1C includes four display panels 100 illustrated in FIG. 2C arranged in a matrix of two rows and two columns (two display panels in the vertical direction and those in the lateral direction). FIG. 1B is a perspective view of the display device 10 on the display surface side. FIG. 1C is a perspective view of the display device 10 on the side opposite to the display surface side.

FIGS. 1A to 1C illustrate examples where each of the display panels is electrically connected to an FPC.

A display panel which can be used for the display device 10 is described with reference to FIGS. 2A to 2D. FIGS. 2A to 2D illustrate examples of a top view of the display panel 100.

The display panel 100 includes a display region 101 and a region 102. Here, the region 102 refers to a portion other than the display region 101 in a top view of the display panel 100. The region 102 can also be referred to as a non-display region.

Figure 2A:
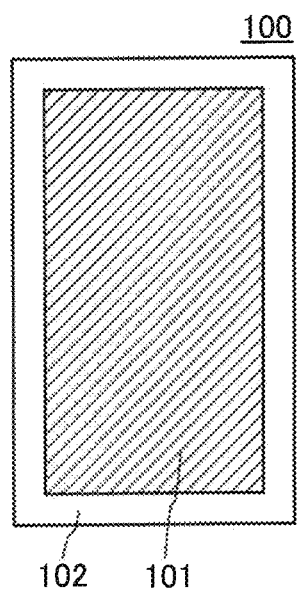
FIGS. 2A to 2D illustrate examples of a display panel.

For example, the display panel 100 may include the frame-like region 102 that surrounds the display region 101 as illustrated in FIG. 2A.

Figure 2B:
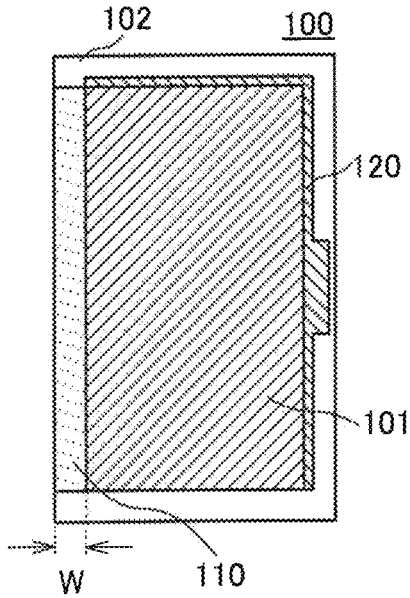
Figure 2C:
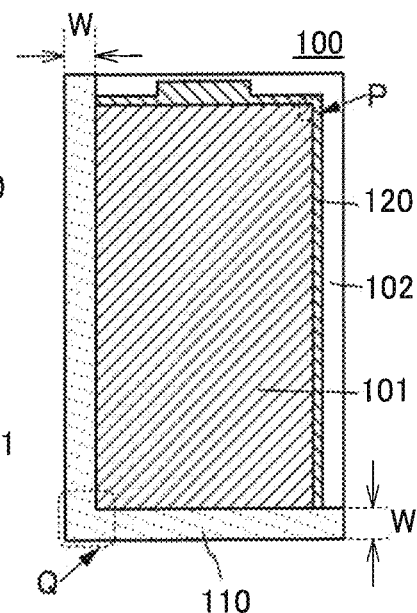
Figure 2D:
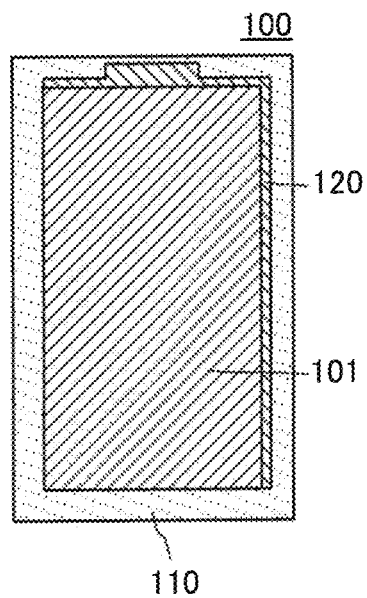

FIGS. 2B to 2D specifically illustrate the structures of the region 102. The region 102 includes a region 110 transmitting visible light and a region 120 blocking visible light. The region 110 transmitting visible light and the region 120 blocking visible light are each adjacent to the display region 101. The region 110 transmitting visible light and the region 120 blocking visible light may each be provided along part of the outer edge of the display region 101.

In the display panel 100 in FIG. 2B, the region 110 transmitting visible light is provided along one side of the display region 101. In the display panel 100 in FIG. 2C, the region 110 transmitting visible light is provided along two sides of the display region 101. The region 110 transmitting visible light may be provided along three or more sides of the display region 101. The region 110 transmitting visible light is preferably in contact with the display region 101 and provided so as to extend to end portions of the display panel as illustrated in FIGS. 2B to 2D or the like.

In the display panel 100 in FIGS. 2B to 2D, the region 120 blocking visible light is provided along two sides of the display region 101. The region 120 blocking visible light may be extended close to the end portions of the display panel.

Note that a region other than the region 110 transmitting visible light and the region 120 blocking visible light in the region 102 illustrated in FIGS. 2B and 2C does not necessarily have a visible light transmitting property. For example, the region 110 transmitting visible light may be provided over the entire circumference of the display panel as illustrated in FIG. 2D. At least part of the region 110 transmitting visible light may be adjacent to the display region 101. The region 120 blocking visible light may be partly provided between the region 110 transmitting visible light and the display region 101.

The display region 101 includes a plurality of pixels arranged in matrix and can display an image. One or more display elements are provided in each pixel. As the display element, a light-emitting element such as an organic EL element, an electrophoretic element, a display element with use of a micro electro mechanical system (MEMS), a liquid crystal element, or the like can be used, for example.

A material which transmits visible light is used for the region 110 transmitting visible light. For example, the region 110 transmitting visible light may include a substrate, a bonding layer, or the like included in the display panel 100. The transmittance with respect to visible light of the region 110 transmitting visible light is preferably higher because light extraction efficiency of the display panel under the region 110 transmitting visible light can be increased. For example, in the region 110 transmitting visible light, the transmittance with respect to light in a wavelength range of 450 nm to 700 nm is 70% or more, preferably 80% or more, more preferably 90% or more on the average.

In the region 120 blocking visible light, for example, a wiring electrically connected to the pixels (or display elements) included in the display region 101 is provided. In addition to the wiring, driver circuits (such as a scan line driver circuit and a signal line driver circuit) for driving the pixels may be provided. Furthermore, the region 120 blocking visible light may include a terminal electrically connected to the FPC or the like (also referred to as a connection terminal), a wiring electrically connected to the terminal, and the like.

Here, the width W of the region 110 transmitting visible light illustrated in FIGS. 2B and 2C is preferably greater than or equal to 0.5 mm and less than or equal to 150 mm, more preferably greater than or equal to 1 mm and less than or equal to 100 mm, still more preferably greater than or equal to 2 mm and less than or equal to 50 mm. The region 110 transmitting visible light serves as a sealing region, and as the width W of the region 110 transmitting visible light is larger, the distance between the edge of the display panel 100 and the display region 101 can become longer, so that entry of an impurity such as water into the display region 101 from the outside can be suppressed. Note that the width W of the region 110 transmitting visible light corresponds to the shortest distance between the display region 101 and the edge of the display panel 100 in some cases.

For example, in the case where an organic EL element is used as the display element, the width W of the region 110 transmitting visible light is set to be greater than or equal to 1 mm, whereby deterioration of the organic EL element can be effectively suppressed, which leads to an improvement in reliability. Note that also in a part other than the region 110 transmitting visible light, the distance between the edge of the display region 101 and the edge of the display panel 100 is preferably in the above range.

The display device 10 in FIG. 1A includes a display panel 100a, a display panel 100b, and a display panel 100c.

The display panel 100b is placed so that part of the display panel 100b overlaps an upper side (a display surface side) of the display panel 100a. Specifically, the region 110b transmitting visible light of the display panel 100b is provided to overlap the display region 101a of the display panel 100a. The region 120b blocking visible light of the display panel 100b is provided so as not to overlap the display region 101a of the display panel 100a. A display region 101b of the display panel 100b is provided to overlap a region 102a of the display panel 100a and a region 120a blocking visible light thereof.

Similarly, the display panel 100c is placed so that part of the display panel 100c overlaps an upper side (a display surface side) of the display panel 100b. Specifically, the region 110c transmitting visible light of the display panel 100c is provided to overlap the display region 101b of the display panel 100b. A region 120c blocking visible light of the display panel 100c is provided so as not to overlap the display region 101b of the display panel 100b. A display region 101c of the display panel 100c is provided to overlap a region 102b of the display panel 100b and a region 120b blocking visible light of the display panel 100b.

The region 110b transmitting visible light is provided to overlap the display region 101a; thus, a user of the display device 10 can visually recognize the entire image of the display region 101a even when the display panel 100b overlaps a display surface of the display panel 100a. Similarly, the region 110c transmitting visible light is provided to overlap the display region 101b; thus, a user of the display device 10 can visually recognize the entire image of the display region 101b even when the display panel 100c overlaps a display surface of the display panel 100b.

The display region 101b of the display panel 100b is provided to overlap the upper sides of the region 102a and the region 120a blocking visible light, whereby a non-display region is not provided between the display region 101a and the display region 101b. Similarly, the display region 101c of the display panel 100c overlaps the upper sides of the region 102b and the region 120b blocking visible light, whereby a non-display region does not exist between the display region 101b and the display region 101c. Therefore, a region where the display region 101a, the display region 101b, and the display region 101c are placed seamlessly can serve as the display region 11 of the display device 10.

The display device 10 in FIGS. 1B and 1C includes the display panel 100a, the display panel 100b, the display panel 100c, and a display panel 100d.

In FIGS. 1B and 1C, short sides of the display panels 100a and 100b overlap with each other, so that part of the display region 101a and part of the region 110b transmitting visible light overlap with each other. The long sides of the display panels 100a and 100c overlap with each other, so that part of the display region 101a and part of the region 110c transmitting visible light overlap with each other.

In FIGS. 1B and 1C, part of the display region 101b overlaps with part of the region 110c transmitting visible light and part of a region 110d transmitting visible light. In addition, part of the display region 101c overlaps with part of the region 110d transmitting visible light.

Therefore, as illustrated in FIG. 1B, a region where the display regions 101a to 101d are placed seamlessly can serve as the display region 11 of the display device 10.

Here, the display panel 100 preferably has flexibility. For example, a pair of substrates included in the display panel 100 preferably has flexibility.

Thus, as shown in FIGS. 1B and 1C, a region near an FPC 112a of the display panel 100a can be bent so that part of the display panel 100a and part of the FPC 112a can be placed under the display region 101b of the display panel 100b adjacent to the FPC 112a. As a result, the FPC 112a can be placed without physical interference with the rear surface of the display panel 100b. Furthermore, when the display panel 100a and the display panel 100b overlap and are fixed to each other, it is not necessary to consider the thickness of the FPC 112a; thus, the difference in height between the top surface of the region 110b transmitting visible light and the top surface of the display panel 100a can be reduced. This can make an end portion of the display panel 100b over the display region 101a less noticeable.

Moreover, each display panel 100 has flexibility, whereby the display panel 100b can be curved gently so that the top surface of the display region 101b of the display panel 100b and the top surface of the display region 101a of the display panel 100a are equal to each other in height. Thus, the heights of the display regions can be equal to each other except in the vicinity of the region where the display panel 100a and the display panel 100b overlap each other, so that the display quality of an image displayed on the display region 11 of the display device 10 can be improved.

Although, the relation between the display panel 100a and the display panel 100b is taken as an example in the above description, the same can apply to the relation between any other two adjacent display panels.

Furthermore, to reduce the step between two adjacent display panels 100, the thickness of the display panel 100 is preferably small. For example, the thickness of the display panel 100 is preferably less than or equal to 1 mm, further preferably less than or equal to 300 μm, still further preferably less than or equal to 100 μm. The display panel is preferably thin because the thickness or weight of the whole display device can also be reduced.

Figure 3A:
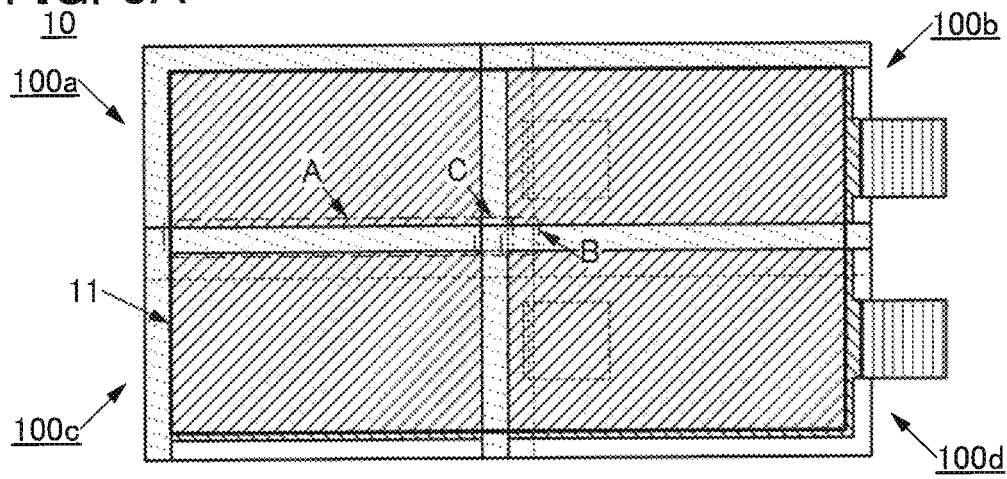
FIGS. 3A to 3C illustrate examples of a display device.

FIG. 3A is a top view of the display device 10 in FIGS. 1B and 1C when seen from the display surface side.

Here, when the region 110 transmitting visible light of the display panel 100 does not have sufficiently high transmittance with respect to visible light (e.g., light with a wavelength of greater than or equal to 450 nm and less than or equal to 700 nm), luminance of a displayed image may be decreased depending on the number of display panels 100 overlapping the display regions 101.

For example, in a region A in FIG. 3A, one display panel 100c overlaps the display region 101a of the display panel 100a. In a region B, the two display panels 100 (the display panels 100c and 100d) overlap the display region 101b of the display panel 100b. In a region C, the three display panels 100 (the display panels 100b, 100c and 100d) overlap the display region 101a of the display panel 100a.

In this case, it is preferable that data of the displayed image be corrected so that the gray scale of the pixels is locally increased depending on the number of display panels 100 overlapping the display regions 101. In this manner, a decrease in the display quality of the image displayed on the display region 11 of the display device 10 can be suppressed.

Alternatively, the position of an end portion of the display panel 100 placed on the upper side may be shifted from the positions of end portions of the other display panels 100, whereby the number of display panels 100 overlapping the display regions 101 of the lower display panels 100 can be reduced.

Figure 3B:
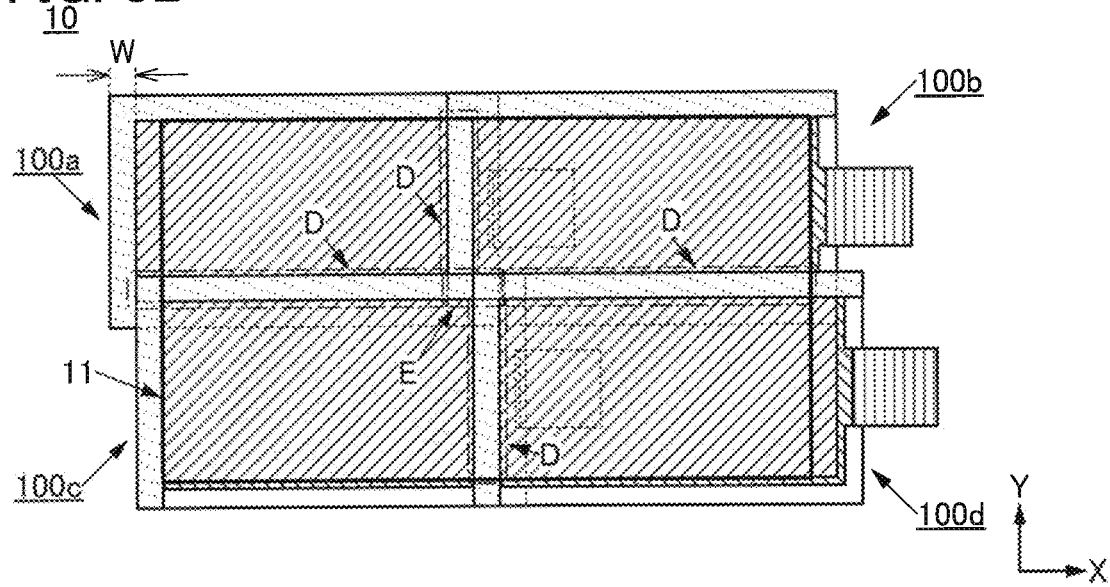

In FIG. 3B, the display panels 100c and 100d placed on the display panels 100a and 100b are shifted in one direction. Specifically, the display panels 100c and 100d are relatively shifted from the display panels 100a and 100b in the X direction by the distance of the width W of the region 110 transmitting visible light. At this time, there are two kinds of regions: a region D in which one display panel 100 overlaps the display region 101, and a region E in which two display panels 100 overlap the display region 101.

Figure 3C:
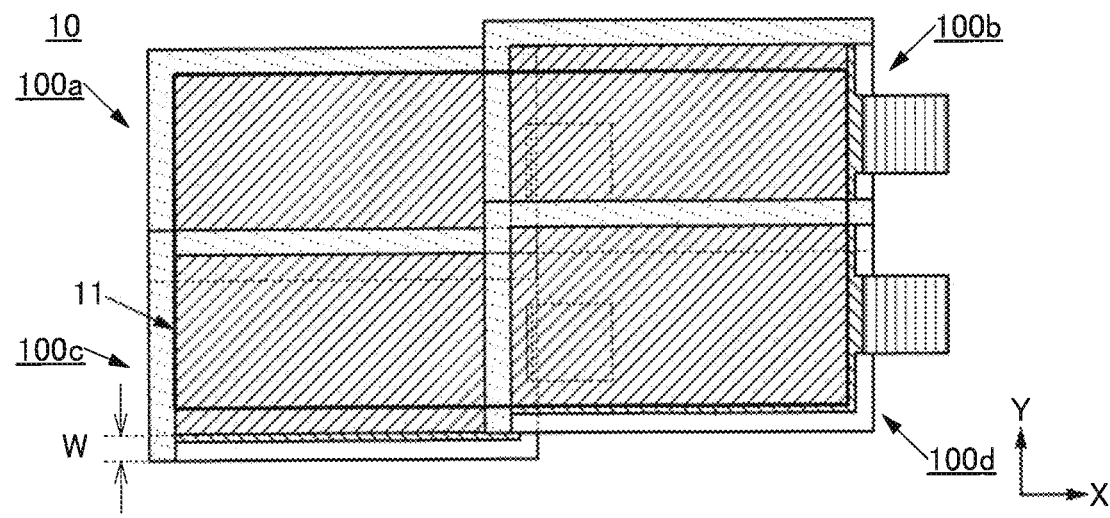

The display panel may be shifted in a direction perpendicular to the X direction (Y direction). In FIG. 3C, the display panels 100b and 100d are relatively shifted from the display panels 100a and 100c in the Y direction by the distance of the width W of the region 110 transmitting visible light.

In the case where the display panel 100 placed on the upper side is shifted from the display 100 placed on the lower side, the shape of the contour of a region in which the display regions 101 of the display panels 100 are combined is different from a rectangular shape. Thus, in the case where the shape of the display region 11 of the display device 10 is set to a rectangular shape as illustrated in FIG. 3B or 3C, the display device 10 may be driven so that no image is displayed on the display regions 101 of the display panels 100 that are placed outside the display region 11. Here, considering the number of pixels in a region where an image is not displayed, more pixels than the number obtained by dividing the number of all the pixels in the rectangular display region 11 by the number of display panels 100 may be provided in the display region 101 of the display panel 100.

Although the distance of relative shift of each display panel 100 is set to an integral multiple of the width W of the region 110 transmitting visible light in the above example, the distance is not limited thereto, and may be set as appropriate in consideration of the shape of the display panel 100, the shape of the display region 11 of the display device 10, in which the display panels 100 are combined, and the like.

FIGS. 4A to 4F and FIGS. 5A to 5F are examples of cross sectional views of the two display panels attached to each other.

In FIGS. 4A to 4D, a lower display panel includes the display region 101a, the region 110a transmitting visible light, and the region 120a transmitting visible light. The lower display panel is electrically connected to the FPC 112a. A display panel on the upper side (on a display surface side) includes the display region 101b, the region 110b transmitting visible light, and the region 120b blocking visible light. The display panel on the upper side is electrically connected to the FPC 112b.

Figure 4A:
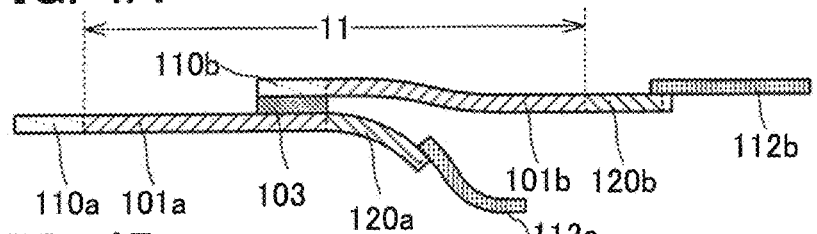
FIGS. 4A to 4F illustrate examples of a display device.

In FIG. 4A, the FPC 112a and the FPC 112b are connected to the display surface side (front surface) of the lower display panel and the display surface side of the of the upper display panel, respectively.

The display region 101a overlaps with the region 110b transmitting visible light with the light-transmitting layer 103 provided therebetween. Therefore, air can be prevented from entering between the display region 101a and the region 110b transmitting visible light, so that reflection at the interface due to a difference in refractive index can be suppressed.

Accordingly, luminance difference that occurs between part of the display region 101a that overlaps with the region 110b transmitting visible light and part of the display region 101a that does not overlap with the region 110b transmitting visible light can be suppressed, so that a seam between the display panels of the display device can be hardly recognized by a user of the display device. In addition, display unevenness or luminance unevenness of the display device can be suppressed.

The region 120a blocking visible light and the FPC 112a overlap the display region 101b. Therefore, a sufficient area of a non-display region can be secured and a seamless display region can be increased in size, so that a highly reliable large display device can be realized.

Figure 4B:
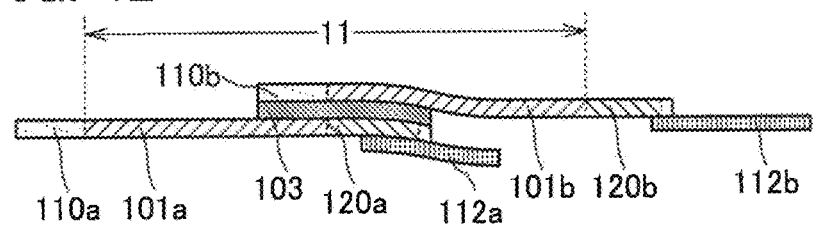

In FIG. 4B, the FPC 112a and the FPC 112b are connected to the surface (rear surface) side opposite to the display surface of the lower display panel and the surface (rear surface) side opposite to the display surface of the upper display panel, respectively.

As illustrated in FIG. 4B, the light-transmitting layer 103 may be provided both between the display region 101a and the region 110b transmitting visible light and between the region 120a transmitting visible light and the display region 101b.

When an FPC is connected to a rear surface side of the display panel, the end portion of the lower display panel can be attached to the rear surface of the upper display panel; thus, the attachment area can be increased and the mechanical strength of the attached portion can be increased.

Figure 4C:
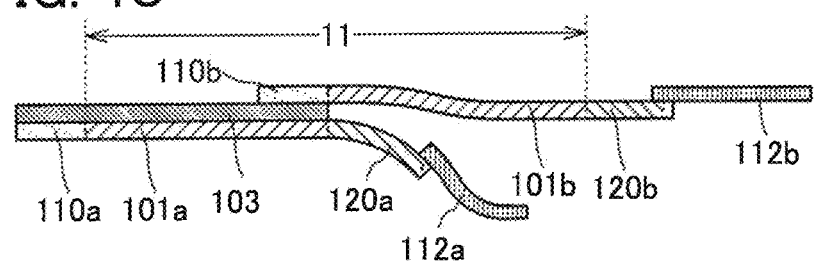

As illustrated in FIG. 4C, the light-transmitting layer 103 may overlap the region of the display region 101a not overlapping with the upper display panel. Furthermore, the region 110a transmitting visible light and the light-transmitting layer 103 may overlap with each other.

Figure 4D:
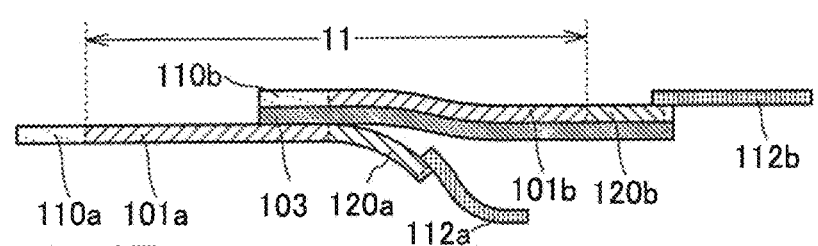

As illustrated in FIG. 4D, the region of the upper display panel not overlapping the display region 101a and the light-transmitting layer 103 may overlap with each other.

Figure 4E:
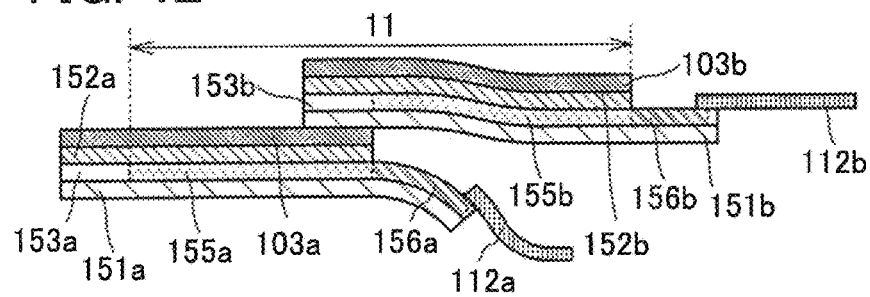

For example, as illustrated in FIG. 4E, the lower display panel may include a substrate 151a, a substrate 152a, and an element layer 153a, and the upper display panel may include a substrate 151b, a substrate 152b, and an element layer 153b.

The element layer 153a includes a region 155a containing a display element and a region 156a including a wiring electrically connected to the display element. The wiring included in the region 156a is electrically connected to the FPC 112a.

The element layer 153b included in the upper display panel also includes a region 155b containing a display element and a region 156b including a wiring electrically connected to the display element. The wiring included in the region 156b is electrically connected to the FPC 112b.

A light-transmitting layer 103a is provided over the substrate 152a. For example, a stack of the substrate 152a and the light-transmitting layer 103a can be formed using the above-described attachment film having a stack of an attachment layer and a base material. The substrate 152b and the light-transmitting layer 103b can have a similar structure to the stack of the substrate 152a and the light-transmitting layer 103a.

Here, fine dirt such as dust in air is attached depending on a material of the light-transmitting layer in some cases. In such a case, it is preferable that the region of the display region 101a not overlapping with the upper display panel and the light-transmitting layer 103 do not overlap with each other. This makes it possible to prevent unclear display of the display device due to dirt or the like attached to the light-transmitting layer 103.

Figure 4F:
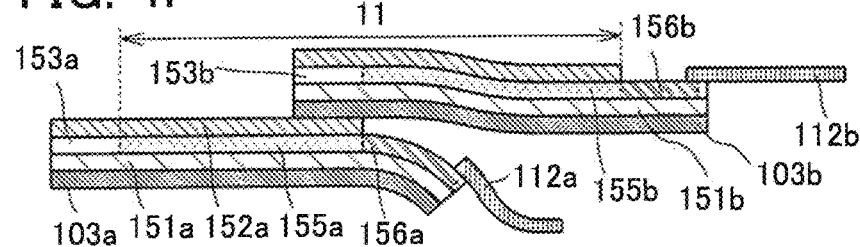

As illustrated in FIG. 4F, the light-transmitting layer 103a may be in contact with the substrate 151a. For example, a stack of the substrate 151a and the light-transmitting layer 103a can be formed with use of the above described attachment film having a stack of an attachment layer and a base material. The substrate 151b and the light-transmitting layer 103b can have a similar structure to the stack of the substrate 151a and the light-transmitting layer 103a.

In the structure shown in FIG. 4F, the light-transmitting layer is not provided on the outermost surface of the display surface of the display device; thus, unclear display of the display device due to dirt or the like attached to the light-transmitting layer 103 can be prevented. In addition, when a light-transmitting layer having attachability is provided on the rear surface of the display device, the display device can be detachably attached to a desired portion by using a surface of the light-transmitting layer which is not in contact with the display panel.

Figure 5A:
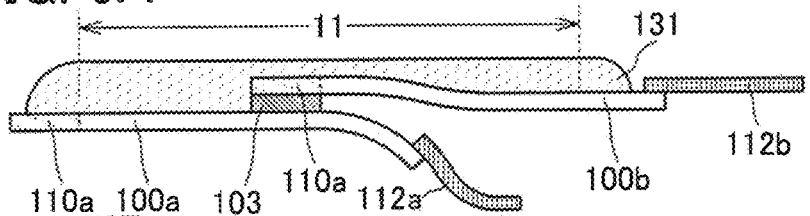
FIGS. 5A to 5F illustrate examples of a display device.
Figure 5B:
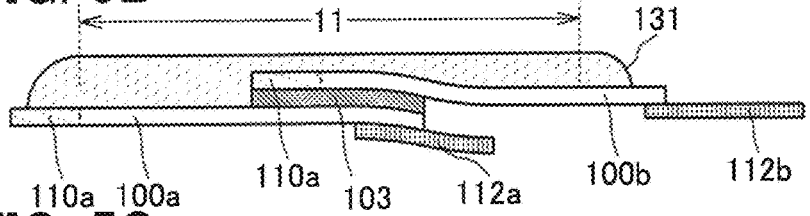

Alternatively, as illustrated in FIGS. 5A and 5B, a resin layer 131 which covers front surfaces of the display panel 100a and the display panel 100b may be provided. Specifically, the resin layer 131 is preferably provided to cover the display regions of the display panels 100a and 100b and a region where the display panel 100a and the display panel 100b overlap.

By providing the resin layer 131 over the plurality of display panels 100, the mechanical strength of the display device 10 can be increased. In addition, the resin layer 131 is formed to have a flat surface, whereby the display quality of an image displayed on the display region 11 can be increased. For example, when a coating apparatus such as a slit coater, a curtain coater, a gravure coater, a roll coater, or a spin coater is used, the resin layer 131 with high flatness can be formed.

The refractive index of the resin layer 131 is preferably 0.8 to 1.2 times as high as the refractive index of the substrate on the display surface side of the display panel 100, more preferably 0.9 times to 1.1 times as high as the refractive index of the substrate on the display surface side of the display panel 100, and still more preferably 0.95 to 1.15 times as high as the refractive index of the substrate on the display surface side of the display panel 100. Light can be extracted outside more efficiently as the difference in refractive index between the display panel 100 and the resin layer 131 is smaller. In addition, the resin layer 131 with such a refractive index is provided to cover a step portion between the display panel 100a and the display panel 100b, whereby the step portion is not easily recognized visually, and the display quality of an image displayed on the display region 11 can be increased.

The resin layer 131 is a layer that transmits visible light. As the resin layer 131, for example, an organic resin such as an epoxy resin, an aramid resin, an acrylic resin, a polyimide resin, a polyamide resin, or a polyamide-imide resin can be used.

Figure 5C:
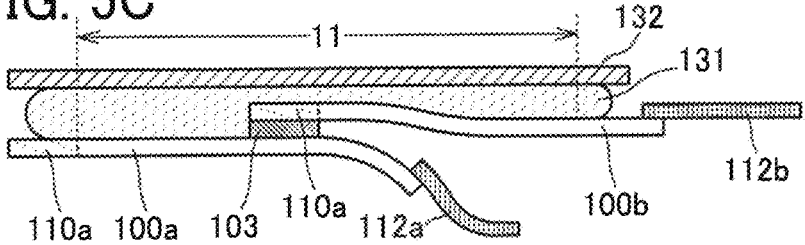
Figure 5D:
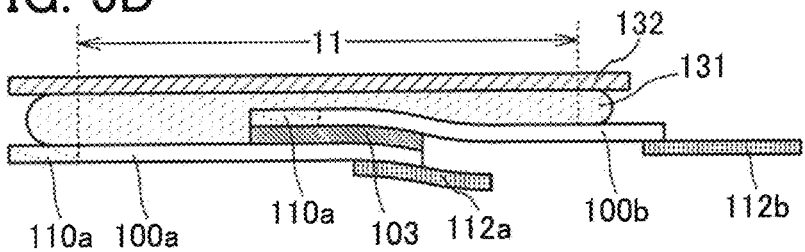

Alternatively, as illustrated in FIGS. 5C and 5D, a protective substrate 132 is preferably provided over the display device 10 with the resin layer 131 provided therebetween. Here, the resin layer 131 may serve as a bonding layer for bonding the protective substrate 132 to the display device 10. With the protective substrate 132, the surface of the display device 10 can be protected, and moreover, the mechanical strength of the display device 10 can be increased. For the protective substrate 132 in a region overlapping at least the display region 11, a light-transmitting material is used. Furthermore, the protective substrate 132 in a region other than the region overlapping the display region 11 may have a light-blocking property not to be visually recognized.

The protective substrate 132 may have a function of a touch panel. In the case where the display panel 100 is flexible and can be bent, the protective substrate 132 is also preferably flexible.

Furthermore, a difference in refractive index between the protective substrate 132 and the substrate on the display surface side of the display panel 100 or the resin layer 131 is preferably less than or equal to 20%, further preferably less than or equal to 10%, still further preferably less than or equal to 5%.

As the protective substrate 132, a plastic substrate that is formed as a film can be used. Examples of the plastic substrate include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon, aramid), a polycycloolefin resin, a polystyrene resin, a polyamide imide resin, a polyvinyl chloride resin, polyetheretherketone (PEEK) resin, polysulfone (PSF) resin, polyetherimide (PEI) resin, polyarylate (PAR) resin, polybutylene terephthalate (PBT) resin, a polytetrafluoroethylene (PTFE) resin, and a silicone resin. A substrate in which a fibrous body is impregnated with a resin (also referred to as prepreg) or a substrate whose coefficient of linear expansion is reduced by mixing an organic resin with an inorganic filler can also be used. Furthermore, the protective substrate 132 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used. Note that the display device or the display panel of one embodiment of the present invention may be attached to an acrylic plate, a glass plate, a wooden plate, a metal plate, or the like. The display surface of the display device or that of the display panel or the surface opposite to the display surface thereof may be attached to these plates (in the case where the display surface is attached to any of these plates, a plate transmitting visible light is used). It is preferable that the display device or the display panel be detachably attached to any of these plates.

As the protective substrate 132, at least one of a polarizing plate, a circular polarizing plate, a retardation plate, an optical film, and the like may be used.

Figure 5E:
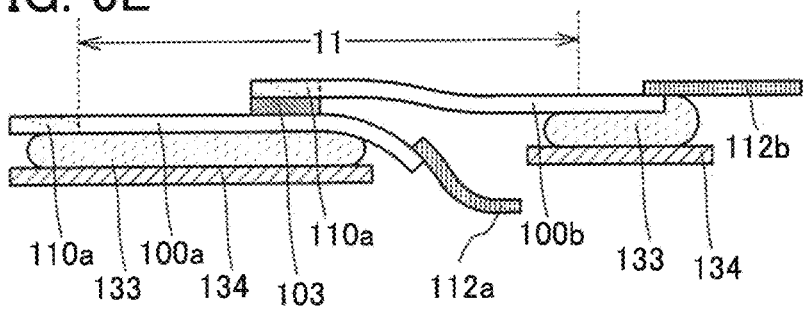

As illustrated in FIG. 5E, resin layers 133 and protective substrates 134 may be provided on surfaces opposite to the display surfaces of the display panel 100a and the display panel 100b. When the substrate supporting the display panels is provided on the rear surfaces of the display panels, unintended warping or bending of the display panels can be suppressed, whereby the display surface is kept smooth. Thus, the display quality of an image displayed on the display region 11 can be improved.

Note that the resin layer 133 and the protective substrate 134, which are provided on the side opposite to the display surface, do not necessarily have a light-transmitting property, and a material which absorbs or reflects visible light may be used.

Figure 5F:
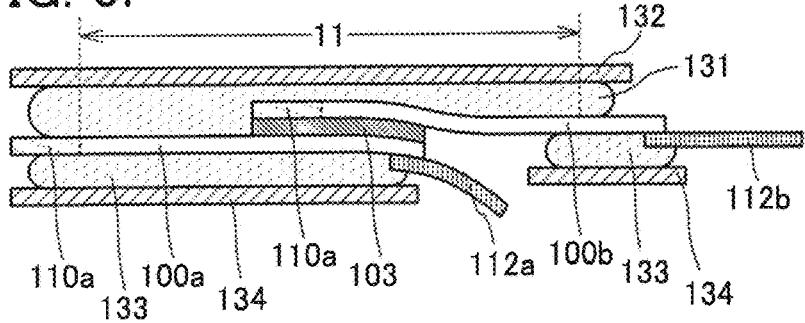

As illustrated in FIG. 5F, the resin layer 131 and the protective substrate 132 may be provided on the front surfaces of the display panels, and the resin layer 133 and the protective substrate 134 may be provided on the rear surface thereof. In this manner, the display panels 100a and 100b are sandwiched between the two protective substrates, whereby the mechanical strength of the display device 10 can be further increased.

It is preferable that the total thickness of the resin layer 131 and the protective substrate 132 be approximately the same as that of the resin layer 133 and the protective substrate 134. For example, it is preferable that the thicknesses of the resin layers 131 and 133 are substantially equal to each other, and for the protective substrates 132 and 134, materials having the same thickness be used. In that case, the plurality of display panels 100 can be located at the center of the stack in the thickness direction. For example, when the stack including the display panel 100 is bent, by locating the display panel 100 at the center in the thickness direction, stress in the lateral direction applied to the display panel 100 by bending can be relieved, which prevents the display panel 100 from being damaged.

In the case where the thickness of the resin layer and the protective substrate differs between an end portion and a center of the display device, for example, the total thickness of the resin layer 131 and the protective substrate 132 and that of the resin layer 133 and the protective substrate 134 can be compared in the same condition which is appropriately selected from conditions such as the average thickness, the largest thickness, the smallest thickness, or the like.

In FIG. 5F, the same material is preferably used for the resin layers 131 and 133 because the manufacturing cost can be reduced. Similarly, the same material is preferably used for the protective substrates 132 and 134 because the manufacturing cost can be reduced.

As illustrated in FIGS. 5E and 5F, an opening for extracting the FPC 112a is preferably provided in the resin layer 133 and the protective substrate 134, which are located on the rear surface sides of the display panels 100a and 100b. In particular, as illustrated in FIG. 5F, by providing the resin layer 133 to cover part of the FPC 112a, the mechanical strength at a connection portion between the display panel 100a and the FPC 112a can be increased, and defects such as separation of the FPC 112a can be suppressed. Similarly, the resin layer 133 is preferably provided to cover part of the FPC 112b.

Figure 6A:
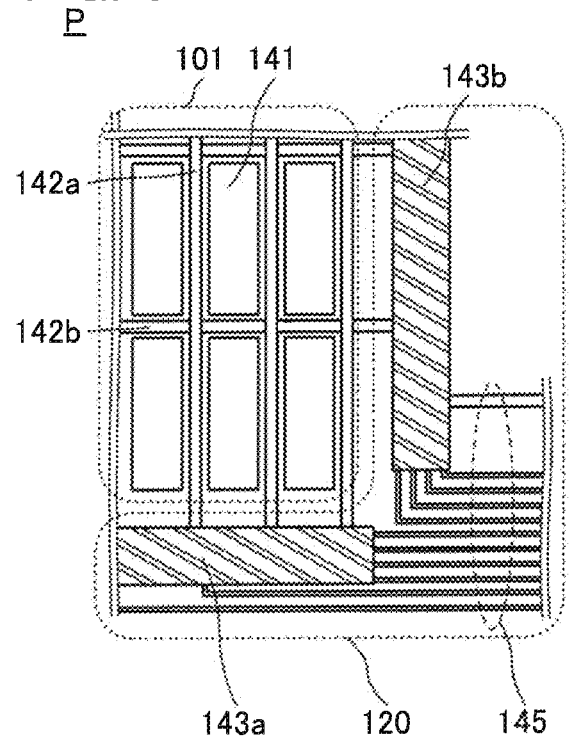
FIGS. 6A to 6C illustrate an example of a display panel.
Figure 6B:
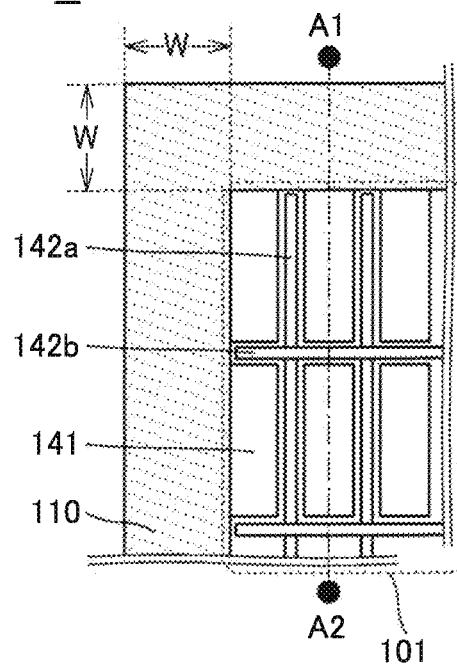

Next, a structure example of the display panel 100 is described. FIG. 6A is an example of a top view in which a region P in FIG. 2C is enlarged, and FIG. 6B is an example of a top view in which a region Q in FIG. 2C is enlarged.

As illustrated in FIG. 6A, in the display region 101, a plurality of pixels 141 is arranged in matrix. In the case where the display panel 100 capable of full color display with three colors of red, blue, and green is formed, each of the plurality of pixels 141 corresponds to a sub-pixel capable of displaying any of the three colors. Alternatively, a sub-pixel capable of displaying white or yellow in addition to the three colors may be provided. A region including the pixels 141 corresponds to the display region 101.

A wiring 142a and a wiring 142b are electrically connected to one pixel 141. The plurality of wirings 142a each intersects with the wiring 142b, and is electrically connected to a circuit 143a. The plurality of wirings 142b is electrically connected to a circuit 143b. One of the circuits 143a and 143b can function as a scan line driver circuit, and the other can function as a signal line driver circuit. A structure without one of the circuits 143a and 143b or both of them may be employed.

In FIG. 6A, a plurality of wirings 145 electrically connected to the circuit 143a or the circuit 143b is provided. The wiring 145 is electrically connected to an FPC 123 in an unillustrated region and has a function of supplying a signal from the outside to the circuits 143a and 143b.

In FIG. 6A, a region including the circuit 143a, the circuit 143b, the plurality of wirings 145, and the like corresponds to the region 120 blocking visible light.

In FIG. 6B, a region outside the pixel 141 provided closest to the end corresponds to the region 110 transmitting visible light. The region 110 transmitting visible light does not include the members blocking visible light, such as the pixel 141, the wiring 142a, and the wiring 142b. Note that in the case where part of the pixel 141, the wiring 142a, or the wiring 142b transmits visible light, the part of the pixel 141, the wiring 142a, or the wiring 142b may be provided to extend to the region 110 transmitting visible light.

In the case where the width W of the region 110 transmitting visible light varies depending on the display panel, or in the case where the width varies depending on the positions of the same display panel, the shortest length can be referred to as the width W. In FIG. 6B, the distance between the pixel 141 and the end portion of the substrate (that is, the width W of the region 110 transmitting visible light) in the vertical direction is the same as that in the horizontal direction, but one embodiment of the present invention is not limited thereto.

Figure 6C:
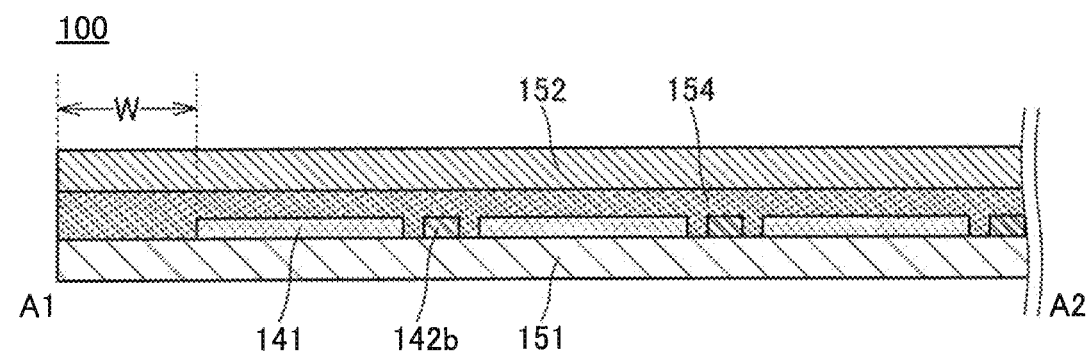

FIG. 6C is a cross-sectional view taken along line A1-A2 in FIG. 6B. The display panels 100 include a pair of substrates (a substrate 151 and a substrate 152) transmitting visible light. The substrate 151 and the substrate 152 are bonded to each other with a bonding layer 154. Here, the substrate on which the pixel 141, the wiring 142b, and the like are formed is referred to as the substrate 151.

As illustrated in FIGS. 6B and 6C, in the case where the pixel 141 is positioned closest to the end of the display region 101, the width W of the region 110 transmitting visible light is the distance between the end portion of the substrate 151 or the substrate 152 and the end portion of the pixel 141.

Note that the end portion of the pixel 141 refers to the end portion of the member that is positioned closest to the end and blocks visible light in the pixel 141. Alternatively, in the case where a light-emitting element including a layer containing a light-emitting organic compound between a pair of electrodes (also referred to as an organic EL element) is used as the pixel 141, the end portion of the pixel 141 may be any of the end portion of the lower electrode, the end portion of the layer containing a light-emitting organic compound, and the end portion of the upper electrode.

Figure 7A:
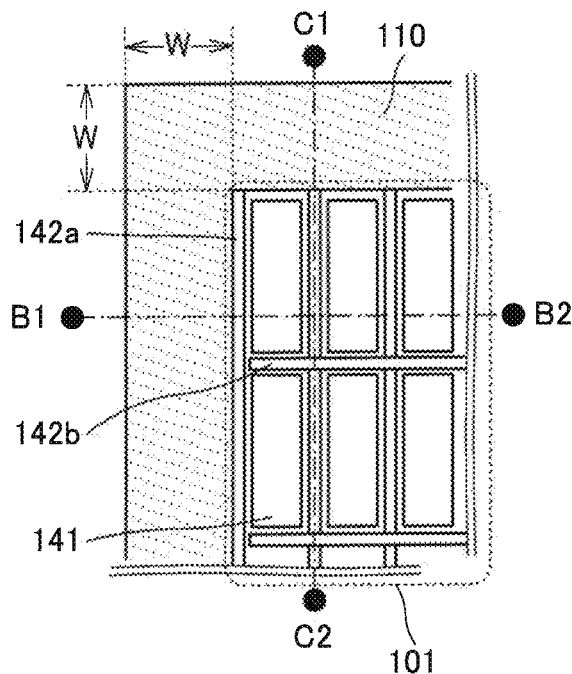
FIGS. 7A to 7C illustrate an example of a display panel.
Figure 7B:
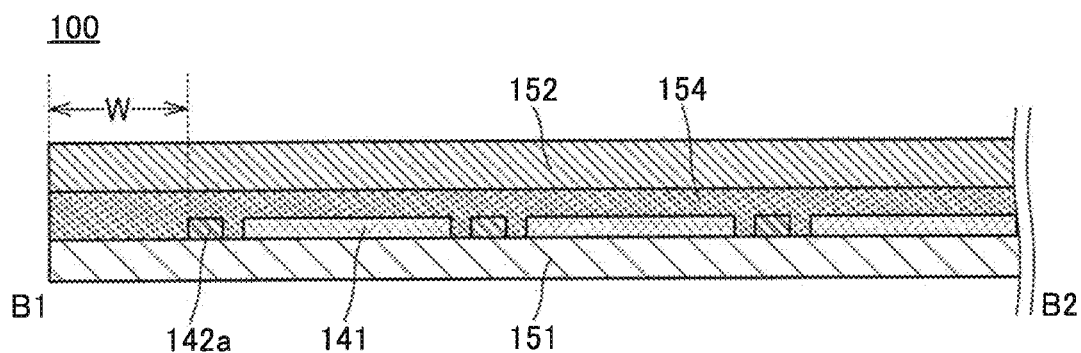

FIG. 7A is an example of a top view in which the region Q is enlarged, and the position of the wiring 142a is different from that in FIG. 6B. FIG. 7B is a cross-sectional view taken along line B1-B2 in FIG. 7A, and FIG. 7C is a cross sectional view taken along line C1-C2 in FIG. 7A.

Figure 7C:
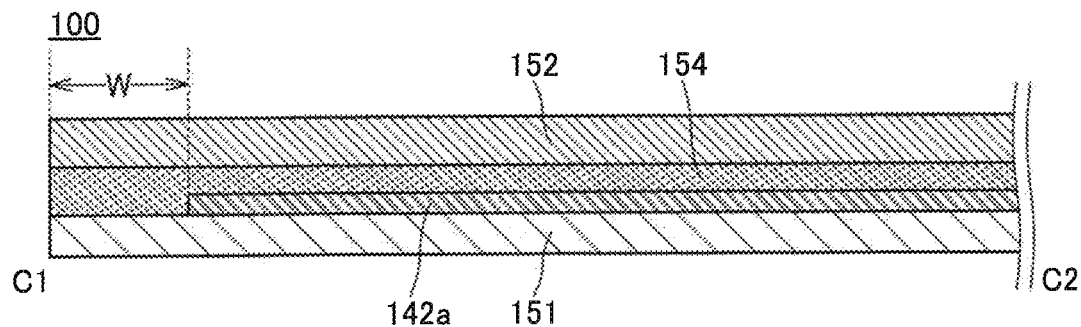

As illustrated in FIGS. 7A to 7C, in the case where the wiring 142a is positioned closest to the end of the display region 101, the width W of the region 110 transmitting visible light is the distance between the end portion of the substrate 151 or the substrate 152 and the end portion of the wiring 142a. In the case where the wiring 142a transmits visible light, the region 110 transmitting visible light may include a region where the wiring 142a is provided.

Here, in the case where the density of pixels provided in the display region 101 of the display panel 100 is high, misalignment may occur when the two display panels 100 are bonded.

Figure 8A:
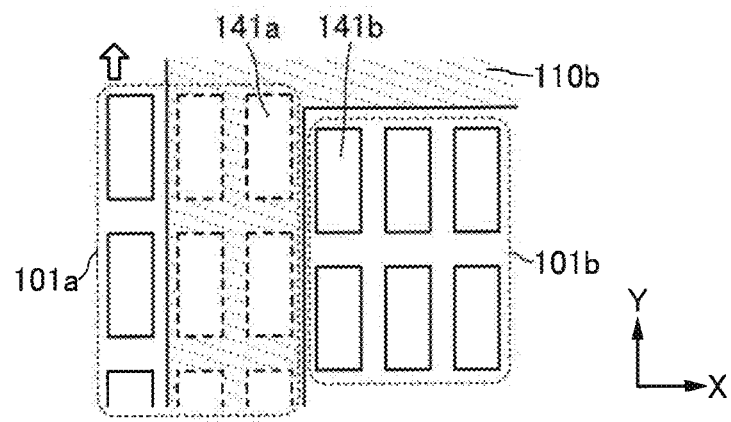
FIGS. 8A to 8C illustrate examples of a display device.
Figure 8B:
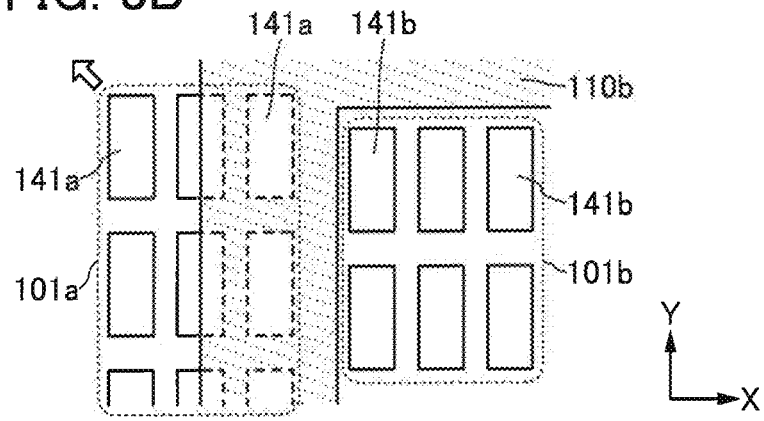
Figure 8C:
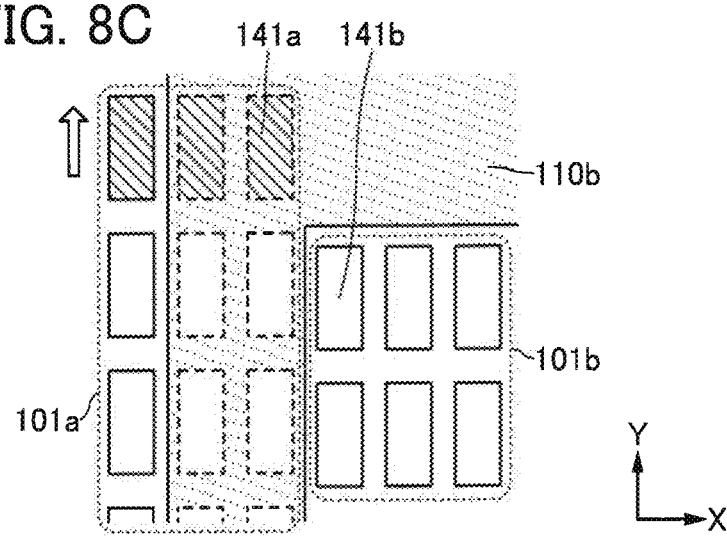

FIGS. 8A to 8C show a positional relation between the display region 101a of the display panel 100a provided on the lower side and the display region 101b of the display panel 100b provided on the upper side, seen from the display surface side. FIGS. 8A to 8C show the vicinities of the corner portions of the display regions 101a and 101b. Part of the display region 101a is covered with the region 110b transmitting visible light.

FIG. 8A shows the case where adjacent pixels 141a and 141b are relatively deviated in one direction (Y direction). The arrow in the drawing denotes a direction in which the display panel 100a is deviated from the display panel 100b.

FIG. 8B shows an example in which the adjacent pixels 141a and 141b are relatively deviated in a vertical direction and a horizontal direction (X direction and Y direction).

In the examples of FIGS. 8A and 8B, the distances deviated in the vertical direction and the horizontal direction are each shorter than the length of one pixel. In this case, image data of the image displayed on either one of the display regions 101a and 101b is corrected depending on the deviation distance, whereby the display quality can be maintained. Specifically, when the deviation makes the distance between the pixels smaller, the data is corrected so that the gray level (luminance) of the pixels is low, and when the deviation makes the distance between the pixels larger, the data is corrected so that the gray level (luminance) of the pixels is high. Alternatively, when the two pixels overlap, the data is corrected so that the pixel positioned on a lower side is not driven and the image data is shifted by one column.

FIG. 8C shows an example in which the pixels 141a and 141b, which should be adjacent, are relatively deviated in one direction (Y direction) by a distance of more than one pixel. When the deviation of more than one pixel occurs, the pixels are driven so that projecting pixels (pixels which are hatched) are not displayed. Note that the same applies to the case where the deviation direction is the X direction.

When the plurality of display panels 100 are bonded, in order to suppress misalignment, each of the display panels 100 is preferably provided with an alignment marker or the like. Alternatively, a projection and a depression may be formed on the surfaces of the display panels 100, and the projection and the depression may be attached to each other in a region where the two display panels 100 overlap.

Furthermore, in consideration of alignment accuracy, it is preferable that pixels more than the pixels to be used be placed in advance in the display region 101 of the display panel 100. For example, it is preferable that one or more, preferably three or more, further preferably five or more extra pixel columns along either one or both of a scan line and a signal line be provided in addition to the pixel columns used for display.

As described above, in the display device of one embodiment of the present invention, the display region of the display panel positioned on the lower side and the region transmitting visible light of the display panel positioned on the upper side overlap with each other. Accordingly, a non-display region between the display regions of two overlapping display panels can be reduced. Furthermore, the light-transmitting layer having a refractive index higher than that of air and transmitting visible light is provided between the display region and the region transmitting visible light. In that case, air can be prevented from entering between the display region and the region transmitting visible light, so that reflection at the interface due to a difference in refractive index can be reduced. Thus, a large display device in which a seam between the display panels is hardly recognized and display unevenness or luminance unevenness is suppressed can be obtained.

This embodiment can be combined with any other embodiment as appropriate.

Embodiment 2

In this embodiment, a light-emitting panel that can be used for the display device of one embodiment of the present invention is described with reference to drawings.

Although a light-emitting panel including an organic EL element is mainly described in this embodiment as an example, a panel that can be used for the display device of one embodiment of the present invention is not limited to this example.

Specific Example 1

Figure 9A:
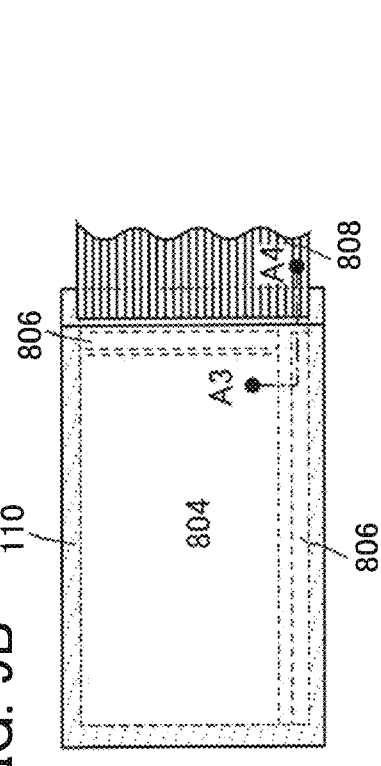
FIGS. 9A to 9C illustrate examples of a light-emitting panel.
Figure 9B:
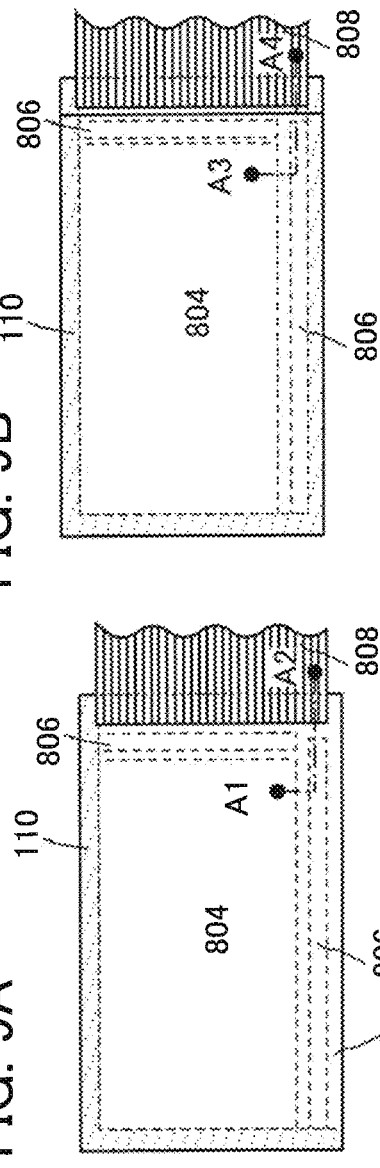
Figure 9C:
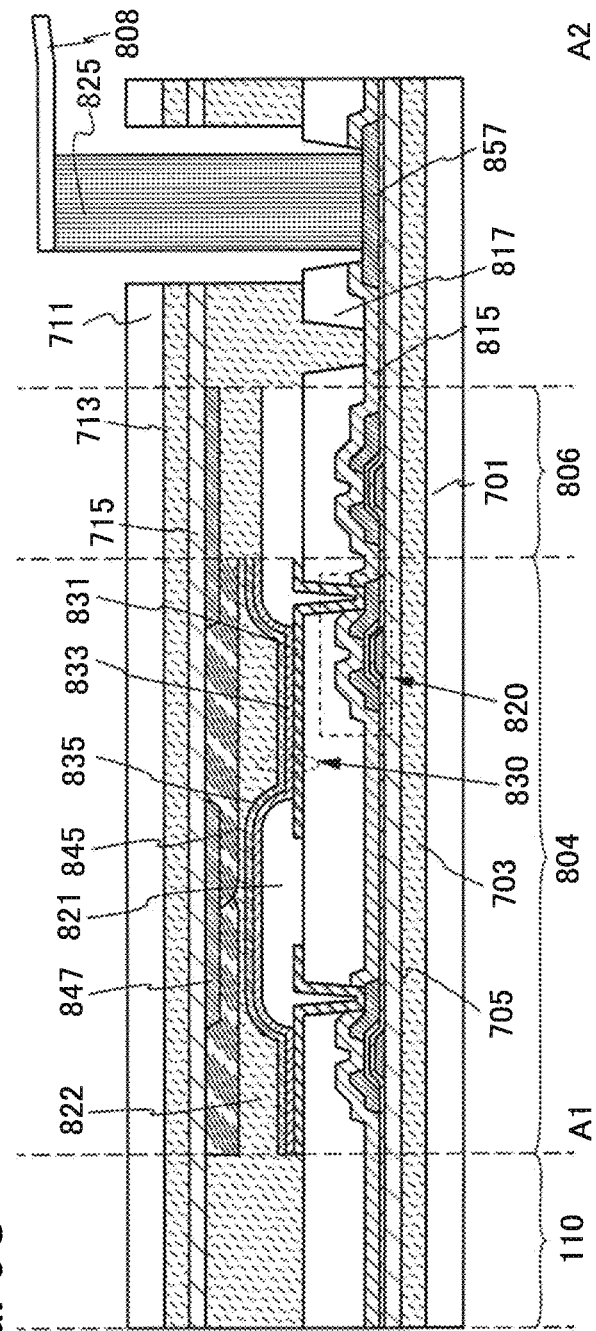

FIG. 9A is a plan view of a light-emitting panel, and FIG. 9C is an example of a cross-sectional view taken along dashed-dotted line A1-A2 in FIG. 9A. FIG. 9C illustrates an example of a cross-sectional view of the region 110 transmitting visible light. The light-emitting panel described in Specific Example 1 is a top-emission light-emitting panel using a color filter method. In this embodiment, the light-emitting panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on the color element and colors other than R, G, B, W, and Y may be used. For example, cyan, magenta, or the like may be used.

The light-emitting panel illustrated in FIG. 9A includes the region 110 transmitting visible light, a light-emitting portion 804, a driver circuit portion 806, and an FPC 808. The region 110 transmitting visible light is adjacent to the light-emitting portion 804, and is placed along two sides of the light-emitting portion 804.

The light-emitting panel illustrated in FIG. 9C includes a substrate 701, a bonding layer 703, an insulating layer 705, a plurality of transistors, a conductive layer 857, an insulating layer 815, an insulating layer 817, a plurality of light-emitting elements, an insulating layer 821, a bonding layer 822, a coloring layer 845, a light-blocking layer 847, an insulating layer 715, a bonding layer 713, and a substrate 711. The bonding layer 822, the insulating layer 715, the bonding layer 713, and the substrate 711 transmit visible light. Light-emitting elements and transistors included in the light-emitting portion 804 and the driver circuit portion 806 are sealed with the substrate 701, the substrate 711, and the bonding layer 822.

The light-emitting portion 804 includes a transistor 820 and a light-emitting element 830 over the substrate 701 with the bonding layer 703 and the insulating layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 also includes the coloring layer 845 overlapping with the light-emitting element 830 and the light-blocking layer 847 overlapping with the insulating layer 821. The space between the light-emitting element 830 and the coloring layer 845 is filled with the bonding layer 822.

The insulating layer 815 has an effect of suppressing diffusion of impurities into a semiconductor included in the transistor. As the insulating layer 817, an insulating layer having a planarization function is preferably selected in order to reduce surface unevenness due to the transistor.

The driver circuit portion 806 includes a plurality of transistors over the substrate 701 with the bonding layer 703 and the insulating layer 705 provided therebetween. In FIG. 9C, one of the transistors included in the driver circuit portion 806 is illustrated.

The insulating layer 705 and the substrate 701 are attached to each other with the bonding layer 703. The insulating layer 715 and the substrate 711 are attached to each other with the bonding layer 713. The insulating layer 705 and the insulating layer 715 are preferably highly resistant to moisture, in which case impurities such as water can be prevented from entering the light-emitting element 830 or the transistor 820, leading to higher reliability of the light-emitting panel.

The conductive layer 857 is electrically connected to an external input terminal through which a signal (e.g., a video signal, a clock signal, a start signal, and a reset signal) or a potential from the outside is transmitted to the driver circuit portion 806. Here, an example is described in which an FPC 808 is provided as the external input terminal. To prevent an increase in the number of fabrication steps, the conductive layer 857 is preferably formed using the same material and step as the electrode or the wiring in the light-emitting portion or the driver circuit portion. Here, an example in which the conductive layer 857 is formed using the same material and step as the electrodes included in the transistor 820 is described.

In the light-emitting panel illustrated in FIG. 9C, the FPC 808 is positioned over the substrate 711. A connector 825 is connected to the conductive layer 857 through an opening provided in the substrate 711, the bonding layer 713, the insulating layer 715, the bonding layer 822, the insulating layer 817, and the insulating layer 815. The connector 825 is also connected to the FPC 808. The FPC 808 and the conductive layer 857 are electrically connected to each other via the connector 825. In the case where the conductive layer 857 overlaps with the substrate 711, the conductive layer 857, the connector 825, and the FPC 808 can be electrically connected to one another by forming an opening in the substrate 711 (or using a substrate having an opening portion).

Figure 20:
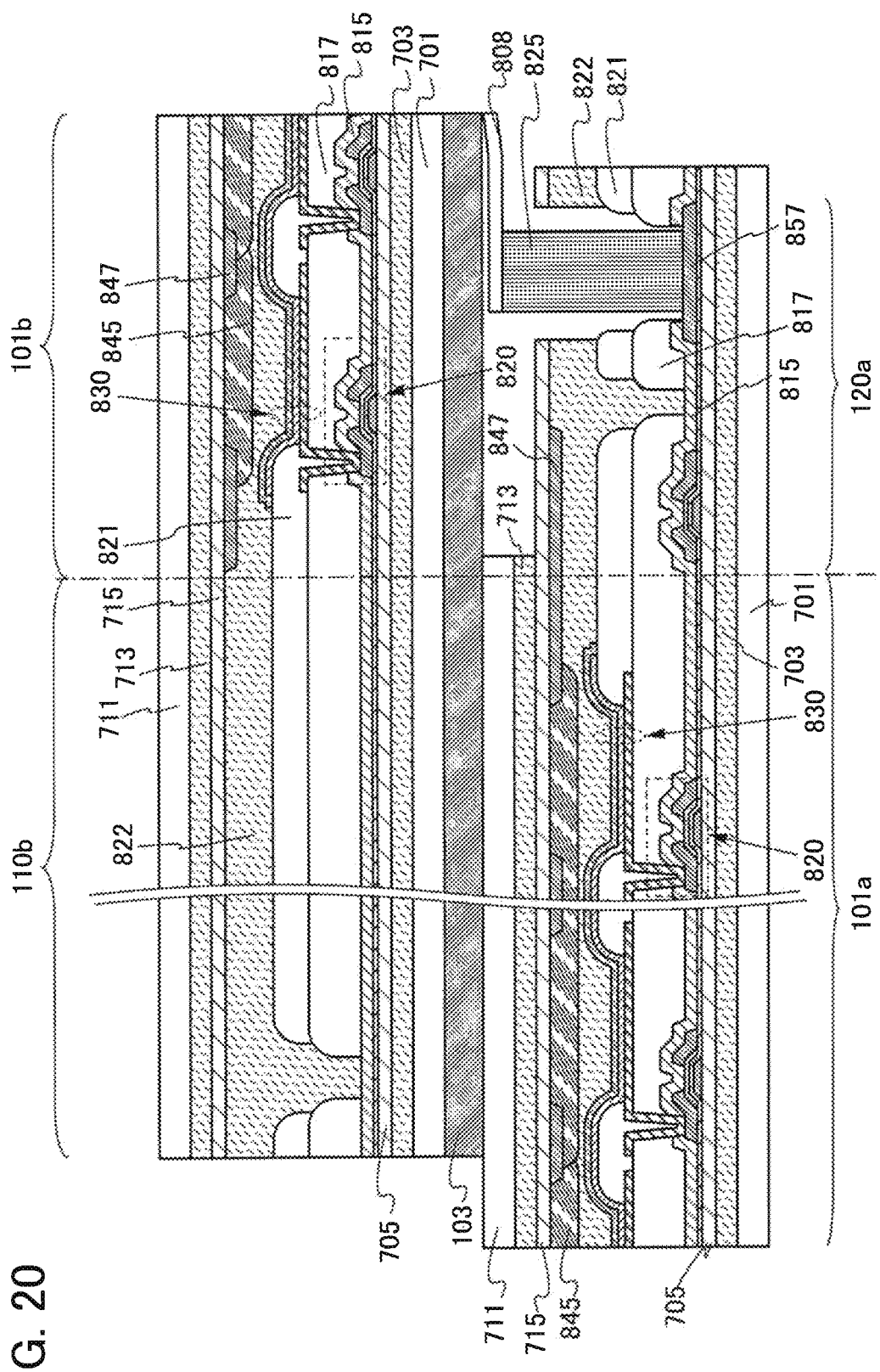
FIG. 20 illustrates an example of a display device.

FIG. 20 is an example of a cross-sectional view of the display device including two light-emitting panels illustrated in FIG. 9B that overlap each other. FIG. 20 illustrates the display region 101a of the lower light-emitting panel (corresponding to the light-emitting portion 804 illustrated in FIG. 9B), the region 120a blocking visible light of the lower light-emitting panel (corresponding to the driver circuit portion 806 or the like illustrated in FIG. 9B), the display region 101b of an upper light-emitting panel (corresponding to the light-emitting portion 804 illustrated in FIG. 9B), and the region 110b transmitting visible light of the upper light-emitting panel (corresponding to the region 110 transmitting visible light illustrated in FIG. 9B).

In the display device illustrated in FIG. 20, the light-emitting panel positioned on the display surface side (upper side) includes the region 110b transmitting visible light adjacent to the display region 101b. The display region 101a of the lower light-emitting panel and the region 110b transmitting visible light of the upper light-emitting panel overlap with each other. Therefore, a non-display region between the display regions of the two light-emitting panels overlapping with each other can be reduced or even removed. Accordingly, a large display device in which a seam between light-emitting panels is hardly recognized by a user can be achieved.

The display device illustrated in FIG. 20 includes a light-transmitting layer 103 having a refractive index higher than that of air and transmitting visible light between the display region 101a and the region 110b transmitting visible light. In that case, air can be prevented from entering between the display region 101a and the region 110b transmitting visible light, so that the reflection at the interface due to a difference in refractive index can be reduced. In addition, display unevenness or luminance unevenness of the display device can be suppressed.

The light-transmitting layer 103 may overlap with the entire surface of the substrate 711 of the lower light-emitting panel or that of the substrate 701 of the upper light-emitting panel, or may overlap with only the display region 101a and the region 110b transmitting visible light. In addition, the substrate 711 and the light-transmitting layer 103 may be included in the region 120a blocking visible light.

For example, the stack of the substrate 701 of the upper light-emitting panel and the light-transmitting layer 103 can be formed of an attachment film having a stack of an attachment layer and a base material.

Specific Example 2

FIG. 9B is a plan view of the light-emitting panel, and FIG. 10A is an example of a cross-sectional view taken along dashed-dotted line A3-A4 in FIG. 9B. The light-emitting panel described in Specific Example 2 is a top-emission light-emitting panel using a color filter method, which is different from that described in Specific Example 1. Portions different from those in Specific Example 1 will be described in detail here and the descriptions of portions common to those in Specific Example 1 will be omitted.

FIG. 9B illustrates an example where the region 110 transmitting visible light is provided along three sides of the light-emitting panel. The region 110 transmitting visible light along two sides among the three is adjacent to the light-emitting portion 804.

The light-emitting panel illustrated in FIG. 10A is different from that in FIG. 9C in the following respects.

The light-emitting panel illustrated in FIG. 10A includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting panel illustrated in FIG. 10A includes a spacer 823 over the insulating layer 821. The spacer 823 can adjust the distance between the substrate 701 and the substrate 711.

The light-emitting panel in FIG. 10A includes an overcoat 849 covering the coloring layer 845 and the light-blocking layer 847. The space between the light-emitting element 830 and the overcoat 849 is filled with the bonding layer 822.

In addition, in the light-emitting panel in FIG. 10A, the substrate 701 differs from the substrate 711 in size. The FPC 808 is located over the insulating layer 715 and does not overlap with the substrate 711. The connector 825 is connected to the conductive layer 857 through an opening provided in the insulating layer 715, the bonding layer 822, the insulating layer 817, and the insulating layer 815. Since no opening needs to be provided in the substrate 711, there is no limitation on the material of the substrate 711.

Note that as illustrated in FIG. 10B, the light-emitting element 830 may include an optical adjustment layer 832 between the lower electrode 831 and the EL layer 833. A light-transmitting conductive material is preferably used for the optical adjustment layer 832. Owing to the combination of a color filter (the coloring layer) and a microcavity structure (the optical adjustment layer), light with high color purity can be extracted from the display device of one embodiment of the present invention. The thickness of the optical adjustment layer may be varied depending on the emission color of the sub-pixel.

Specific Example 3

FIG. 9B is a plan view of a light-emitting panel, and FIG. 10C is an example of a cross-sectional view taken along dashed-dotted line A3-A4 in FIG. 9B. The light-emitting panel described in Specific Example 3 is a top-emission light-emitting panel using a separate coloring method.

The light-emitting panel in FIG. 10C includes the substrate 701, the bonding layer 703, the insulating layer 705, a plurality of transistors, the conductive layer 857, the insulating layer 815, the insulating layer 817, a plurality of light-emitting elements, the insulating layer 821, the spacer 823, the bonding layer 822, and the substrate 711. The bonding layer 822 and the substrate 711 transmit visible light.

In the light-emitting panel illustrated in FIG. 10C, the connector 825 is positioned over the insulating layer 815. The connector 825 is connected to the conductive layer 857 through an opening provided in the insulating layer 815. The connector 825 is also connected to the FPC 808. The FPC 808 and the conductive layer 857 are electrically connected to each other via the connector 825.

Specific Example 4

Figure 11A:
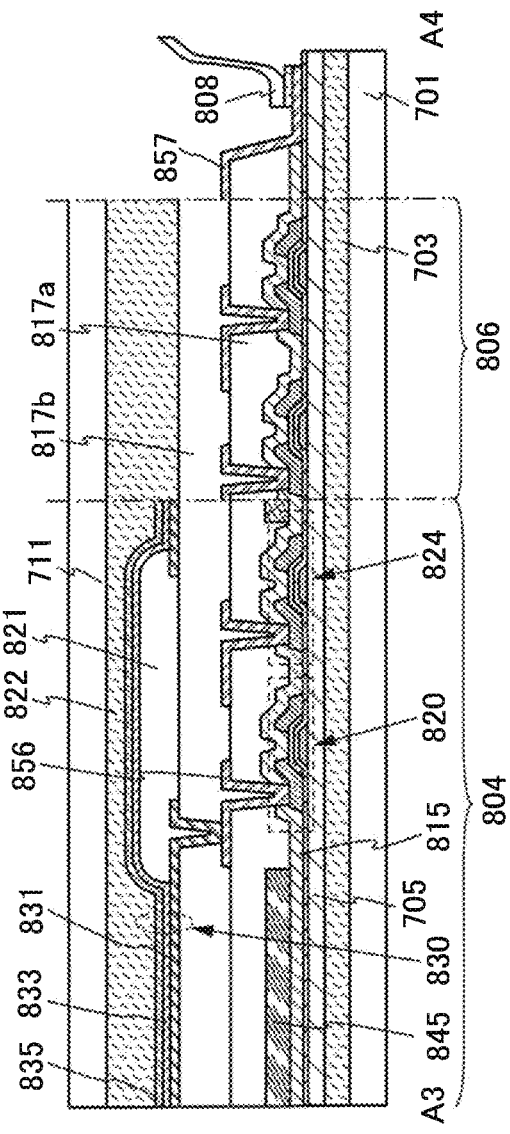
FIGS. 11A and 11B illustrate examples of a light-emitting panel.

FIG. 9B is a plan view of a light-emitting panel, and FIG. 11A is an example of a cross-sectional view taken along dashed-dotted line A3-A4 in FIG. 9B. The light-emitting panel described in Specific Example 4 is a bottom-emission light-emitting panel using a color filter method.

The light-emitting panel in FIG. 11A includes the substrate 701, the bonding layer 703, the insulating layer 705, a plurality of transistors, the conductive layer 857, the insulating layer 815, the coloring layer 845, the insulating layer 817a, the insulating layer 817b, the conductive layer 856, a plurality of light-emitting elements, the insulating layer 821, the bonding layer 822, and the substrate 711. The substrate 701, the bonding layer 703, the insulating layer 705, the insulating layer 815, the insulating layer 817a, and the insulating layer 817b transmit visible light.

The light-emitting portion 804 includes the transistor 820, a transistor 824, and the light-emitting element 830 over the substrate 701 with the bonding layer 703 and the insulating layer 705 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to a source electrode or a drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The driver circuit portion 806 includes a plurality of transistors over the substrate 701 with the bonding layer 703 and the insulating layer 705 provided therebetween. In FIG. 11A, two of the transistors included in the driver circuit portion 806 are illustrated.

The insulating layer 705 and the substrate 701 are attached to each other with the bonding layer 703. The insulating layer 705 is preferably highly resistant to moisture, in which case impurities such as water can be prevented from entering the light-emitting element 830, the transistor 820, or the transistor 824 leading to higher reliability of the light-emitting panel.

The conductive layer 857 is electrically connected to an external input terminal through which a signal or a potential from the outside is transmitted to the driver circuit portion 806. Here, an example is described in which an FPC 808 is provided as the external input terminal. Here, an example is described in which the conductive layer 857 is formed using the same material and the same step(s) as those of the conductive layer 856.

Specific Example 5

Figure 11B:
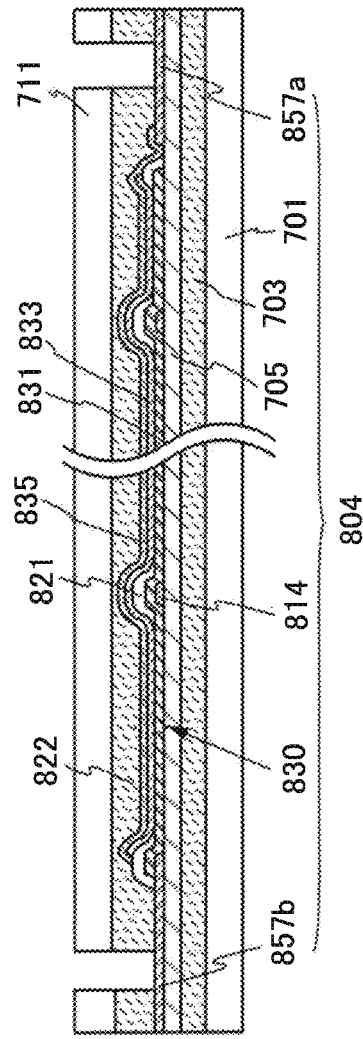

FIG. 11B illustrates an example of a light-emitting panel that is different from those in Specific Examples 1 to 4.

A light-emitting panel in FIG. 11B includes the substrate 701, the bonding layer 703, the insulating layer 705, a conductive layer 814, a conductive layer 857a, a conductive layer 857b, the light-emitting element 830, the insulating layer 821, the bonding layer 822, and the substrate 711.

The conductive layer 857a and the conductive layer 857b, which are external connection electrodes of the light-emitting panel, can each be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 is a bottom-emission, top-emission, or dual-emission light-emitting element. An electrode, a substrate, an insulating layer, and the like on the light extraction side transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be prevented. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, or aluminum; an alloy material containing any of these materials as its main component; or the like. The thickness of the conductive layer 814 can be, for example, greater than or equal to 0.1 µm and less than or equal to 3 µm, preferably greater than or equal to 0.1 µm and less than or equal to 0.5 µm.

<Examples of Materials>

Next, materials and the like that can be used for a light-emitting panel are described. Note that description on the components already described in this specification is omitted in some cases.

For each of the substrates, a material such as glass, quartz, an organic resin, a metal, or an alloy can be used. The substrate on the side from which light from the light-emitting element is extracted is formed using a material which transmits the light.

It is particularly preferable to use a flexible substrate. For example, an organic resin; a glass material, a metal, or an alloy that is thin enough to have flexibility; or the like can be used.

An organic resin, which has a specific gravity smaller than that of glass, is preferably used for the flexible substrate, in which case the light-emitting panel can be more lightweight compared with the case where glass is used.

The substrates are preferred to be formed using a material with high toughness. In that case, a light-emitting panel with high impact resistance that is less likely to be broken can be provided. For example, when an organic resin substrate, a thin metal substrate, or a thin alloy substrate is used, the light-emitting panel can be lighter and more robust than the case where a glass substrate is used.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, a metal alloy such as an aluminum alloy or stainless steel.

Furthermore, when a material with high thermal emissivity is used for the substrate, the surface temperature of the light-emitting panel can be prevented from rising, leading to prevention of breakage or a decrease in reliability of the light-emitting panel. For example, the substrate may have a stacked-layer structure of a metal substrate and a layer with high thermal emissivity (e.g., the layer can be formed using a metal oxide or a ceramic material).

Examples of materials having flexibility and a light-transmitting property include a material used for the protective substrate 132 described in Embodiment 1.

The flexible substrate may have a stacked-layer structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials.

The flexible substrate may be formed by stacking a plurality of layers. When a glass layer is used, a barrier property against water and oxygen can be improved and thus a reliable light-emitting panel can be provided.

A flexible substrate in which a glass layer, a bonding layer, and an organic resin layer are stacked from the side closer to a light-emitting element is preferably used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. The thickness of the organic resin layer is greater than or equal to 10 µm and less than or equal to 200 µm, preferably greater than or equal to 20 µm and less than or equal to 50 µm. Providing such organic resin layer outside the glass layer, occurrence of a crack or a break in the glass layer can be suppressed and mechanical strength can be improved. With the substrate that includes such a composite material of a glass material and an organic resin, a highly reliable and flexible light-emitting panel can be provided.

Any of a variety of curable adhesives, e.g., light curable adhesives such as a UV curable adhesive, a reactive curable adhesive, a thermal curable adhesive, and an anaerobic adhesive can be used for the adhesive layer. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the functional element, thereby improving the reliability of the light-emitting panel.

In addition, it is preferable to mix a filler with a high refractive index or light-scattering member into the resin, in which case the efficiency of light extraction from the light-emitting element can be improved. For example, titanium oxide, barium oxide, zeolite, zirconium, or the like can be used.

Insulating films with high resistance to moisture are preferably used for the insulating layer 705 and the insulating layer 715. Alternatively, the insulating layer 705 and the insulating layer 715 preferably have a function of preventing diffusion of impurities to a light-emitting element.

As an insulating film having an excellent moisture-proof property, a film containing nitrogen and silicon (e.g., a silicon nitride film, a silicon nitride oxide film, or the like), a film containing nitrogen and aluminum (e.g., an aluminum nitride film or the like), or the like can be used. Alternatively, a silicon oxide film, a silicon oxynitride film, an aluminum oxide film, or the like can be used.

For example, the moisture vapor transmission rate of the insulating film highly resistant to moisture is lower than or equal to $1\times10^{-5}$ [g/(m2·day)], preferably lower than or equal to $1\times10^{-6}$ [g/(m2·day)], further preferably lower than or equal to $1\times10^{-7}$ [g/(m2·day)], still further preferably lower than or equal to $1\times10^{-8}$ [g/(m2·day)].

In the light-emitting panel, it is necessary that at least one of the insulating layers 705 and 715 transmit light emitted from the light-emitting element. One of the insulating layers 705 and 715, which transmits light emitted from the light-emitting element, preferably has higher average transmittance of light having a wavelength of greater than or equal to 400 nm and less than or equal to 800 nm than the other.

The insulating layers 705 and 715 each preferably include oxygen, nitrogen, and silicon. The insulating layers 705 and 715 each preferably include, for example, silicon oxynitride. Moreover, the insulating layers 705 and 715 each preferably include silicon nitride or silicon nitride oxide. It is preferable that the insulating layers 705 and 715 be each formed using a silicon oxynitride film and a silicon nitride film, which are in contact with each other. The silicon oxynitride film and the silicon nitride film are alternately stacked so that anti-phase interference occurs more often in a visible region, whereby the stack can have higher transmittance of light in the visible region.

There is no particular limitation on the structure of the transistor in the light-emitting panel. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range in a visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the light-emitting device. Specifically, the use of an insulating film having high resistance to moisture for the insulating layer 705 and the insulating layer 715 allows the light-emitting element to be located between a pair of insulating films having high resistance to moisture, by which decrease in reliability of the light-emitting device can be prevented.

As the insulating layer 815, for example, an inorganic insulating film such as a silicon oxide film, a silicon oxynitride film, or an aluminum oxide film can be used. For example, as the insulating layer 817, the insulating layer 817a, and the insulating layer 817b, an organic material such as polyimide, acrylic, polyamide, polyimide amide, or a benzocyclobutene-based resin can be used. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed to have an opening over the lower electrode 831 and an inclined side wall with curvature, using a photosensitive resin material.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a resin such as a transparent resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

As described above, a variety of panels such as a light-emitting panel, a display panel, and a touch panel can be used in the display device of one embodiment of the present invention.

Note that the light-emitting panel of one embodiment of the present invention may be used as a display device or as a lighting panel. For example, it may be used as a light source such as a backlight or a front light, that is, a lighting device for a display panel.

As described above, with a light-emitting panel including a region transmitting visible light described in this embodiment, a large display device in which a seam between light-emitting panels is hardly recognized and display unevenness is suppressed can be obtained.

This embodiment can be combined with any other embodiment as appropriate.

Embodiment 3

In this embodiment, a flexible display panel that can be used for the display device of one embodiment of the present invention is described with reference to drawings. Note that the above description can be referred to for the components of a touch panel, which are similar to those of the light-emitting panel described in Embodiment 2. Although a touch panel including a light-emitting element is described in this embodiment as an example, one embodiment of the present invention is not limited to this example.

Structure Example 1

Figure 12A:
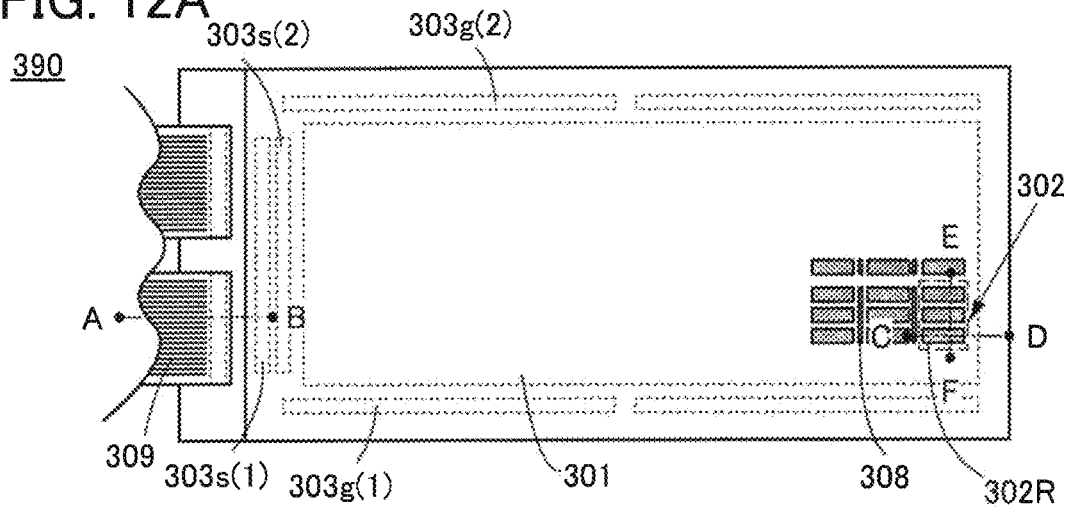
FIGS. 12A to 12C illustrate an example of a touch panel.
Figure 12B:
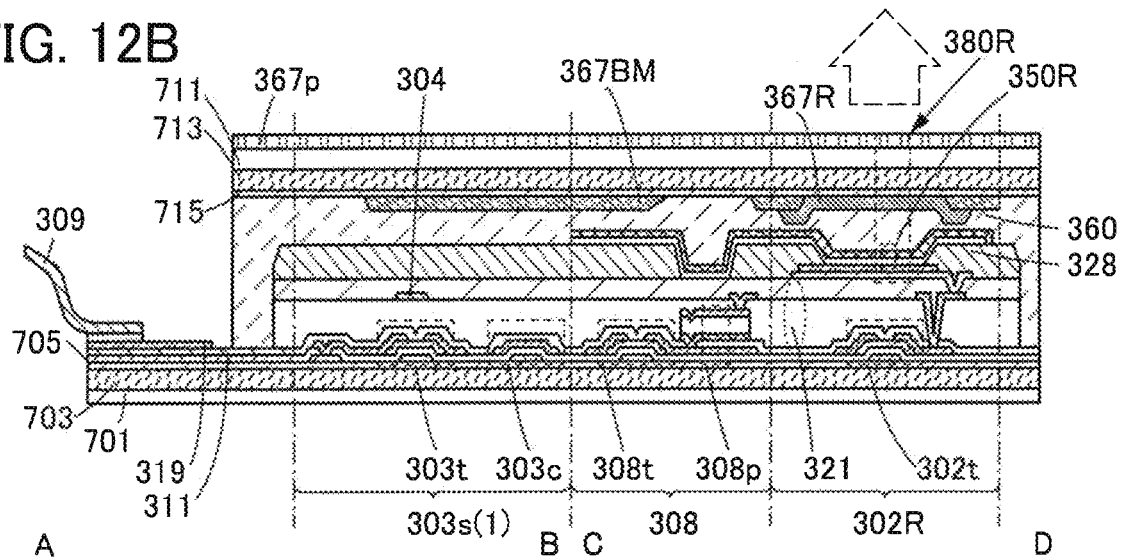
Figure 12C:
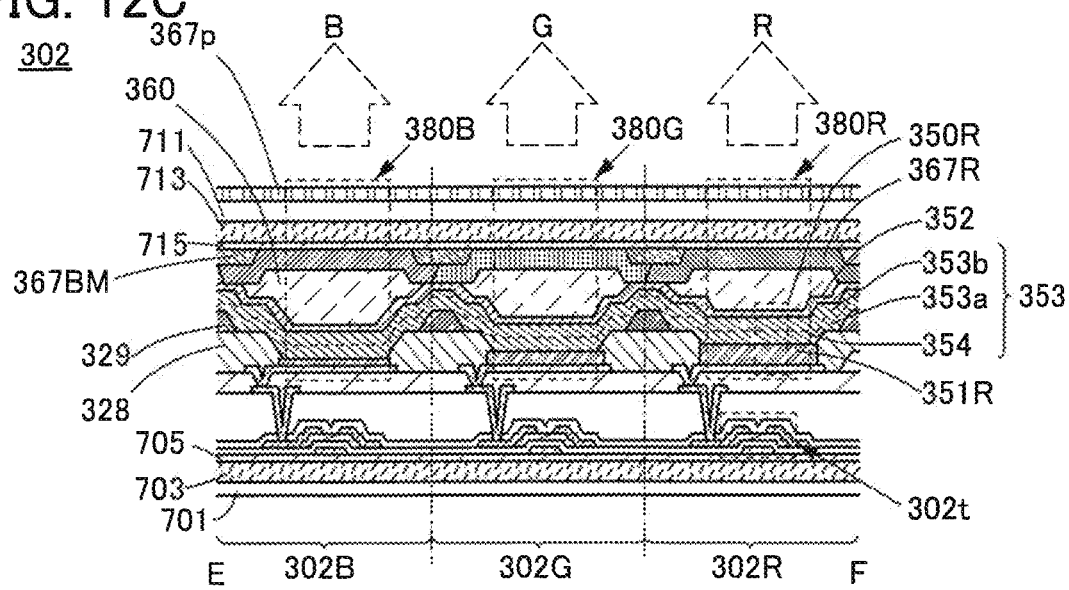

FIG. 12A is a top view of the touch panel. FIG. 12B is a cross-sectional view taken along dashed-dotted line A-B and dashed-dotted line C-D in FIG. 12A. FIG. 12C is a cross-sectional view taken along dashed-dotted line E-F in FIG. 12A.

A touch panel 390 illustrated in FIG. 12A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 12B and 12C, the touch panel 390 includes the substrate 701, the bonding layer 703, the insulating layer 705, the substrate 711, the bonding layer 713, and the insulating layer 715. The substrates 701 and 711 are bonded to each other with a bonding layer 360.

The substrate 701 and the insulating layer 705 are attached to each other with the bonding layer 703. The substrate 711 and the insulating layer 715 are attached to each other with the bonding layer 713.

Embodiment 2 can be referred to for materials used for the substrates, the bonding layers, and the insulating layers.

Each of the pixels 302 includes the sub-pixel 302R, a sub-pixel 302G, and a sub-pixel 302B (FIG. 12C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t that can supply electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 12C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes a bonding layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the bonding layer 360 and through the coloring layer 367R and is emitted to the outside of the light-emitting module 380R as indicated by an arrow in FIG. 12C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for planarizing unevenness caused by the pixel circuits and the imaging pixel circuits. An insulating layer that can inhibit diffusion of impurities to the transistor 302t and the like can be used as the insulating layer 321.

The touch panel 390 includes a partition 328 that overlaps with an end portion of the lower electrode 351R. A spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 12B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal is supplied. The wiring 311 is provided with a terminal 319. An FPC 309 through which a signal such as an image signal or a synchronization signal is supplied is electrically connected to the terminal 319. A printed wiring board (PWB) may be attached to the FPC 309.

Note that transistors such as the transistors 302t, 303t, and 308t can be formed in the same process. Alternatively, the transistors may be formed in different processes.

Structure Example 2

Figure 13A:
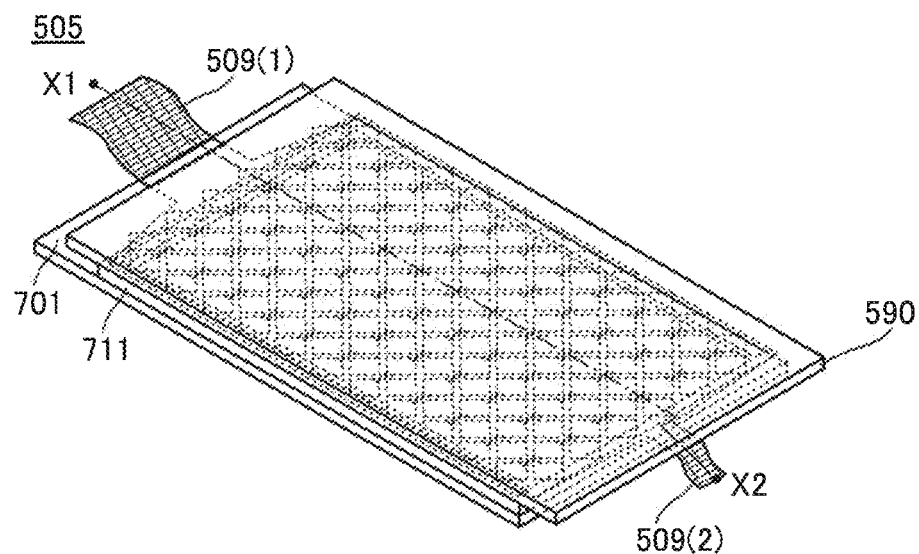
FIGS. 13A and 13B illustrate an example of a touch panel.
Figure 13B:
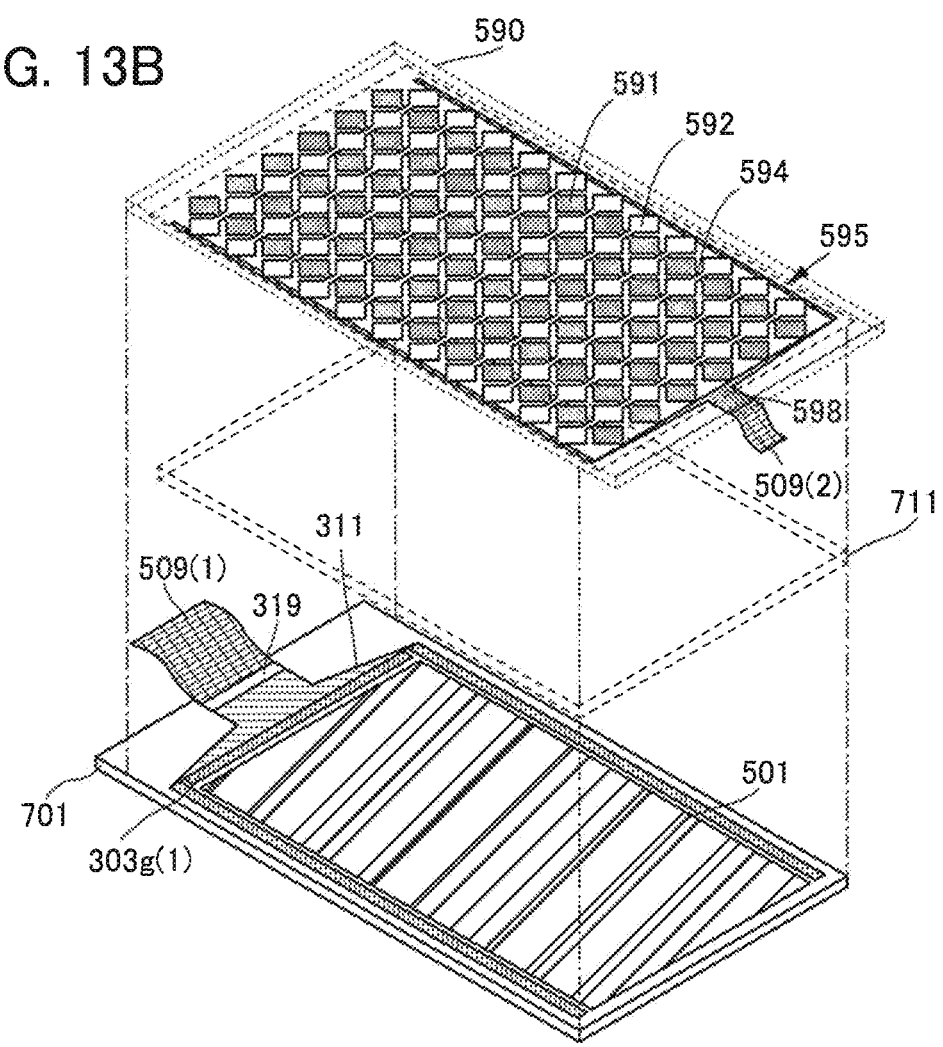
Figure 14A:
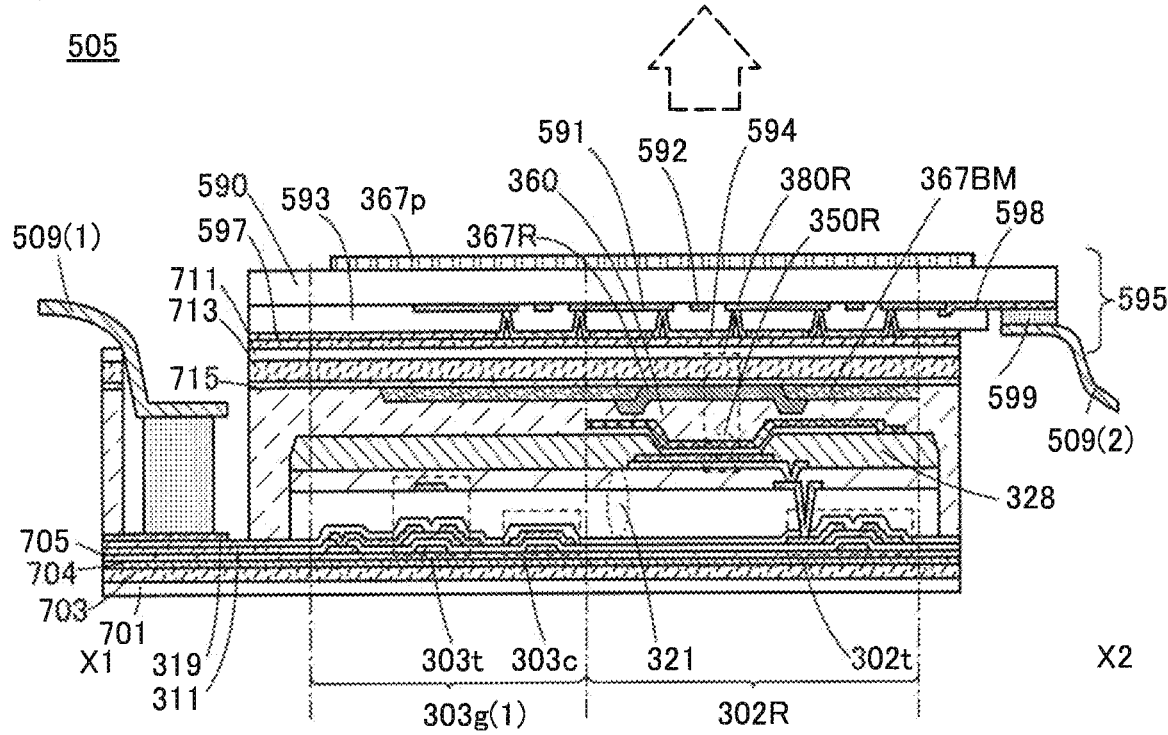
FIGS. 14A to 14C illustrate examples of a touch panel.
Figure 14B:
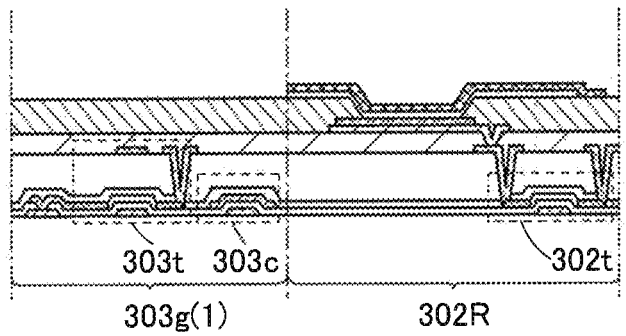
Figure 14C:
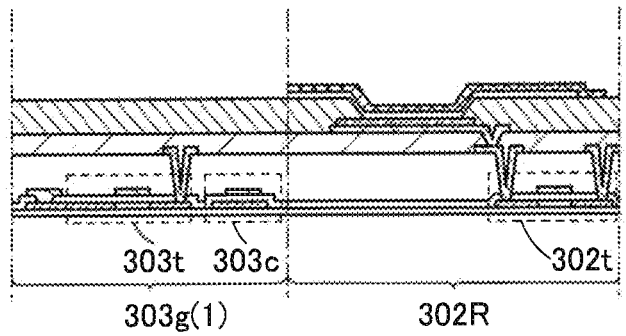

FIGS. 13A and 13B are perspective views of a touch panel 505. FIGS. 13A and 13B illustrate only main components for simplicity. FIGS. 14A to 14C are each a cross-sectional view taken along the dashed-dotted line X1-X2 in FIG. 13A.

As illustrated in FIGS. 13A and 13B, the touch panel 505 includes a display portion 501, the scan line driver circuit 303g(1), a touch sensor 595, and the like. Furthermore, the touch panel 505 includes the substrate 701, the substrate 711, and a substrate 590.

The touch panel 505 includes a plurality of pixels and a plurality of wirings 311. The plurality of wirings 311 can supply signals to the pixels. The plurality of wirings 311 are arranged to a peripheral portion of the substrate 701, and part of the plurality of wirings 311 form the terminal 319. The terminal 319 is electrically connected to an FPC 509(1).

The touch panel 505 includes the touch sensor 595 and a plurality of wirings 598. The plurality of wirings 598 are electrically connected to the touch sensor 595. The plurality of wirings 598 are arranged to a peripheral portion of the substrate 590, and part of the plurality of wirings 598 form a terminal. The terminal is electrically connected to an FPC 509(2). Note that in FIG. 13B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 13A and 13B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

The wiring 594 intersects with the electrode 592. A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

As illustrated in FIG. 14A, the touch panel 505 includes the substrate 701, the bonding layer 703, the insulating layer 705, the substrate 711, the bonding layer 713, and the insulating layer 715. The substrates 701 and 711 are bonded to each other with a bonding layer 360.

A bonding layer 597 attaches the substrate 590 to the substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. A film including graphene may be used as well. The film including graphene can be formed, for example, by reducing a film including graphene oxide. As a reducing method, heating or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, ZnO, silver, copper, aluminum, a carbon nanotube, and graphene. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and 592 can be favorably used as the wiring 594 because electric resistance can be reduced.

Note that an insulating layer that covers the insulating layer 593 and the wiring 594 may be provided to protect the touch sensor 595.

Furthermore, a connection layer 599 electrically connects the wiring 598 to the FPC 509(2).

The display portion 501 includes a plurality of pixels arranged in a matrix. Each pixel has the same structure as Structure Example 1; thus, description is omitted.

Any of various kinds of transistors can be used in the touch panel. A structure in the case of using bottom-gate transistors is illustrated in FIGS. 14A and 14B.

For example, a semiconductor layer containing an oxide semiconductor, amorphous silicon, or the like can be used in the transistor 302$t$ and the transistor 303$t$ illustrated in FIG. 14A.

For example, a semiconductor layer containing polycrystalline silicon that is obtained by crystallization process such as laser annealing can be used in the transistor 302$t$ and the transistor 303$t$ illustrated in FIG. 14B.

A structure in the case of using top-gate transistors is illustrated in FIG. 14C.

For example, a semiconductor layer containing polycrystalline silicon, a single crystal silicon film that is transferred from a single crystal silicon substrate, or the like can be used in the transistor 302$t$ and the transistor 303$t$ illustrated in FIG. 14C.

Structure Example 3

Figure 15A:
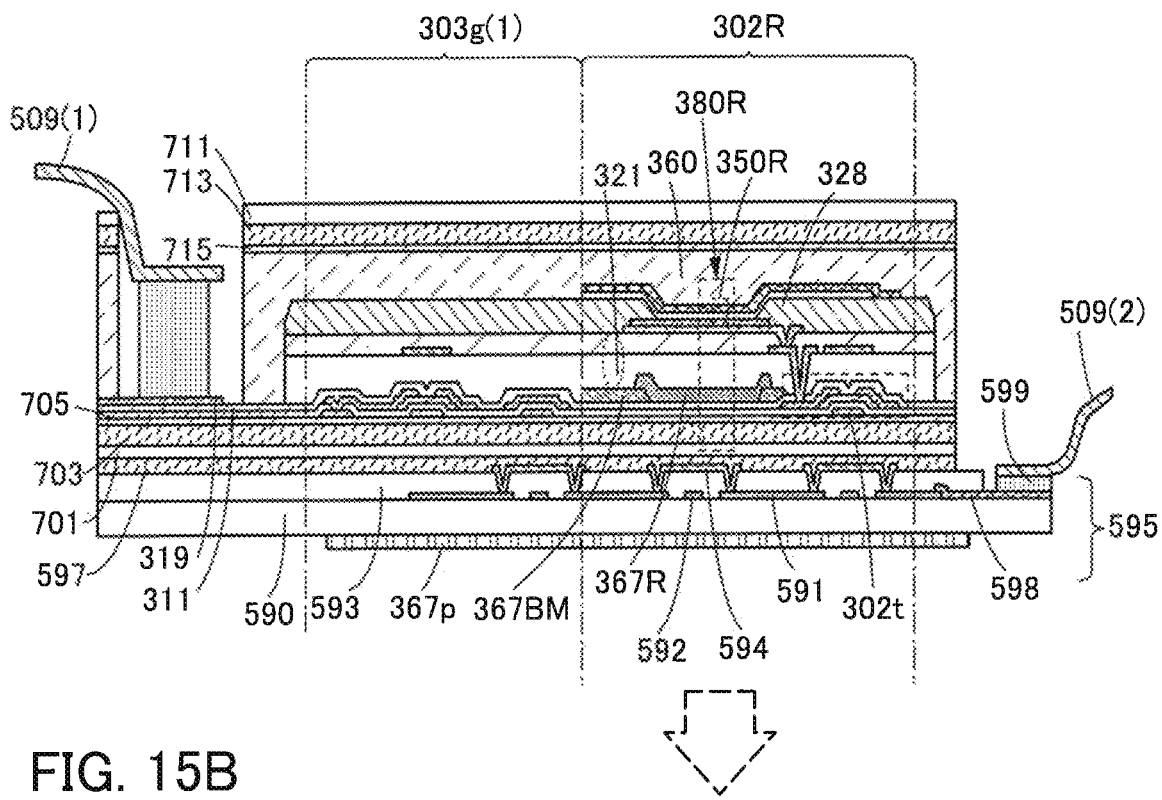
FIGS. 15A to 15C illustrate examples of a touch panel.
Figure 15B:
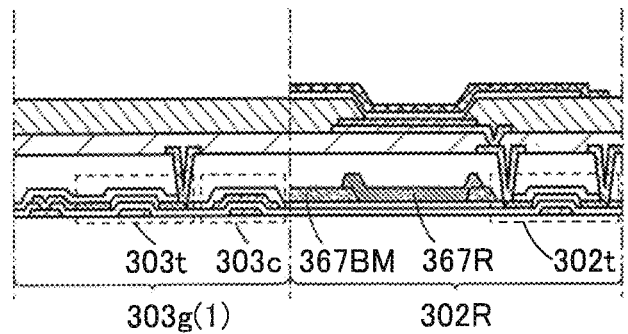
Figure 15C:
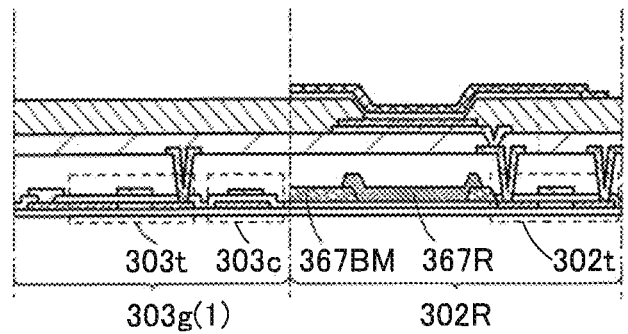

FIGS. 15A to 15C are cross-sectional views of a touch panel 505B. The touch panel 505B described in this embodiment is different from the input-output device 505 in Structure Example 2 in that received image data is displayed on the side where the transistors are provided and that the touch sensor is provided on the substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 15A emits light to the side where the transistor 302$t$ is provided. Accordingly, part of light emitted from the light-emitting element 350R passes through the coloring layer 367R and is emitted to the outside of the light-emitting module 380R as indicated by an arrow in FIG. 15A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 15A).

The bonding layer 597 attaches the substrate 590 to the substrate 701 so that the touch sensor 595 overlaps with the display portion. The bonding layer 597 has a light-transmitting property.

Note that a structure in the case of using bottom-gate transistors in the display portion 501 is illustrated in FIGS. 15A and 15B.

For example, a semiconductor layer containing an oxide semiconductor, amorphous silicon, or the like can be used in the transistor 302$t$ and the transistor 303$t$ illustrated in FIG. 15A.

For example, a semiconductor layer containing polycrystalline silicon can be used in the transistor 302$t$ and the transistor 303$t$ illustrated in FIG. 15B.

A structure in the case of using top-gate transistors is illustrated in FIG. 15C.

For example, a semiconductor layer containing polycrystalline silicon, a transferred single crystal silicon film, or the like can be used in the transistor 302t and the transistor 303t illustrated in FIG. 15C.

Structure Example 4

Figure 16:
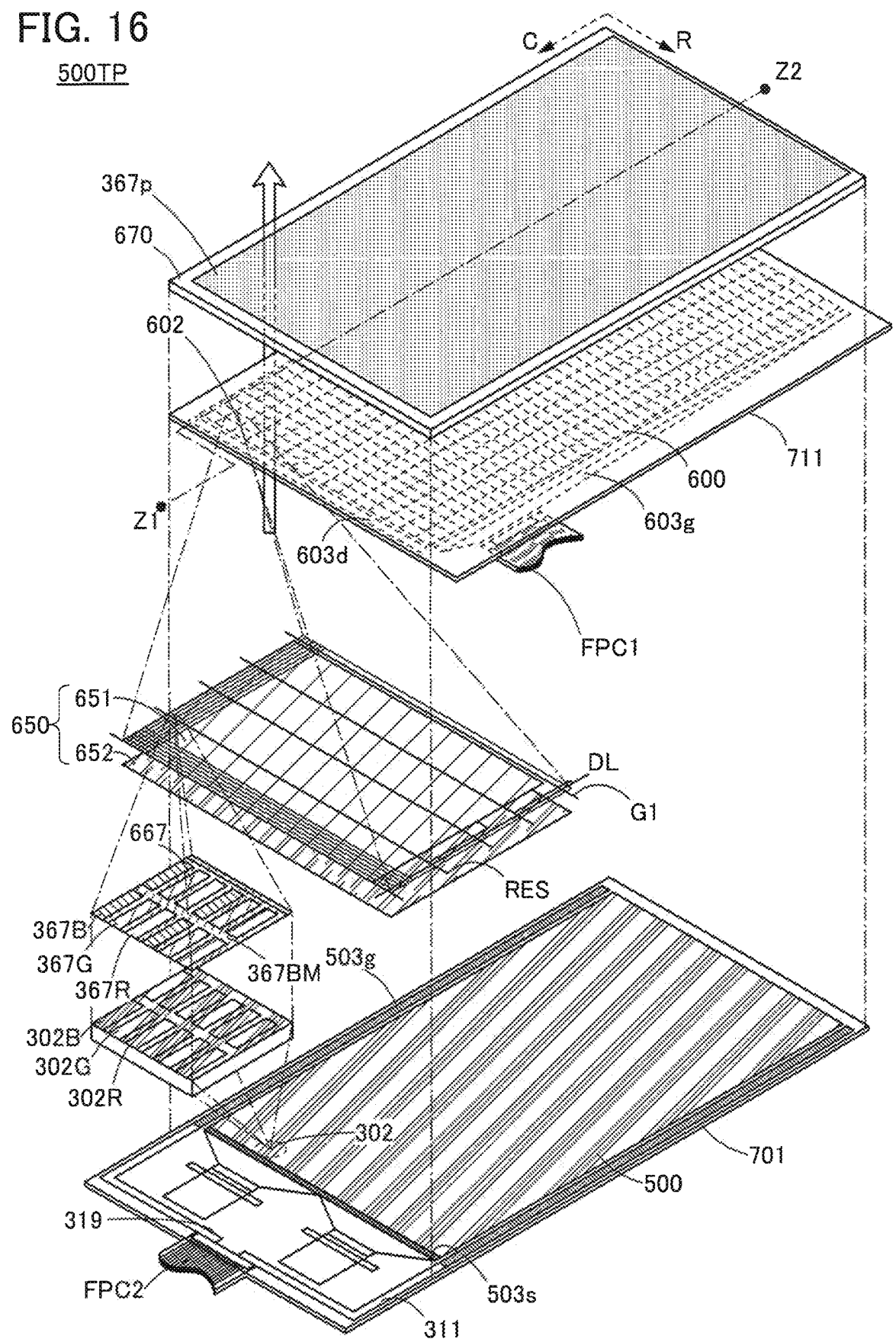
FIG. 16 illustrates an example of a touch panel.
Figure 17:
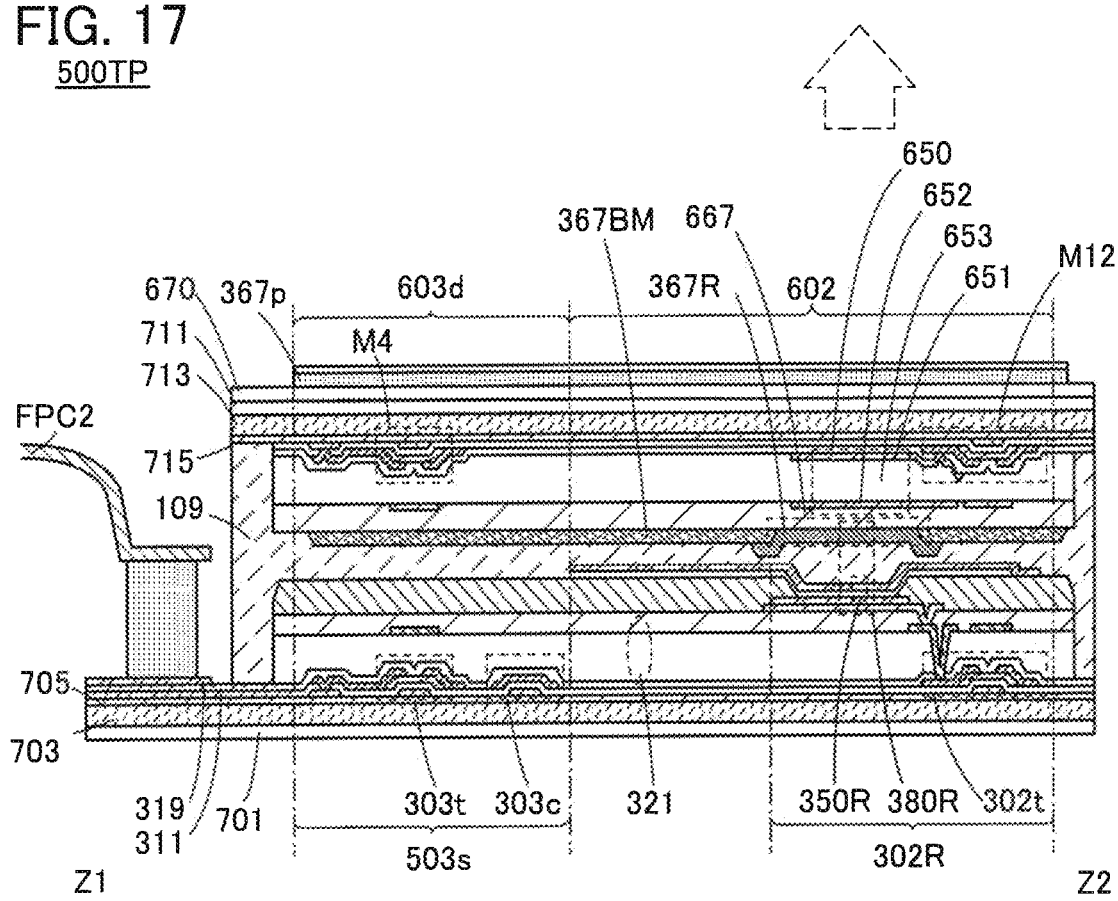
FIG. 17 illustrates an example of a touch panel.

As illustrated in FIG. 16, the touch panel 500TP includes a display portion 500 and an input portion 600 that overlap each other. FIG. 17 is a cross-sectional view taken along the dashed-dotted line Z1-Z2 in FIG. 16.

Components of the touch panel 500TP are described below. Note that these units can not be clearly distinguished and one unit also serves as another unit or include part of another unit in some cases. Note that the touch panel 500TP in which the input portion 600 overlaps with the display portion 500 is also referred to as a touch panel.

The input portion 600 includes a plurality of sensing units 602 arranged in a matrix. The input portion 600 also includes a selection signal line G1, a control line RES, a signal line DL, and the like.

The selection signal line G1 and the control line RES are electrically connected to the plurality of sensing units 602 that are arranged in the row direction (indicated by the arrow R in FIG. 16). The signal line DL is electrically connected to the plurality of sensing units 602 that are arranged in the column direction (indicated by the arrow C in FIG. 16).

The sensing unit 602 senses an object that is close thereto or in contact therewith and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object close thereto or an object in contact therewith.

Note that when an object having a dielectric constant higher than that of air, such as a finger, comes close to a conductive film in air, the capacitance between the finger and the conductive film changes. The sensing unit 602 can sense the capacitance change and supply sensing data.

For example, distribution of charge occurs between the conductive film and the capacitor owing to the change in the electrostatic capacitance, so that the voltage across the capacitor is changed. This voltage change can be used as the sensing signal.

The sensing unit 602 is provided with a sensor circuit. The sensor circuit is electrically connected to the selection signal line G1, the control line RES, the signal line DL, or the like.

The sensor circuit includes a transistor, a sensor element, and/or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 653, and a first electrode 651 and a second electrode 652 between which the insulating layer 653 is provided can be used for the sensor circuit (see FIG. 17A). Specifically, the voltage between the electrodes of the capacitor 650 changes when an object approaches the conductive film which is electrically connected to one electrode of the capacitor 650.

The sensing unit 602 includes a switch that can be turned on or off in accordance with a control signal. For example, a transistor M12 can be used as the switch.

A transistor which amplifies a sensing signal can be used in the sensing unit 602.

Transistors manufactured through the same process can be used as the transistor that amplifies a sensing signal and the switch. This allows the input portion 600 to be provided through a simplified process.

The sensing unit includes a plurality of window portions 667 arranged in a matrix. The window portions 667 transmit visible light. A light-blocking layer BM may be provided between the window portions 667.

The touch panel 500TP is provided in a position overlapping with the window portion 667 in the touch panel 500TP. The coloring layer transmits light of a predetermined color. Note that the coloring layer can be referred to as a color filter. For example, a coloring layer 367B transmitting blue light, a coloring layer 367G transmitting green light, and a coloring layer 367R transmitting red light can be used. Alternatively, a coloring layer transmitting yellow light or white light may be used.

The display portion 500 includes the plurality of pixels 302 arranged in a matrix. The pixel 302 is positioned so as to overlap with the window portions 667 of the input portion 600. The pixels 302 may be arranged at higher resolution than the sensing units 602. Each pixel has the same structure as Structure Example 1; thus, description is omitted.

The touch panel 500TP includes the input portion 600 that includes the plurality of sensing units 602 arranged in a matrix and the window portions 667 transmitting visible light, the display portion 500 that includes the plurality of pixels 302 overlapping with the window portions 667, and the coloring layers between the window portions 667 and the pixels 302. Each of the sensing units includes a switch that can reduce interference in another sensing unit.

Thus, sensing data obtained by each sensor unit can be supplied together with the positional information of the sensor unit. In addition, sensing data can be supplied in relation to the positional data of the pixel for displaying an image. In addition, the sensor unit which does not supply the sensing data is not electrically connected to a signal line, whereby interference with the sensor unit which supplies a sensing signal can be reduced. Consequently, the input-output device 500TP that is highly convenient or highly reliable can be provided.

For example, the input portion 600 of the touch panel 500TP can sense sensing data and supply the sensing data together with the positional data. Specifically, a user of the touch panel 500TP can make a variety of gestures (e.g., tap, drag, swipe, and pinch-in operation) using, as a pointer, his/her finger or the like on the input portion 600.

The input portion 600 can sense a finger or the like that comes close to or is in contact with the input portion 600 and supply sensing data including a sensed position, path, or the like.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger or the like and make the arithmetic unit execute an instruction associated with the predetermined gesture.

For example, first, the input portion 600 of the input-output device 500TP selects one sensing unit X from the plurality of sensing units that can supply sensing data to one signal line. Then, electrical continuity between the signal line and the sensing units other than the sensing unit X is not established. This can reduce interference of the other sensing units in the sensing unit X.

Specifically, interference of sensing elements of the other sensing units in a sensing element of the sensing unit X can be reduced.

For example, in the case where a capacitor and a conductive film to which one electrode of the capacitor is electrically connected are used for the sensing element, interference of the potentials of the conductive films of the other sensing units in the potential of the conductive film of the sensing unit X can be reduced.

Thus, the touch panel 500TP can drive the sensing unit and supply sensing data independently of its size. The touch panel 500TP can have a variety of sizes, for example, ranging from a size for a hand-held device to a size for an electronic blackboard.

The touch panel 500TP can be folded and unfolded. Even in the case where interference of the other sensing units in the sensing unit X is different between the folded state and the unfolded state, the sensing unit can be driven and sensing data can be supplied without dependence on the state of the touch panel 500TP.

The display portion 500 of the touch panel 500TP can be supplied with display data. For example, an arithmetic unit can supply the display data.

In addition to the above structure, the touch panel 500TP can have the following structure.

The touch panel 500TP may include a driver circuit 603*g* or a driver circuit 603*d*. In addition, the touch panel 500TP may be electrically connected to an FPC1.

The driver circuit 603*g* can supply selection signals at predetermined timings, for example. Specifically, the driver circuit 603*g* supplies selection signals to the selection signal lines G1 row by row in a predetermined order. Any of a variety of circuits can be used as the driver circuit 603*g*. For example, a shift register, a flip flop circuit, a combination circuit, or the like can be used.

The driver circuit 603*d* supplies sensing data on the basis of a sensing signal supplied from the sensing unit 602. Any of a variety of circuits can be used as the driver circuit 603*d*. For example, a circuit that can form a source follower circuit or a current mirror circuit by being electrically connected to the sensing circuit in the sensing unit can be used as the driver circuit 603*d*. In addition, an analog-to-digital converter circuit that converts a sensing signal into a digital signal may be provided in the driver circuit 603*d*.

The FPC1 supplies a timing signal, a power supply potential, or the like and is supplied with a sensing signal.

The touch panel 500TP may include a driver circuit 503*g*, a driver circuit 503*s*, a wiring 311, and a terminal 319. In addition, the touch panel 500TP (or driver circuit) may be electrically connected to an FPC2.

In addition, a protective layer 670 that prevents damage and protects the input-output device 500TP may be provided. For example, a ceramic coat layer or a hard coat layer can be used as the protective layer 670. Specifically, a layer containing aluminum oxide or a UV curable resin can be used.

This embodiment can be combined with any other embodiment as appropriate.

Embodiment 4

In this embodiment, electronic devices and lighting devices of one embodiment of the present invention will be described with reference to drawings.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

In the display device of one embodiment of the present invention, by increasing the number of display panels, the area of the display region can be increased unlimitedly. Thus, the display device can be favorably used for applications such as digital signage and a PID. Furthermore, by changing the arrangement of the display panels, the contour of the display device of one embodiment of the present invention can have any of a variety of shapes.

Figure 18A:
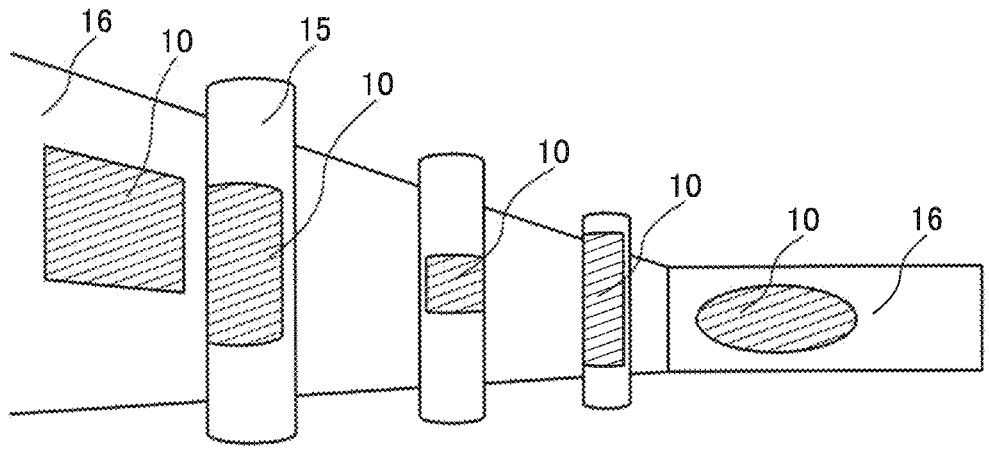
FIGS. 18A to 18F illustrate examples of an electronic device and a lighting device.

FIG. 18A shows an example in which the display device 10 of one embodiment of the present invention is provided for a column 15 and a wall 16. A flexible display panel is used as the display panel 100 included in the display device 10, whereby the display device 10 can be placed along a curved surface.

Here, in particular, in the case where the display device of one embodiment of the present invention is used in digital signage and a PID, it is preferable to use a touch panel in a display panel because a device with such a structure can be operated by viewers intuitively as well as displaying a still or moving image on a display region. Alternatively, in the case where the display device of one embodiment of the present invention is used for providing information such as route information and traffic information, usability can be enhanced by intuitive operation. In the case of providing the display device on the walls of buildings, public facilities, and the like, a touch panel is not necessarily used in the display panel.

FIGS. 18B to 18E illustrate an example of an electronic device including the display portion 7000 with a curved surface. The display surface of the display portion 7000 is bent, and images can be displayed on the bent display surface. The display portion 7000 may be flexible.

The display portion 7000 of each of the electronic devices illustrated in FIGS. 18B to 18E can be formed using the display device of one embodiment of the present invention.

Figure 18B:
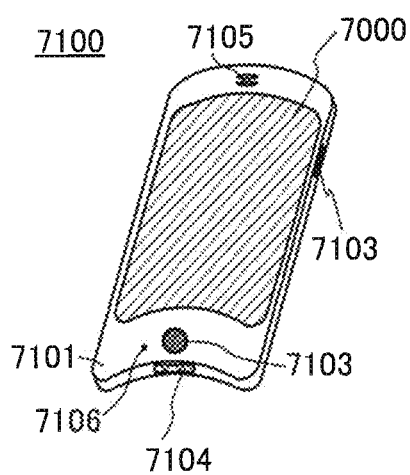

FIG. 18B illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 18B includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

Figure 18C:
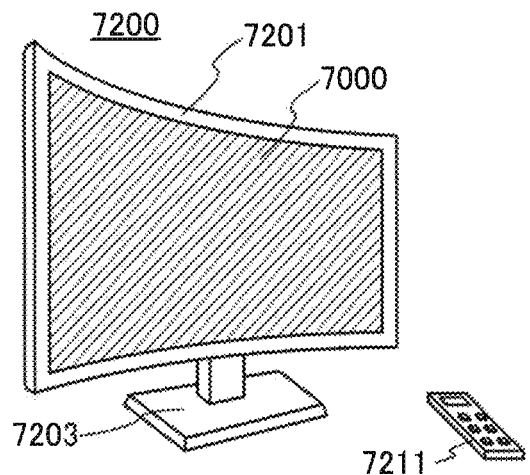

FIG. 18C illustrates an example of a television set. In a television set 7200, the display portion 7000 is incorporated into the housing 7201. Here, the housing 7201 is supported by a stand 7203.

The television set 7200 illustrated in FIG. 18C can be operated with an operation switch of the housing 7201 or a separate remote controller 7211. Furthermore, the display portion 7000 may include a touch sensor. The display portion 7000 can be performed by touching the display portion with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, and the like. A general television broadcast can be received with the receiver. Further, when the television set is connected to a communication network with or without wires via the modem, one-way (from a transmitter to a receiver) or two-way (between a transmitter and a receiver or between receivers) data communication can be performed.

Figure 18D:
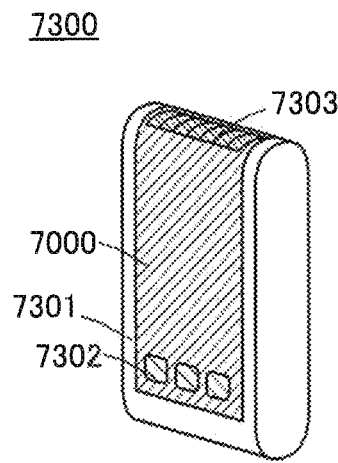

FIG. 18D illustrates an example of a portable information terminal. A portable information terminal 7300 includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal 7300 can be performed by touching the display portion 7000 with a finger, a stylus, or the like.

Figure 18E:
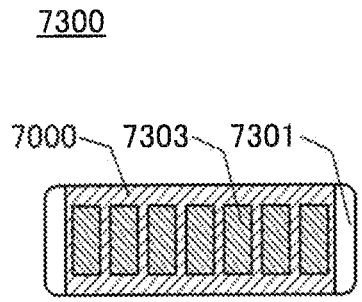

FIG. 18D is a perspective view of the portable information terminal 7300. FIG. 18E is a top view of the portable information terminal 7300.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminal 7300 can display characters and image information on its plurality of surfaces. For example, as illustrated in FIG. 18D, three operation buttons 7302 can be displayed on one surface, and information 7303 indicated by a rectangle can be displayed on another surface. FIGS. 18D and 18E illustrate an example in which information is displayed at the top of the portable information terminal. Alternatively, information may be displayed on the side of the portable information terminal. Information may also be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

Figure 18F:
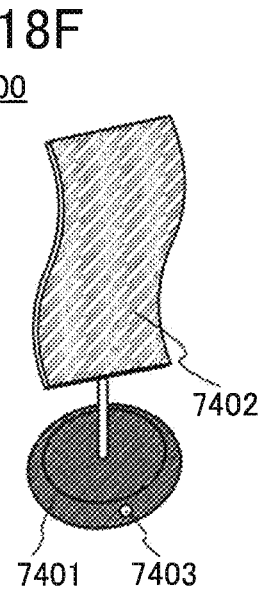

FIG. 18F illustrates an example of a lighting device having a curved light-emitting portion.

The light-emitting portion included in the lighting devices illustrated in FIG. 18F can be manufactured using the display device of one embodiment of the present invention.

A lighting device 7400 illustrated in FIG. 18F includes a light-emitting portion 7402 having a wave-shaped light-emitting surface, which is a good-design lighting device.

The light-emitting portion included in the lighting device 7400 may be flexible. The light-emitting portion may be fixed on a plastic member, a movable frame, or the like so that an emission surface of the light-emitting portion can be bent freely depending on the intended use.

The lighting device 7400 includes a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 19A1, 19A2, 19B, 19C, 19D, 19E, 19F, 19G, 19H, and 19I each illustrate an example of a portable information terminal including a display portion 7001 having flexibility.

The display portion 7001 is manufactured using the display device of one embodiment of the present invention. For example, a display device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 19A1 and 19A2 are a perspective view and a cross-sectional view, respectively, illustrating an example of the portable information terminal. A portable information terminal 7500 includes a housing 7501, the display portion 7001, a display portion pull 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001.

The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 19A1, 19A2, and 19B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 19B illustrates the portable information terminal 7500 in a state where the display portion 7001 is pulled out. Videos can be displayed on the display portion 7001 in this state. In addition, the portable information terminal 7500 may perform different displays in the state where part of the display portion 7001 is rolled as shown in FIG. 19A1 and in the state where the display portion 7001 is pulled out with the display portion pull 7502 as shown in FIG. 19B. For example, in the state shown in FIG. 19A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 19C to 19E illustrate an example of a foldable portable information terminal. FIG. 19C illustrates a portable information terminal 7600 that is opened. FIG. 19D illustrates the portable information terminal 7600 that is being opened or being folded. FIG. 19E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 19F and 19G illustrate an example of a foldable portable information terminal. FIG. 19F illustrates a portable information terminal 7650 that is folded so that the display portion 7001 is on the inside. FIG. 19G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 19H illustrates an example of a flexible portable information terminal. The portable information terminal 7700 includes a housing 7701 and the display portion 7001. In addition, the portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 19I illustrates an example of a wrist-watch-type portable information terminal. The portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation button 7803, a variety of functions such as time setting, ON/OFF of the power, ON/OFF of wireless communication, setting and cancellation of manner mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

This embodiment can be combined with any other embodiment as appropriate.

Example 1

In this example, the results of manufacturing the display device of one embodiment of the present invention are described. The method for manufacturing the display device used in this example is similar to that for manufacturing a Japanese traditional roof with tiles (kawara in Japanese). Thus, a multidisplay manufactured by overlapping a plurality of display panels as in the display device manufactured in this example is referred to as a "kawara-type multidisplay" in some cases.

Figure 21A:
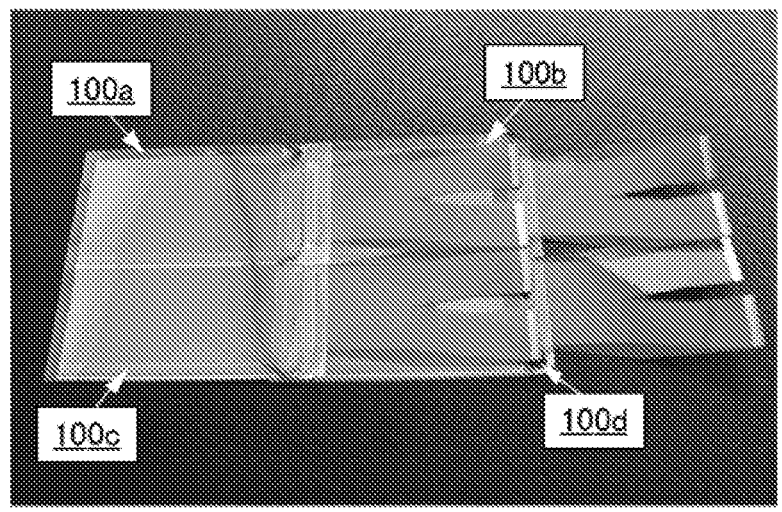
FIGS. 21A and 21B are photographs of a display device in Example 1.
Figure 21B:
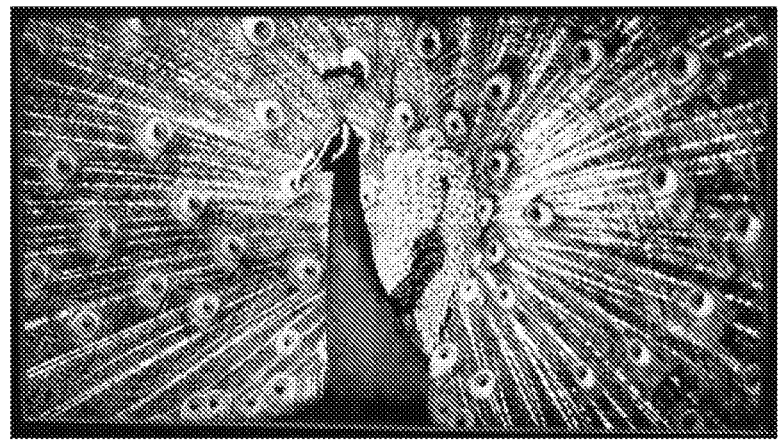

FIGS. 21A and 21B illustrate a display device manufactured in this example. FIG. 21A is a photograph of the opposite side to the display surface of the display device. FIG. 21B is a photograph of the display surface side of the display device displaying an image.

The display device illustrated in FIGS. 21A and 21B includes four display panels arranged in a matrix of two rows and two columns. Specifically, the display device includes the display panels 100a, 100b, 100c, and 100d.

Figure 22A:
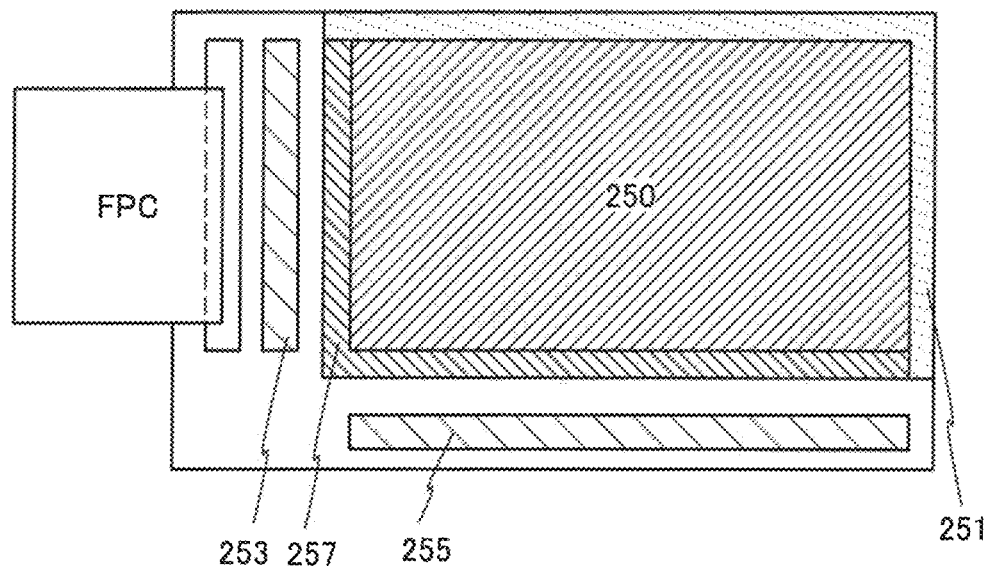
FIG. 22A illustrates a display panel in Example 1.

FIG. 22A is a schematic view of the display panel. A light-emitting portion 250 in the display panel has a size of 3.4 inches diagonal, 960×540×RGB effective pixels, a resolution of 326 ppi, and an aperture ratio of 44.4%. The display panel includes a demultiplexer (DeMUX) 253 serving as a source driver. In addition, the display panel also includes a scan driver 255. The display panel is an active matrix organic EL display, and a pixel circuit includes three transistors and a capacitor. Two sides of the light-emitting portion 250 are in contact with a region 251 transmitting visible light. A lead wiring 257 is provided along the other two sides.

Figure 21C:
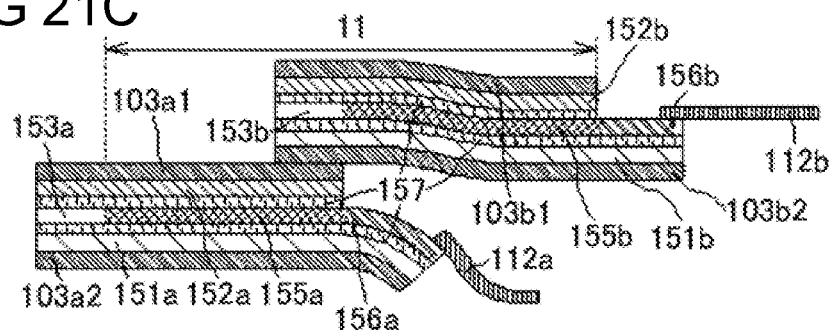
FIG. 21C illustrates a display device in Example 1.

FIG. 21C is a cross-sectional schematic view of the display panels 100a and 100b attached to each other in the display device.

The display device illustrated in FIGS. 21A to 21C is different from the display device illustrated in FIG. 4F in that a bonding layer 157 is included and a light-transmitting layer is provided on the display surface side of the display panel.

Each of the display panels has light-transmitting layers on both the display surface and a surface opposite to the display surface. For example, as illustrated in FIG. 21C, the display panel 100a has a light-transmitting layer 103a1 on the display surface side and a light-transmitting layer 103a2 on the surface opposite to the display surface. The display panel 100b has a light-transmitting layer 103b1 on the display surface side and a light-transmitting layer 103b2 on the surface opposite to the display surface. In this example, an attachment film having a stack of an attachment layer and a base material was used as each of the light-transmitting layers.

Each of the display panels was formed by attaching a substrate and an element layer with a bonding layer. For example, as illustrated in FIG. 21C, the substrate 151a, the substrate 152a, the substrate 151b, and the substrate 152b are attached to the element layer 153a, the element layer 153a, the element layer 153b, and the element layer 153b respectively, with the bonding layer 157.

The display device in this example is formed by overlapping four display panels so that a non-display region between display regions is made small. Specifically, the region transmitting visible light of one display panel overlaps the display region of another display panel with the light-transmitting layer provided therebetween. Accordingly, a large display device in which a seam between the display panels is hardly recognized by a user can be obtained (see FIG. 21B).

Because the display panel has attachment layers on both the display surface and the surface opposite to the display surface, both sides of the display device can be attached to or fixed to a flat surface. For example, the surface opposite to the display surface of the display device can be attached to a wall. In addition, the display surface of the display device can be attached to a transparent plate such as a glass substrate. The attachment layer can prevent the display surface of the display device from being damaged and the display device from being bent, whereby display visibility can be improved.

The four display panels have flexibility. Thus, as illustrate in FIGS. 21A and 21C, a region near the FPC 112a of the display panel 100a can be bent so that part of the display panel 100a and part of the FPC 112a can be placed under the display region of the display panel 100b adjacent to the FPC 112a. As a result, the FPC 112a can be placed without physical interference with the rear surface of the display panel 100b.

Since the attachment film having a stack of an attachment layer and a base material is used, each of the display panels can be detachably attached to another display panel included in the display device.

The structure of the display panels 100a to 100d illustrated in FIG. 21A corresponds to that of the light-emitting panel illustrated in FIGS. 10A and 10B except the following points. First, each of the display panels 100a to 100d does not include the insulating layer 817b and the conductive layer 856, and the source electrode or the drain electrode of the transistor 820 and the lower electrode 831 of the light-emitting element 830 are directly connected to each other. Second, each of the display panels 100a to 100d does not include the light-blocking layer 847. For the structure of the light-emitting element 830 of each of the display panels 100a to 100d, FIG. 10B can be referred to.

In this example, as the light-emitting element, a tandem (stack) organic EL element emitting white light is used. The light-emitting element has a top emission structure. Light from the light-emitting element is extracted outside through a color filter.

As the transistor, a transistor including a c-axis aligned crystalline oxide semiconductor (CAAC-OS) was used. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible display panel or a display device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of the CAAC-OS structure is lower than that of a single-crystal structure and higher than that of an nc structure.

In this example, a channel-etched transistor including an In—Ga—Zn-based oxide was used. The transistor was fabricated over a glass substrate at a process temperature lower than 500° C.

Figure 22B:
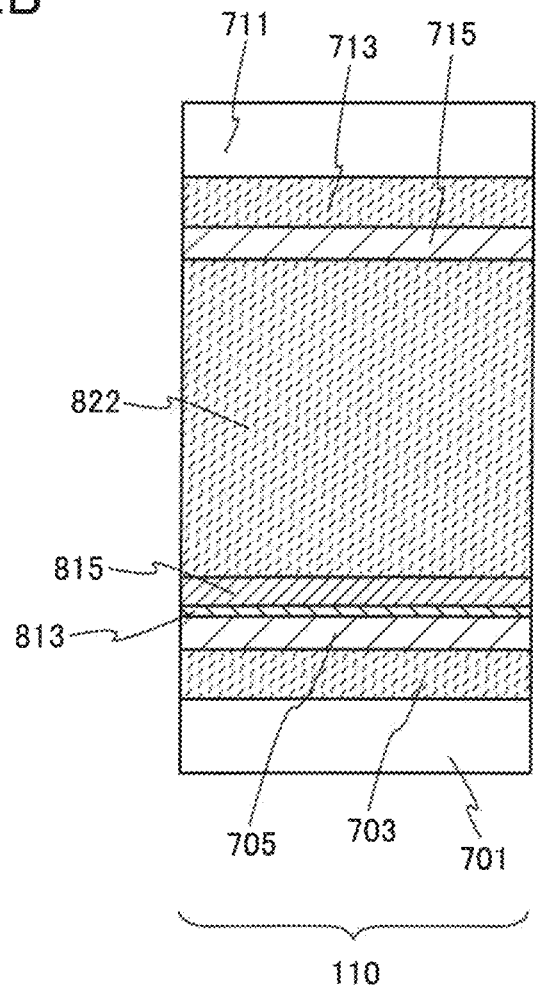
FIG. 22B illustrates a stacked layer structure of a region transmitting visible light in Example 1.

Here, FIG. 22B illustrates the stacked-layer structure of the region 110 transmitting visible light in the display panel used in this example.

As illustrated in FIG. 22B, in the region 110 transmitting visible light, the substrate 701, the bonding layer 703, the insulating layer 705, a gate insulating layer 813, the insulating layer 815, the bonding layer 822, the insulating layer 715, the bonding layer 713, and the substrate 711 are stacked in this order. As the visible light transmittance of the region 110 transmitting visible light is higher, the efficiency of light extraction of the display device can be increased. In this example, the kind and the thickness of an inorganic insulating film in the stacked-layer structure were optimized by means of an optical simulation to improve the transmittance with respect to light.

At the optical simulation, in order to ensure the favorable characteristics (or reliability) of the transistor, the kinds and the thicknesses of the gate insulating layer 813 and the insulating layer 815 serving as a protective film of the transistor were not changed. Since only the region 110 transmitting visible light of these films can be opened, formation of only part of a layer included in the gate insulating layer 813 or the insulating layer 815 was allowed.

Specifically, although the insulating layer 815 has a stacked-layer structure of a silicon oxynitride film and a silicon nitride film in the light-emitting portion or the like, the silicon nitride film was not provided in the region 110 transmitting visible light based on the calculation results.

The display panel in this example was formed in such a manner that a layer to be separated was formed over a formation substrate with a separation layer provided therebetween, separated from the formation substrate, and then transferred to another substrate.

Therefore, to secure the separability, the kinds and the thicknesses of a layer in contact with the separation layer included in the insulating layer 705 (a layer included in the insulating layer 705 which is in contact with the bonding layer 703 in the display panel) and a layer in contact with the separation layer included in the insulating layer 715 (a layer included in the insulating layer 715 which is in contact with the bonding layer 713 in the display panel) were not changed in the optical simulation.

Specifically, each of the layers in contact with the separation layer included in the insulating layer 705 and the insulating layer 715 was a 600-nm-thick silicon oxynitride film.

To secure the flexibility of the display panel, a structure in which stress does not concentrate on a particular film was used based on the calculation results.

By stacking a layer having a refractive index of approximately 1.5 (corresponding to a silicon oxynitride film) and a layer having a refractive index of approximately 1.9 (corresponding to a silicon nitride film) alternately so that antiphase interference occurs more often in the visible region, the region 110 transmitting visible light can have higher transmittance with respect to visible light.

Figure 23:
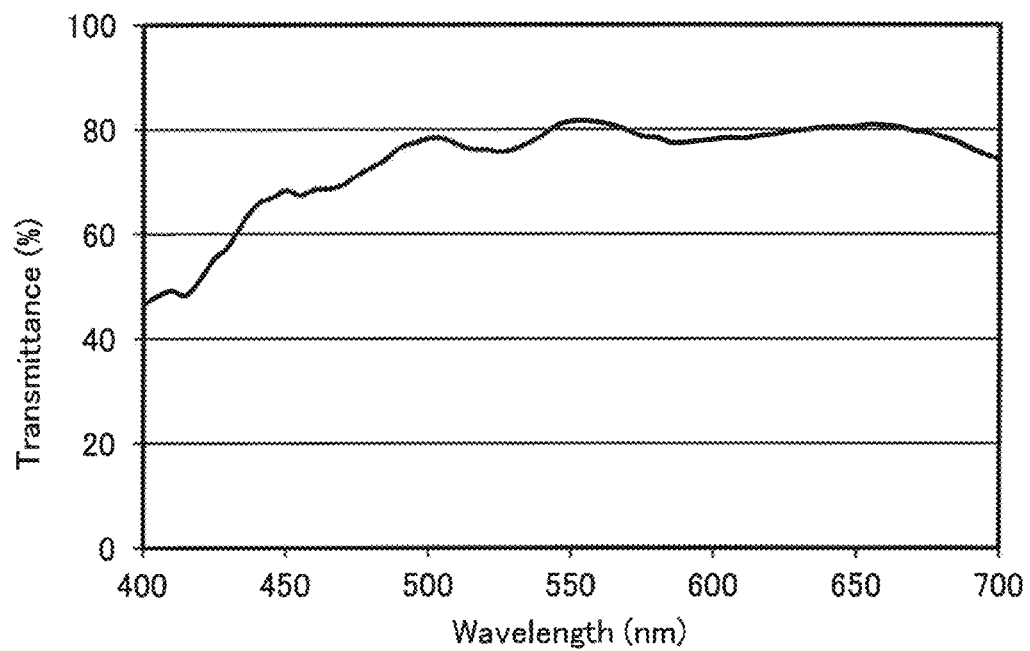
FIG. 23 shows a measurement result of a transmittance with respect to light of a region transmitting visible light.

FIG. 23 shows the measurement result of transmittance with respect to light of the region 110 transmitting visible light in the display panel which was actually manufactured. The transmittance with respect to light was measured with a spectrophotometer.

As shown in FIG. 23, the transmittance with respect to light of the region 110 transmitting visible light in the display panel which was manufactured has a high value, which is approximately 70% to 80% in the range of 450 nm to 650 nm, which is the peak range of an emission spectrum of the organic EL element. Note that the measurement result includes the reflectivity of approximately 8% in total including the reflectivity between the substrate 701 and air and that between the substrate 711 and air. The absorptance of the substrate 701 and that of the substrate 711 are each approximately 4% to 8%. Therefore, it can be concluded that the light transmittance of the inorganic insulating film which was optically optimized was able to be increased to approximately 95%.

As described above, the structure where the region transmitting visible light of the display panel overlaps the display region of another display panel with the light-transmitting layer provided therebetween was employed, and the inorganic insulating film included in the region transmitting visible light was optically optimized, whereby a large display device in which a seam between display panels was hardly recognized by a user was able to be manufactured.

Example 2

In this example, the results of manufacturing the display device of one embodiment of the present invention are described. A display device manufactured in this example is a kawara-type multidisplay.

Figure 24A:
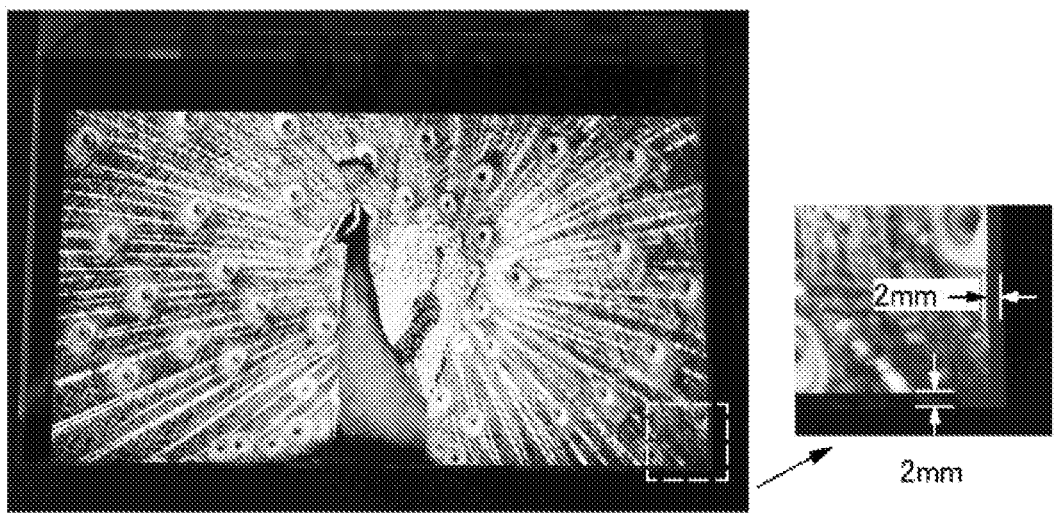
FIG. 24A is a photograph of a display device.

FIG. 24A is a photograph of the display device displaying an image which was manufactured in this example. The display device illustrated in FIG. 24A includes four display panels arranged in a matrix of two rows and two columns. The width of the region transmitting visible light of the display panel is approximately 2 mm. The display device was manufactured in such a manner that the region transmitting visible light was provided to overlap a display region of another display panel with a light-transmitting layer provided therebetween. FIG. 4A is a schematic cross-sectional view illustrating two of the display panels included in the display device that are attached to each other.

In the display device illustrated in FIG. 24A, a light-emitting portion has a size of 27 inches diagonal (the size of the light-emitting portion of one display panel is 13.5 inches diagonal), 2560×1440 effective pixels, the pixel size of 234 μm×234 μm, a resolution of 108 ppi, and an aperture ratio of 61.0%. A built-in scan driver and an external source driver attached by chip on film (COF) were used.

Figure 24B:
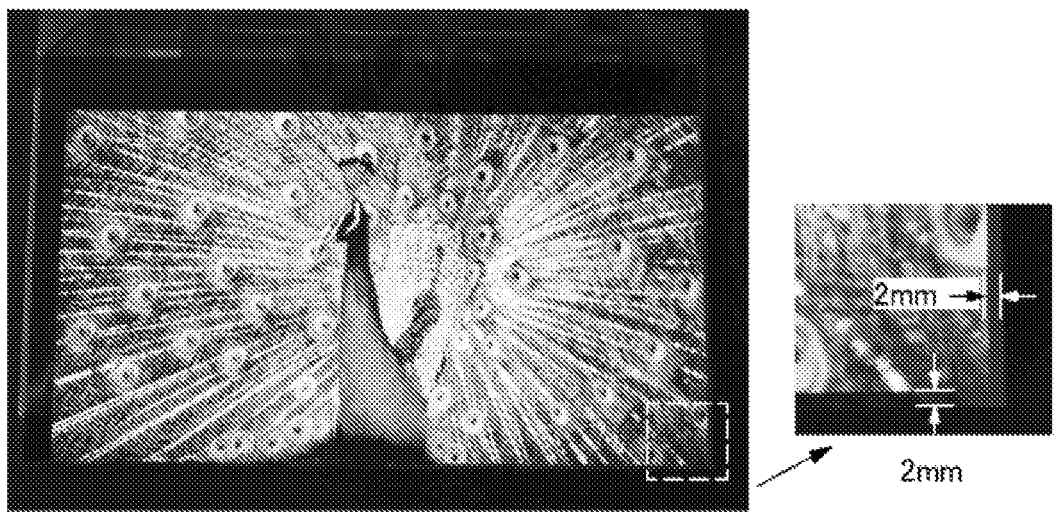
FIG. 24B is a photograph of a display panel in Example 2.

FIG. 24B is a photograph of one display panel displaying an image. A structure that blocks visible light such as a lead wiring or a driver is not provided at all from an end portion of the light-emitting portion to an end portion of the display panel along two sides of the display panel, and the a region along two sides serve as a region transmitting visible light. As illustrated in an enlarged view of FIG. 24B, the width of the region transmitting visible light is approximately 2 mm. The region transmitting visible light has a very small thickness of less than 100 μm. Therefore, although the display device in this example has a region in which at most four display panels overlap with each other, a step formed on the display surface side is extremely small; thus, a seam hardly stands out. In addition, since the display panel has flexibility, part of an FPC can be placed under the light-emitting portion of the adjacent display panel by bending the vicinity of a region to which the FPC is connected. In this way, another display panel can be provided on four sides of the display panel, whereby a large-sized display panel is easily realized.

The display panel illustrated in FIG. 24B is an active matrix organic EL display which has a light-emitting portion with a size of 13.5 inches diagonal, 1280×720×RGBY effective pixels, a resolution of 108 ppi, and an aperture ratio of 61.0%.

It is preferable that the display device in this example have smaller variation in luminance among a plurality of display panels. In the case where a lead wiring or the like is not provided along two sides as in the display panel in this example, the luminance of a region far from a wiring is low in some cases. Thus, the display panel in this example has six transistors and two capacitors in a pixel circuit to perform internal correction. Furthermore, the pixel arrangement where four subpixels (RGBY) including a yellow (Y)

subpixel having a high current efficiency are arranged in a matrix of two rows and two columns was employed, whereby the amount of current flowing through the display panel is reduced and a voltage drop was suppressed.

Figure 25:
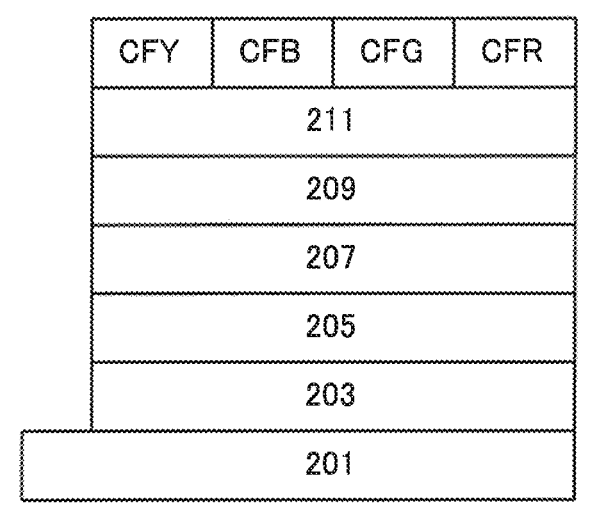

In this example, as the light-emitting element, a tandem (stack) organic EL element emitting white light that includes a blue light-emitting unit 205 and a yellow light-emitting unit 209 was used (see FIG. 25). An intermediate layer 207 was provided between two light-emitting units. The light-emitting element was provided over a stack 201. The stack 201 includes a substrate and a transistor. The light-emitting element has a top emission structure. The light from the light-emitting element is extracted outside through color filters (a yellow color filter CFY, a blue color filter CFB, a green color filter CFG, and a red color filter CFR). A reflective electrode was used as an anode 203 of the light-emitting element, a transflective electrode was used as the cathode 211, and a microcavity structure was used. Therefore, a change in chromaticity depending on the viewing angle in the pixel arrangement of RGBY can be smaller than that in the pixel arrangement of RGBW including a white (W) subpixel.

Figure 26:
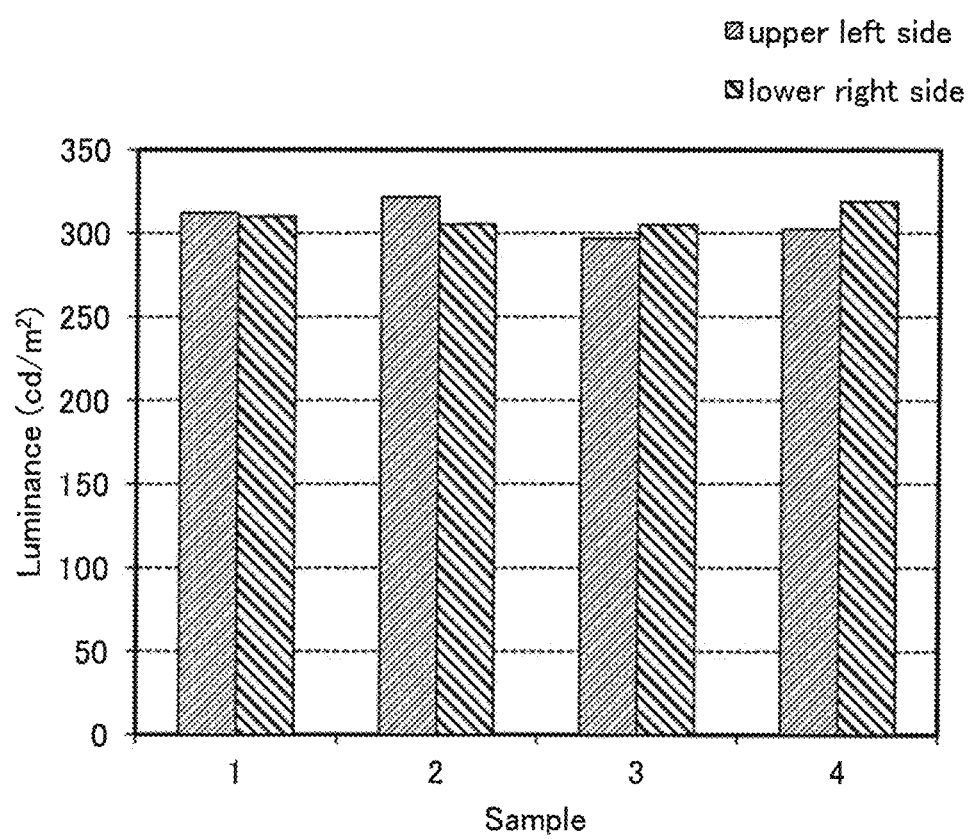
FIG. 26 shows a measurement result of luminance of a display panel in Example 2.

FIG. 26 illustrates the measurement results of luminance when a white color (luminance of 300 cd/m$^2$) is displayed on the entire surface of the display panel in this example. FIG. 26 illustrates the measurement results of luminances at two places in the panel. One place is a region close to a lead wiring which corresponds to the upper left side of FIG. 24B, and the other place is a region close to a region transmitting visible light corresponding the lower right side of FIG. 24B. The results obtained by measuring four display panels show that there was no large variation between the luminances of the two places in each panel. Luminance does not decrease even in the region far from the lead wiring and close to the region transmitting visible light. The above results indicate that variation in luminance is less likely to be caused among the plurality of display panels in the display device in this example.

Note that the structure of the transistor used in this example is similar to that in Example 1, and the detailed description is omitted.

Figure 27:
FIG. 27 shows a photograph displayed by a display device in Example 2.

Furthermore, in this example, 36 display panels illustrated in FIG. 24B were connected together, whereby an 81-inch display device illustrated in FIG. 27 was manufactured. The display device having a high resolution of 8 k4 k with 7680×4320 effective pixels was manufactured.

As described in this example, in one embodiment of the present invention, a large-sized display device in which a seam between display panels is hardly recognized by a user was able to be obtained.

Example 3

In this example, the results of manufacturing the display device of one embodiment of the present invention are described. A display device manufactured in this example is a kawara-type multidisplay.

First, the display panel used in the display device in this example is described.

Figure 28A:
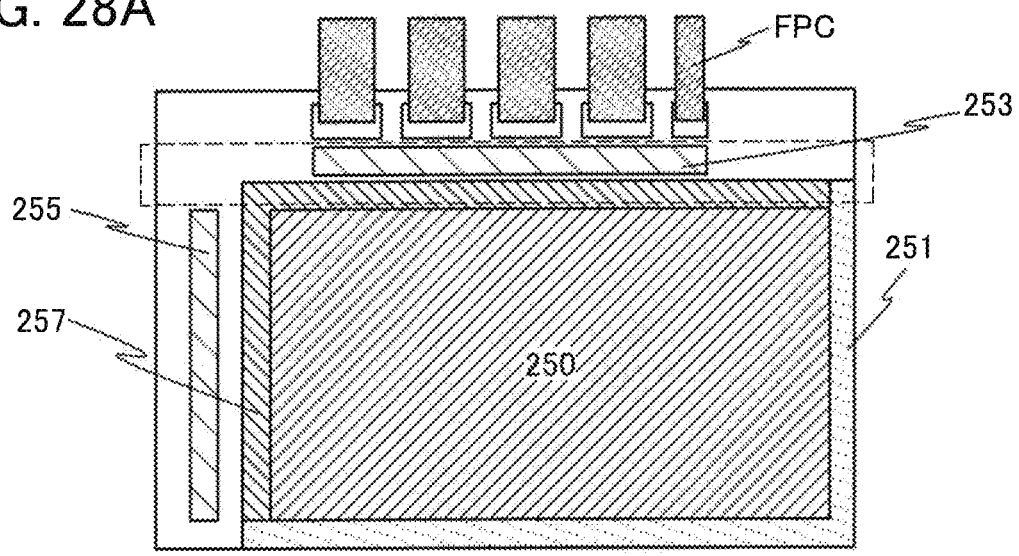
FIG. 28A illustrates a display panel in Example 3.

FIG. 28A is a schematic view of the display panel in this example. The display panel illustrated in FIG. 28A is an active matrix organic EL display which has a light-emitting portion 250 with a size of 13.5 inches diagonal, 1280×720 effective pixels, a resolution of 108 ppi, and an aperture ratio of 61.0%. The display panel includes a demultiplexer (De-MUX) 253 serving as a source driver. In addition, the display panel also includes a scan driver 255. Two sides of the light-emitting portion 250 are in contact with a region 251 transmitting visible light. A lead wiring 257 is provided along the other two sides.

A channel-etched transistor including a CAAC-OS is used as a transistor. Note that an In—Ga—Zn-based oxide is used for the oxide semiconductor.

As the light-emitting element, a tandem (stack) organic EL element emitting white light is used. The light-emitting element has a top emission structure, and the light from the light-emitting element is extracted outside through a color filter.

Figure 28B:
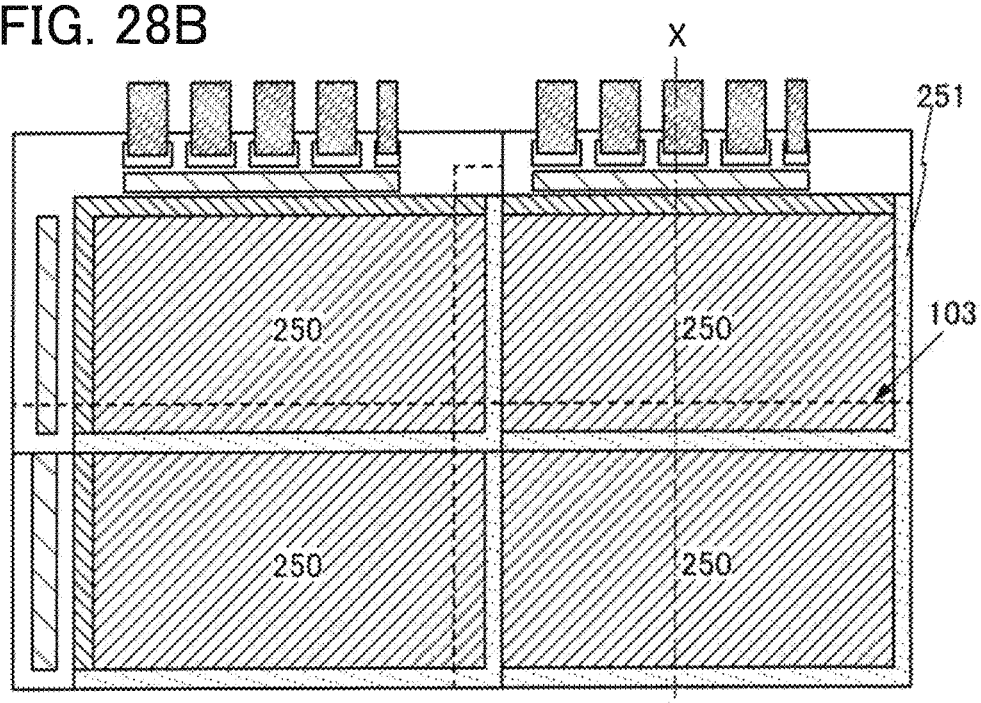
FIGS. 28B and 28C illustrate the way to overlap the display panels.
Figure 28C:
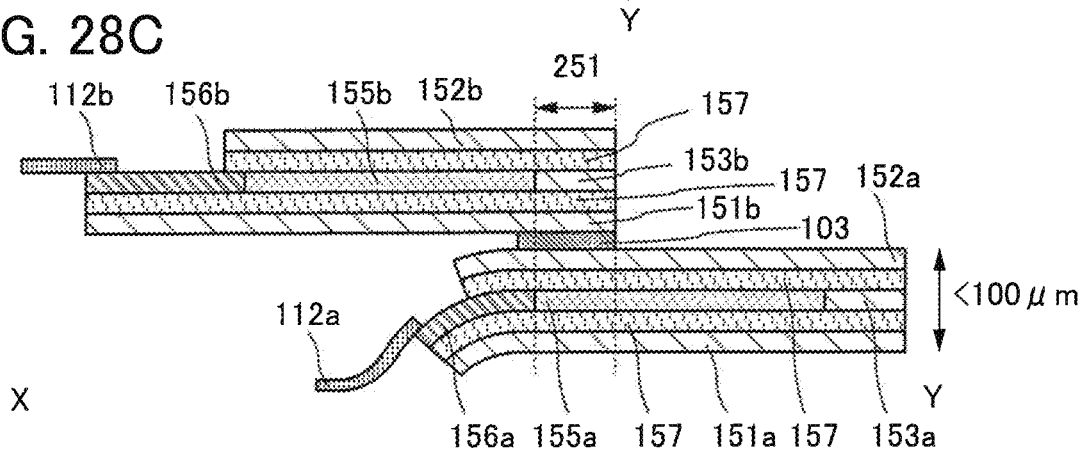

FIG. 28B is a schematic view of overlapping four display panels in a matrix of two rows and two columns. FIG. 28C shows a cross-sectional schematic view taken along a dashed dotted line X-Y in FIG. 28B.

The display device in this example is formed by overlapping a plurality of display panels so that a non-display region between display regions is made small. Specifically, the light-transmitting layer 103 is provided between the region 251 transmitting visible light of an upper display panel and the light-emitting portion 250 of a lower display panel.

A structure that blocks visible light such as a lead wiring or a driver is not provided at all from an end portion of the light-emitting portion 250 to an end portion of the display panel along two sides of the display panel, and the a region along two sides serve as a region 251 transmitting visible light. The width of the region 251 transmitting visible light of the display panel is 2 mm. The thickness of the region 251 transmitting visible light (also referred to as a thickness of one display panel) is very small, which is less than 100 µm. Therefore, although the display device in this example has a region in which at most four display panels overlap with each other, a step formed on the display surface side is extremely small; thus, a seam hardly stands out.

The four display panels have flexibility. Thus, as illustrate in FIG. 28C, a region near the FPC 112a of the lower display panel can be bent so that part of the lower display panel and part of the FPC 112a can be placed under the light-emitting portion 250 of the upper display panel adjacent to the FPC 112a. As a result, the FPC 112a can be placed without physical interference with the rear surface of the upper display panel. In this way, another display panel can be provided on four sides of the display panel, whereby a large-sized display panel is easily realized.

In this example, an absorption film including attachment layers on both surfaces of a base material was used as the light-transmitting layer 103. With use of the attachment film, two display panels included in the display device can be detachably attached to each other. An attachment layer on one surface of the light-transmitting layer 103 can be attached to the substrate 152a, and an attachment layer on the other surface of the light-transmitting layer 103 can be attached to the substrate 151b.

In FIG. 28B, the light-transmitting layer 103 includes not only a portion overlapping with the region 251 transmitting visible light, but also a portion overlapping with the light-emitting portion 250. In FIG. 28C, the light-transmitting layer 103 overlaps with the entire region 251 transmitting visible light from an end portion of the substrate 151b, and also overlaps with part of the region 155b containing a display element. Note that the light-transmitting layer 103 is not provided on a curved region of the display panel that is close to a region to which an FPC is connected illustrated in FIG. 28C. However, the light-transmitting layer 103 may be provided on a curved region of the display panel depending on the thickness or flexibility of the light-transmitting layer 103.

Each of the display panels was formed by attaching a substrate and an element layer with a bonding layer. For example, as illustrated in FIG. 28C, the substrate 151a, the substrate 152a, the substrate 151b, and the substrate 152b are attached to the element layer 153a, the element layer 153a, the element layer 153b, and the element layer 153b respectively, with the bonding layer 157. Each of the element layers includes a region 155 containing a display element and a region 156 including a wiring electrically connected to the display element.

Figure 29A:
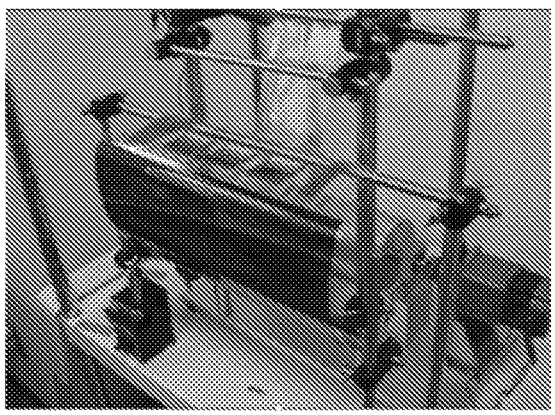
FIGS. 29A to 29C are photographs illustrating a bending test in Example 3.
Figure 29C:
Figure 29B:
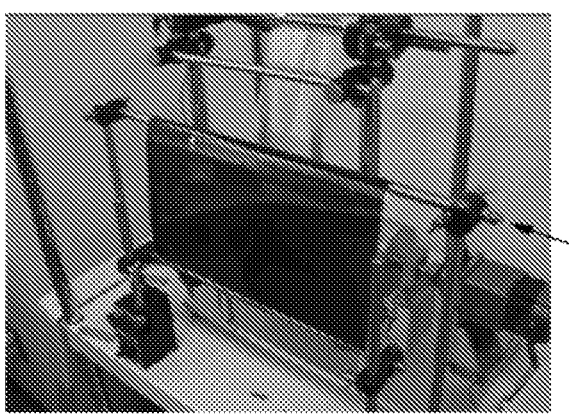

In addition, the manufactured display panel was subjected to a bending test. FIGS. 29A to 29C show how the bending test was performed. A bent portion is a portion shown by a dotted line in FIG. 28A, which is a region between the light-emitting portion 250 and the FPC connected portion and includes lead wirings used for a power source. Changing the display panel in shape from the state in FIG. 29A to the state in FIG. 29B and returning to the state in FIG. 29A was counted as one bending, and the bending was repeated 100,000 times. The curvature radius for bending the display panel was 5 mm. In the bending test, one bending was performed in approximately 2 seconds. FIG. 29C is a photograph of the display panel seen from a direction denoted by an arrow in FIG. 29B.

Figure 29D:
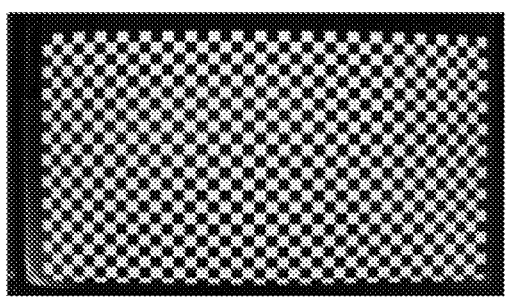
FIGS. 29D and 29E show photographs of images displayed on display panels in Example 3.
Figure 29E:
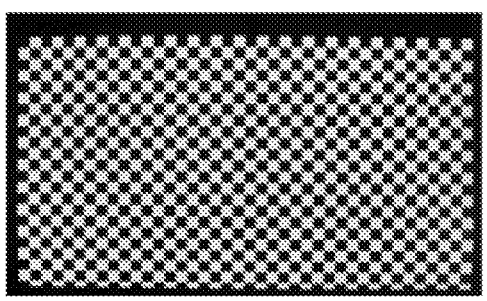

FIG. 29D is a photograph of an image displayed on the display panel before the test. FIG. 29E is a photograph of an image displayed on the display panel after the test. A display defect was not observed in the display panel after the test.

Figure 30A:
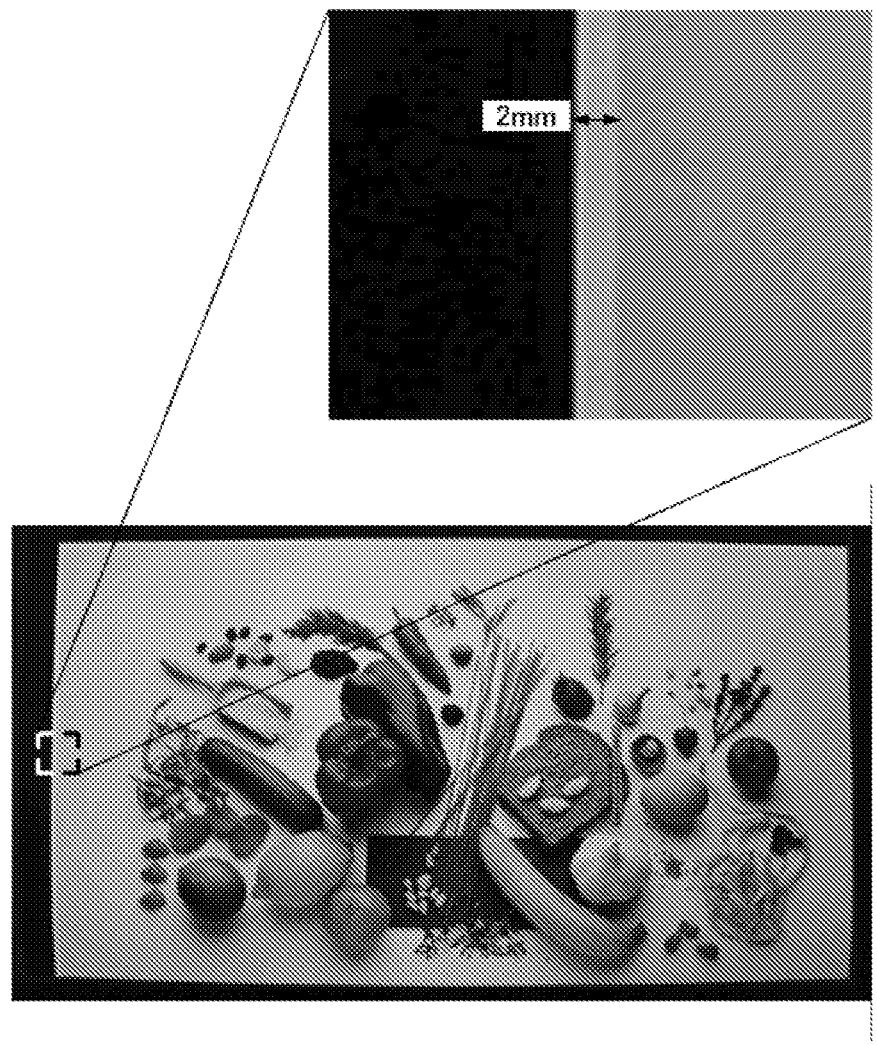
FIG. 30A illustrates a photograph displayed by a display panel in Example 3.

Note that the luminance of the light-emitting portion 250 might be perceived different between in part which is viewed through the region 251 transmitting visible light and part which is viewed without through the region 251 transmitting visible light. Therefore, as illustrated in FIG. 30A, it is preferable that an image be displayed with a higher luminance in part overlapping with the region 251 transmitting visible light as compared with the other parts (for example, a data voltage of the part overlapping with the region 251 transmitting visible light is set higher than the other parts) because luminance of the entire light-emitting portion 250 can be uniform.

Figure 31:
FIG. 31 illustrates a photograph displayed by a display device in Example 3.

In this example, 36 display panels illustrated in FIG. 28A were arranged in a matrix of six rows and six columns, whereby an 81-inch display device illustrated in FIG. 31 was manufactured.

Figure 30B:
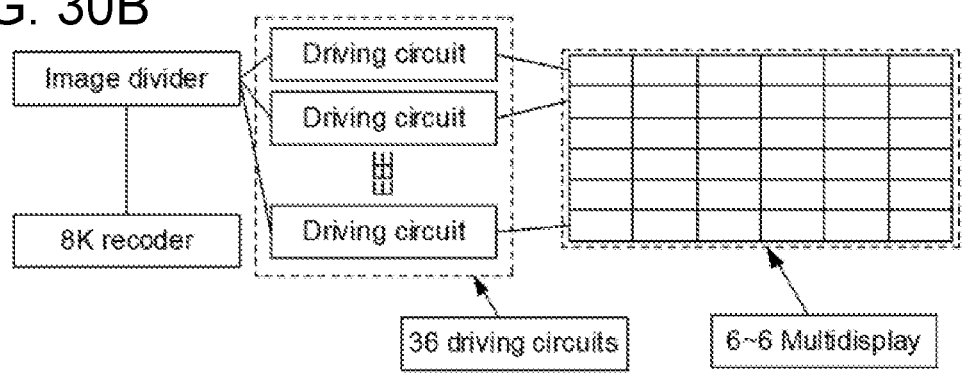
FIG. 30B illustrates a method for driving a display device in Example 3.

In this example, the display panels were driven by respective driver circuits. As illustrated in FIG. 30B, a signal output from an 8 k recorder was divided into 36 parts and input to respective driver circuits. The timing of scanning in the first stage of each display panel was set to be at the same time.

In this example, a display device illustrated in FIG. 31 having a high resolution of 8 k4 k with 7680×4320 effective pixels was manufactured. Note that the weight of one display panel including an FPC is approximately 26 g, and the weight of 36 display panels is less than or equal to 1 kg (here, the weight of the display panel and an FPC is mentioned, and the weight of a frame for fixing the display panel, and the like is not included).

Figure 32:
FIG. 32 illustrates a photograph displayed by a display device in Example 3.

FIG. 32 shows an observation result of a seam between the display panels. Note that an image displayed in FIG. 31 is different from that in FIG. 32. FIG. 32 shows a portion where the display panels overlap with each other (the width of 2 mm). As described above, with the use of one embodiment of the present invention, a seam between the display panels is hardly recognized or is negligible in a distance between the display panel and a user even if it can be observed in a near distance.

As described above, in one embodiment of the present invention, a large-sized display device in which a seam between display panels is hardly recognized by a user was able to be obtained.

EXPLANATION OF REFERENCE

10: display device, 11: display region, 15: column, 16: wall, 100: display panel, 100a: display panel, 100b: display panel, 100c: display panel, 100d: display panel, 101: display region, 101a: display region, 101b: display region, 101c: display region, 101d: display region, 102: region, 102a: region, 102b: region, 103: light-transmitting layer, 103a: light-transmitting layer, 103a1: light-transmitting layer, 103a2: light-transmitting layer, 103b: light-transmitting layer, 103b1: light-transmitting layer, 103b2: light-transmitting layer, 110: region transmitting visible light, 110a: region transmitting visible light, 110b: region transmitting visible light, 110c: region transmitting visible light, 110d: region transmitting visible light, 112a: FPC, 112b: FPC, 120: region blocking visible light, 120a: region blocking visible light, 120b: region blocking visible light, 120c: region blocking visible light, 123: FPC, 131: resin layer, 132: protective substrate, 133: resin layer, 134: protective substrate, 141: pixel, 141a: pixel, 141b: pixel, 142a: wiring, 142b: wiring, 143a: circuit, 143b: circuit, 145: wiring, 151: substrate, 151a: substrate, 151b: substrate, 152: substrate, 152a: substrate, 152b: substrate, 153a: element layer, 153b: element layer, 154: bonding layer, 155: region, 155a: region, 155b: region, 156: region, 156a: region, 156b: region, 157: bonding layer, 201: stack, 203: anode, 205: blue light-emitting unit, 207: intermediate layer, 209: yellow light-emitting unit, 211: cathode, 250: light-emitting portion, 251: region transmitting visible light, 253: demultiplexer, 255: scan driver, 257: lead wiring, 301: display portion, 302: pixel, 302B: sub-pixel, 302G: sub-pixel, 302R: sub-pixel, 302t: transistor, 303c: capacitor, 303g(1): scan line driver circuit, 303g(2): imaging pixel driver circuit, 303s(1): image signal line driver circuit, 303s(2): imaging signal line driver circuit, 303t: transistor, 304: gate, 308: imaging pixel, 308p: photoelectric conversion element, 308t: transistor, 309: FPC, 311: wiring, 319: terminal, 321: insulating layer, 328: partition, 329: spacer, 350R: light-emitting element, 351R: lower electrode, 352: upper electrode, 353: EL layer, 353a: EL layer, 353b: EL layer, 354: intermediate layer, 360: bonding layer, 367B: coloring layer, 367BM: light-blocking layer, 367G: coloring layer, 367p: anti-reflective layer, 367R: coloring layer, 380B: light-emitting module, 380G: light-emitting module, 380R: light-emitting module, 390: touch panel, 500: display portion, 500TP: touch panel, 501: display portion, 503g: driver circuit, 503s: driver circuit, 505: touch panel, 505B: touch panel, 509: FPC, 590: substrate, 591: electrode, 592: electrode, 593: insulating layer, 594: wiring, 595: touch sensor, 597: bonding layer, 598: wiring, 599: connection layer, 600: input portion, 602: sensor unit, 603d: driver circuit, 603g: driver circuit, 650: capacitor, 651: electrode, 652: electrode, 653: insulating layer, 667: window portions, 670: protective layer, 701: substrate, 703: bonding layer, 705: insulating layer, 711: substrate, 713: bonding layer, 715: insulating layer, 804: light-emitting portion, 806: driver circuit portion, 808: FPC, 813: gate insulating layer, 814: conductive layer, 815: insulating layer, 817: insulating layer, 817a: insulating layer, 817b: insulating layer, 820: transistor, 821: insulating layer, 822: bonding layer, 823: spacer, 824: transistor, 825: connector, 830: light-emitting element, 831: lower electrode, 832: optical adjustment layer, 833: EL layer, 835: upper electrode, 845: coloring layer, 847: light-blocking layer, 849: overcoat, 856: conductive layer, 857: conductive layer, 857*a*: conductive layer, 857*b*: conductive layer, 7000: display portion, 7001: display portion, 7100: mobile phone, 7101: housing, 7103: operation button, 7104: external connection port, 7105: speaker, 7106: microphone, 7200: television set, 7201: housing, 7203: stand, 7211: remote controller, 7300: portable information terminal, 7301: housing, 7302: operation button, 7303: information, 7400: lighting device, 7401: stage, 7402: light-emitting portion, 7403: operation switch, 7500: portable information terminal, 7501: housing, 7502: member, 7503: operation button, 7600: portable information terminal, 7601: housing, 7602: hinges, 7650: portable information terminal, 7651: non-display portion, 7700: portable information terminal, 7701: housing, 7703*a*: button, 7703*b*: button, 7704*a*: speaker, 7704*b*: speaker, 7705: external connection port, 7706: microphone, 7709: battery, 7800: portable information terminal, 7801: band, 7802: input-output terminal, 7803: operation button, 7804: icon, and 7805: battery This application is based on Japanese Patent Application serial no. 2014-156168 filed with Japan Patent Office on Jul. 31, 2014, Japanese Patent Application serial no. 2014-219131 filed with Japan Patent Office on Oct. 28, 2014, Japanese Patent Application serial no. 2014-243195 filed with Japan Patent Office on Dec. 1, 2014, and Japanese Patent Application serial no. 2015-109642 filed with Japan Patent Office on May 29, 2015, the entire contents of which are hereby incorporated by reference.

The invention claimed is:

1. A display device comprising:
a first display panel;
a second display panel being at least partly flexible; and
a light-transmitting layer,
wherein the first display panel includes a first region and a light-blocking region,
wherein the first region has a function of performing display,
wherein the second display panel includes a second region and a third region,
wherein the second region has a function of performing display,
wherein the third region is adjacent to the second region,
wherein the third region has a function of transmitting visible light,
wherein the light-transmitting layer includes a light-transmitting material having a transmittance with respect to light in a wavelength range of 450 nm to 700 nm of 80% or more on the average, and a higher refractive index than air,
wherein the light-transmitting layer is between the first display panel and the second display panel,
wherein the light-transmitting layer is positioned on a display surface side of the first display panel,
wherein the light-transmitting layer is positioned on a side opposite to a display surface side of the second display panel,
wherein the second display panel is bent in at least one of the second region and the third region,
wherein the third region overlaps part of the first region with the light-transmitting layer provided therebetween,
wherein a surface of the first display panel on a side opposite to the display surface side of the first display panel is a first surface of the first display panel, and
wherein a flexible printed circuit is in contact with and electrically connected to the first surface of the first display panel.

2. The display device according to claim 1,
wherein the second display panel includes a fourth region,
wherein the fourth region is adjacent to the second region,
wherein the fourth region has a function of blocking visible light, and
wherein the fourth region does not include a region overlapping with the first region.

3. The display device according to claim 2,
wherein the fourth region functions as a wiring portion electrically connected to a light-emitting element included in the second region.

4. The display device according to claim 1,
wherein the first region includes a light-emitting element,
wherein the second region includes a light-emitting element, and
wherein the third region includes a bonding layer.

5. The display device according to claim 1,
wherein the light-transmitting material has a transmittance with respect to light in the wavelength range of 450 nm to 700 nm of 90% or more on the average.

6. The display device according to claim 1,
wherein the light-transmitting material has a refractive index of higher than or equal to 1.3 and lower than or equal to 1.8.

7. The display device according to claim 1,
wherein the light-transmitting layer is detachably in contact with at least one of the first display panel and the second display panel.

8. The display device according to claim 1,
wherein the light-transmitting layer includes an inert material.

9. The display device according to claim 1,
wherein the light-transmitting layer includes a nonvolatile material.

10. The display device according to claim 1,
wherein the light-transmitting layer has a material with a viscosity of greater than or equal to 1 mPa·s and less than or equal to 1000 Pa·s.

11. An electronic device comprising:
the display device according to claim 1, and
an antenna, a battery, a housing, a speaker, a microphone, an operation switch, or an operation button.

12. A display device comprising:
a first display panel;
a second display panel being at least partly flexible; and
a light-transmitting layer,
wherein the first display panel includes a light-blocking region,
wherein the light-transmitting layer includes a light-transmitting material having a transmittance with respect to light in a wavelength range of 450 nm to 700 nm of 80% or more on the average, and a higher refractive index than air,
wherein the light-transmitting layer is between the first display panel and the second display panel,
wherein the light-transmitting layer is positioned on a display surface side of the first display panel,
wherein the light-transmitting layer is positioned on a side opposite to a display surface side of the second display panel,
wherein part of the second display panel overlaps part of the first display panel with the light-transmitting layer provided therebetween, wherein the second display panel is bent in at least one of a region having a function of performing display and a region overlapping with the first display panel, wherein a surface of the first display panel on a side opposite to the display surface side of the first display panel is a first surface of the first display panel, and wherein a flexible printed circuit is in contact with and electrically connected to the first surface of the first display panel.

13. The display device according to claim 12, wherein the light-transmitting material has a transmittance with respect to light in the wavelength range of 450 nm to 700 nm of 90% or more on the average.

14. The display device according to claim 12, wherein the light-transmitting material has a refractive index of higher than or equal to 1.3 and lower than or equal to 1.8.

15. The display device according to claim 12, wherein the light-transmitting layer is detachably in contact with at least one of the first display panel and the second display panel.

16. The display device according to claim 12, wherein the light-transmitting layer includes an inert material.

17. The display device according to claim 12, wherein the light-transmitting layer includes a nonvolatile material.

18. The display device according to claim 12, wherein the light-transmitting layer has a material with a viscosity of greater than or equal to 1 mPa·s and less than or equal to 1000 Pa·s.

19. An electronic device comprising:

the display device according to claim 12, and an antenna, a battery, a housing, a speaker, a microphone, an operation switch, or an operation button.

* * * * *